US008610291B2

(12) United States Patent
Uno et al.

(10) Patent No.: US 8,610,291 B2
(45) Date of Patent: *Dec. 17, 2013

(54) COPPER ALLOY BONDING WIRE FOR SEMICONDUCTOR DEVICE

(75) Inventors: Tomohiro Uno, Tokyo (JP); Keiichi Kimura, Tokyo (JP); Takashi Yamada, Iruma (JP)

(73) Assignees: Nippon Steel & Sumikin Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 802 days.

This patent is subject to a terminal disclaimer.

(21) Appl. No.: 11/848,403

(22) Filed: Aug. 31, 2007

(65) Prior Publication Data

US 2008/0061440 A1    Mar. 13, 2008

(30) Foreign Application Priority Data

Aug. 31, 2006 (JP) ................. 2006-235821
Aug. 31, 2006 (JP) ................. 2006-235822
Aug. 30, 2007 (JP) ................. 2007-224285
Aug. 30, 2007 (JP) ................. 2007-224289

(51) Int. Cl.
*H01L 23/48* (2006.01)
*H01L 23/52* (2006.01)
*H01L 29/40* (2006.01)

(52) U.S. Cl.
USPC ........................................................ 257/784

(58) Field of Classification Search
USPC ................................................ 257/784, 798
See application file for complete search history.

(56) References Cited

U.S. PATENT DOCUMENTS

| 4,986,856 | A | * | 1/1991 | Tanigawa et al. ............. 148/554 |
| 7,820,913 | B2 | | 10/2010 | Uno et al. |
| 8,004,094 | B2 | * | 8/2011 | Uno et al. ..................... 257/784 |
| 2004/0014266 | A1 | | 1/2004 | Uno et al. |

FOREIGN PATENT DOCUMENTS

| GB | 2220956 A | * | 1/1990 | ............... C22C 9/00 |
| JP | 59-139662 A | | 8/1984 | |
| JP | 61-020693 A | | 1/1986 | |
| JP | 61-99646 A | | 5/1986 | |
| JP | 61-251062 A | | 11/1986 | |
| JP | 62-078861 A | | 4/1987 | |
| JP | 62-078862 A | | 4/1987 | |
| JP | 62080241 A | * | 4/1987 | |
| JP | 64-3903 A | | 1/1989 | |
| JP | 1-291435 A | | 11/1989 | |
| JP | 2220956 A | * | 1/1990 | ............... C22C 9/00 |
| JP | 07070674 A | * | 3/1995 | |
| JP | 8-319525 A | | 12/1996 | |

* cited by examiner

*Primary Examiner* — Fernando L Toledo
*Assistant Examiner* — Valerie N Newton
(74) *Attorney, Agent, or Firm* — McDermott Will & Emery LLP

(57) ABSTRACT

The present invention provides a semiconductor-device copper-alloy bonding wire which has an inexpensive material cost, ensures a superior ball joining shape, wire joining characteristic, and the like, and a good loop formation characteristic, and a superior mass productivity. The semiconductor-device copper-alloy bonding wire contains at least one of Mg and P in total of 10 to 700 mass ppm, and oxygen within a range from 6 to 30 mass ppm.

13 Claims, 2 Drawing Sheets

COPPER ALLOY BONDING WIRE FOR SEMICONDUCTOR DEVICE

INCORPORATION BY REFERENCE

The present application claims priority under 35 U.S.C. §119 to Japanese Patent Application No. 2006-235821 filed on Aug. 31, 2006, Japanese Patent Application No. 2006-235822 filed on Aug. 31, 2006, Japanese Patent Application No. 2007-224285 filed on Aug. 30, 2007, and Japanese Patent Application No. 2007-224289 filed on Aug. 30, 2007. The contents of the applications is incorporated herein by reference in its entirety.

BACKGROUND OF THE INVENTION

1. Field of the Invention

The present invention relates to a semiconductor-device copper-alloy bonding wire which connects an electrode on a semiconductor device with the wiring of a circuit-wiring substrate.

2. Description of the Related Art

Presently, a thin line (bonding wire) having a diameter of 20 to 100 µm or so is mainly used as a bonding wire which connects an electrode on a semiconductor device and an external terminal together. A supersonic and thermal pressure-bonding combination scheme is generally applied to join a bonding wire, and for example, a general-purpose bonding device, a capillary jig, which causes a bonding wire to pass through the interior of the general-purpose bonding device and is used for connection, are used. The leading end of a bonding wire is heated and melted by arc heat input, a ball is formed by surface tension and is subjected to pressure-bonding and joining onto an electrode of a semiconductor device heated at a range from 150 to 300° C., and then the bonding wire is subjected to wedge joining directly together with a lead.

Generally, high purity 4N group gold (purity >99.99 mass %) is used as the material of a bonding wire so far. However, because gold is expensive and a power IC needs a thicker wire (diameter: 50 to 100 µm or so), a bonding wire of another kind of metal having a cheaper material cost is desired.

From the standpoint of the wire bonding technology, it is desirable to form a ball having a good sphericity in forming the ball, and to form the joining portion of the ball and an electrode in a complete circular shape as much as possible, and it is necessary to obtain a sufficient joining strength. To cope with lowering a joining temperature, thinning a bonding wire, and the like, successive bonding without causing peeling or the like, and a sufficient joining strength are required in case of performing wedge connection on a bonding wire on a lead terminal or a wiring substrate.

In a resin sealing step of filling a thermoset epoxy resin having a high viscosity, there is a problem such that a bonding wire may be deformed and contact an adjoining wire. What is more, since the wire-bonding pitch becomes narrow, the length of a wire becomes long, and a wire bonding itself becomes thin, it is necessary to prevent deformation of a wire in resin filling as much as possible. Because of the improvement of the strength of a wire, such a deformation is controllable on some level, but without overcoming problems such that loop control becomes difficult and the strength in joining is reduced, practical use is hardly realized.

It is desirable to obtain comprehensive wire characteristics such as facilitating loop control in a bonding step, improving joining of a bonding wire with an electrode or a lead, and suppressing excessive deformation of a bonding wire in a resin filling step after bonding to satisfy the foregoing requests.

Unexamined Japanese Patent Applications No. S61-251062, No. S62-78861, No. S61-20693, and No. S62-78862 disclose copper bonding wires which have an inexpensive material cost, a good electrical conductivity, and which facilitate joining and loop formation. According to the copper bonding wire, however, because a ball portion thereof has a higher hardness than Au, it may cause a damage like a crack to a chip when the ball is deformed on a pad electrode to join the ball with the electrode. Regarding wedge joining of a copper bonding wire, because the production margin is narrow in comparison with Au, reduction of mass productivity is concerned. Further, because of chemical compound growth at a joined portion, reduction of long-term reliability is also concerned. Those are the reasons why the practical application of a copper bonding wire is not in progress.

A problem from the standpoint of practical application in using a copper bonding wire is that a chip may be damaged in joining because a ball is hard. As a solution against such a problem, Japanese Unexamined Patent Application No. S61-251062 discloses a scheme of suppressing the contained amount of impurities to less than or equal to 10 ppm, and Japanese Unexamined Patent Application No. S62-78861 discloses a scheme of suppressing the contained amounts of hydrogen and oxygen in a highly-pure copper to less than or equal to specific values. Even though such schemes can prevent a ball from being hardened, the ball may have a deformation problem, such as a petal shape, an irregular shape, or an eccentric shape if the bonding wire is merely high purified. The shape of a ball in joining and chip damaging are in a contradictory relationship, and overcoming both becomes a problem to be solved. Merely causing a bonding wire to be highly purified leaves many problems such that the strength is reduced and complex loop control becomes difficult, the recrystallized grain of a neck portion becomes coarse and the loop height cannot be uniformed, and the pull strength becomes weak.

Adding alloy element to a copper bonding wire which enhances ball joining has been reported. For example, Japanese Unexamined Patent Application No. S61-20693 discloses a bonding wire which contains Mg, Ca, rare-earth element, Ti, Hf, V, Nb, Ta, Ni, Pd, Pt, Au, Cd, B, Al, In, Si, Ge, Pb, P, Sb, Bi, Se and Te at a mass % of 0.001 to 2, and a remaining element thereof is substantially copper for the purpose of improving the joining strength. However, merely adjusting alloying elements does not cause the improvements of individual characteristics, such as the joining characteristic, and a loop shape, so that improvement on the comprehensive usability is hardly achieved. Further, ones of the reasons why the practical application of a copper bonding wire is not advanced well are practical problems such that even though improvement by adding metal elements is achieved, the characteristics varies widely wire by wire or product lot by production lot, and a change in a characteristic or the like originating from a period how long the product is left before it is used is not expectable.

Copper is likely oxidized in the air, and formation of a fine oxide film of copper brings about a concern such that the ball joining characteristic and the wedge joining characteristic may be deteriorated. If oxygen is contained in copper at a high concentration (density), some negative effects may be concerned, but the correlation with joining is not always apparent. There is a possibility that wedge joining of a bonding wire just after production is improved by simply thinning a copper oxide film, reducing the concentration of solution oxygen, but it is difficult to precisely manage such an improvement, and normally, an oxide film grows while a wire product is stocked. This brings about a problem of deteriorating a characteristic. To delay oxidation of the surface of a copper bonding wire, applying a rust-preventive agent has been proposed, and is disclosed by, for example, Japanese Unexamined Patent Application No. S62-78862. The rust-preventive agent is effective for oxidation suppression, but the agent itself disturbs joining. It is difficult to improve the shape of a ball in joining and the joining strength by merely applying the rust-preventive agent, so that the application of the rust-preventive agent has a limitation.

It is an object of the invention to provide a semiconductor-device copper-alloy bonding wire which overcomes the foregoing problems of the conventional technologies, improves the shape of a ball portion in joining, mainly consists of copper, and is inexpensive in comparison with a gold bonding wire.

SUMMARY OF THE INVENTION

To achieve the object, a semiconductor-device copper-alloy bonding wire according to a first aspect of the invention comprises: at least either one of Mg and P in total of 10 to 700 mass ppm; and oxygen within a range from 6 to 30 mass ppm.

A semiconductor-device copper-alloy bonding wire according to the second aspect of the invention comprises: at least either one of Mg and P in total of 10 to 700 mass ppm; at least any one of Ag, Pd, Pt, and Au in total of 10 to 5000 mass ppm; and oxygen within a range from 6 to 30 mass ppm.

A semiconductor-device copper-alloy bonding wire according to the third aspect of the invention comprises: at least either one of Mg and P in total of 10 to 700 mass ppm; at least any one of Be, Al, Bi, Si, In, Ge, Ti, and V in total of 6 to 300 mass ppm; and oxygen within a range from 6 to 30 mass ppm.

A semiconductor-device copper-alloy bonding wire according to the fourth aspect of the invention comprises: at least either one of Mg and P in total of 10 to 700 mass ppm; at least any one of Ca, Y, La, Ce, Pr, and Nd in total of 5 to 300 mass ppm; and oxygen within a range from 6 to 30 mass ppm.

A semiconductor-device copper-alloy bonding wire according to the fifth aspect of the invention comprises: at least either one of Mg and P in total of 10 to 700 mass ppm; at least any one of Ag, Pd, Pt, and Au in total of 10 to 5000 mass ppm; at least any one of Be, Al, Bi, Si, In, Ge, Ti and V in total of 6 to 300 mass ppm; and oxygen within a range from 6 to 30 mass ppm.

A semiconductor-device copper-alloy bonding wire according to the sixth aspect of the invention comprises: at least either one of Mg and P in total of 10 to 700 mass ppm; at least any one of Ag, Pd, Pt, and Au in total of 10 to 5000 mass ppm; at least any one of Ca, Y, La, Ce, Pr and Nd in total of 5 to 300 mass ppm; and oxygen within a range from 6 to 30 mass ppm.

A semiconductor-device copper-alloy bonding wire according to the seventh aspect of the invention comprises: at least either one of Mg and P in total of 10 to 700 mass ppm; at least any one of Ag, Pd, Pt and Au in total of 10 to 5000 mass ppm; at least any one of Be, Al, Bi, Si, In, Ge, Ti and V in total of 6 to 300 mass ppm; at least any one of Ca, Y, La, Ce, Pr, and Nd in total of 5 to 300 mass ppm; and oxygen within a range from 6 to 30 mass ppm.

The foregoing semiconductor-device copper-alloy bonding wire may alternatively employ a structure such that a total concentration of Mg and P is 45 to 700 mass ppm.

The foregoing semiconductor-device copper-alloy bonding wire may alternatively employ a structure such that regarding the oxygen concentration, a total concentration of oxygen contained inside and oxygen contained in an oxide on a surface is within a range from 6 to 30 mass ppm.

The foregoing semiconductor-device copper-alloy bonding wire may employ a structure such that regarding the oxygen concentration, a total oxygen concentration detected by a combustion method is within a range from 6 to 30 mass ppm, and a wire diameter is within a range from 10 to 300 mass ppm.

A semiconductor-device copper-alloy bonding wire according to the eighth aspect of the invention comprises: at least either one of Mg and P in total concentration of 10 to 700 mass ppm; and a concentrated layer where a total concentration of Mg and P is more than or equal to ten times than a foregoing concentration on a surface.

A semiconductor-device copper-alloy bonding wire according to the ninth aspect of the invention comprises: at least either one of Mg and P in total concentration of 10 to 700 mass ppm; at least any one of Ag, Pd, Pt and Au in total of 10 to 5000 mass ppm; and a concentrated layer where a total concentration of Mg and P is more than or equal to ten times than a foregoing concentration on a surface.

A semiconductor-device copper-alloy bonding wire according to the tenth aspect of the invention comprises: at least either one of Mg and P in total concentration of 10 to 700 mass ppm; at least any one of Be, Al, Bi, Si, In, Ge, Ir and Mn in total of 5 to 300 mass ppm; and a concentrated layer where a total concentration of Mg and P is more than or equal to ten times than a foregoing concentration on a surface.

A semiconductor-device copper-alloy bonding wire according to the eleventh aspect of the invention comprises: at least either one of Mg and P in total concentration of 10 to 700 mass ppm; at least any one of Ca, Y, La, Ce, Pr and Nd in total of 5 to 300 mass ppm; and a concentrated layer where a total concentration of Mg and P is more than or equal to ten times than a foregoing concentration on a surface.

A semiconductor-device copper-alloy bonding wire according to the twelfth aspect of the invention comprises: at least either one of Mg and P in total concentration of 10 to 700 mass ppm; at least any one of Ag, Pd, Pt and Au in total of 10 to 5000 mass ppm; at least any one of Be, Al, Bi, Si, In, Ge, Ir and Mn in total of 5 to 300 mass ppm; and a concentrated layer where a total concentration of Mg and P is more than or equal to ten times than a foregoing concentration on a surface.

A semiconductor-device copper-alloy bonding wire according to the thirteenth aspect of the invention comprises: at least either one of Mg and P in total concentration of 10 to 700 mass ppm; at least any one of Ag, Pd, Pt and Au in total of 10 to 5000 mass ppm; at least any one of Ca, Y, La, Ce, Pr and Nd in total of 5 to 300 mass ppm; and a concentrated layer where a total concentration of Mg and P is more than or equal to ten times than a foregoing concentration on a surface.

A semiconductor-device copper-alloy bonding wire according to the fourteenth aspect of the invention comprises: at least either one of Mg and P in total of 10 to 700 mass ppm; at least any one of Ag, Pd, Pt and Au in total of 10 to 5000 mass ppm; at least any one of Be, Al, Bi, Si, In, Ge, Ir and Mn in total of 5 to 300 mass ppm; at least any one of Ca, Y, La, Ce, Pr and Nd in total of 5 to 300 mass ppm; and a concentrated layer where a total concentration of Mg and P is more than or equal to ten times than a foregoing concentration on a surface.

The foregoing semiconductor-device copper-alloy bonding wire may alternatively employ a structure such that the concentration of Mg and P is 45 to 700 mass ppm.

The foregoing semiconductor-device copper-alloy bonding wire may alternatively employ a structure such that the total concentration of Mg and P in the concentrated layer is 0.05 to 10 mass %.

The foregoing semiconductor-device copper-alloy bonding wire may alternatively employ a structure such that a maximum of the total concentration of Mg and P in the concentrated layer is 0.2 to 30 mass %.

The foregoing semiconductor-device copper-alloy bonding wire may further comprise a top skin layer where a maximum concentration of C is more than or equal to 20 mass %, and which has a thickness of 0.2 to 10 nm outside the concentrated layer.

The foregoing semiconductor-device copper-alloy bonding wire may alternatively employ a structure such that an average of oxygen concentration in the concentrated layer and the top skin layer is 0.1 to 15 mass %.

The semiconductor device copper-alloy bonding wire may further comprise a top skin layer where a maximum concentration of C is more than or equal to 20 mass % outside the concentrated layer, and wherein: the total concentration of Mg and P in the concentrated layer may be 0.05 to 10 mass %; and a thickness of the top skin layer may be 0.2 to 10 nm.

The semiconductor device copper-alloy bonding wire may further comprise a top skin layer where a maximum concentration of C is more than or equal to 20 mass % outside the concentrated layer, and wherein: a maximum of the total concentration of Mg and P in the concentrated layer may be 0.2 to 30 mass %; and a thickness of the top skin layer may be 0.2 to 10 nm.

According to the foregoing semiconductor-device copper-alloy bonding wire, a thickness of the concentrated layer may be 0.2 to 20 nm.

DETAILED DESCRIPTION OF THE PREFERRED EMBODIMENTS

1. First Embodiment (1) Structure

Figure 1:
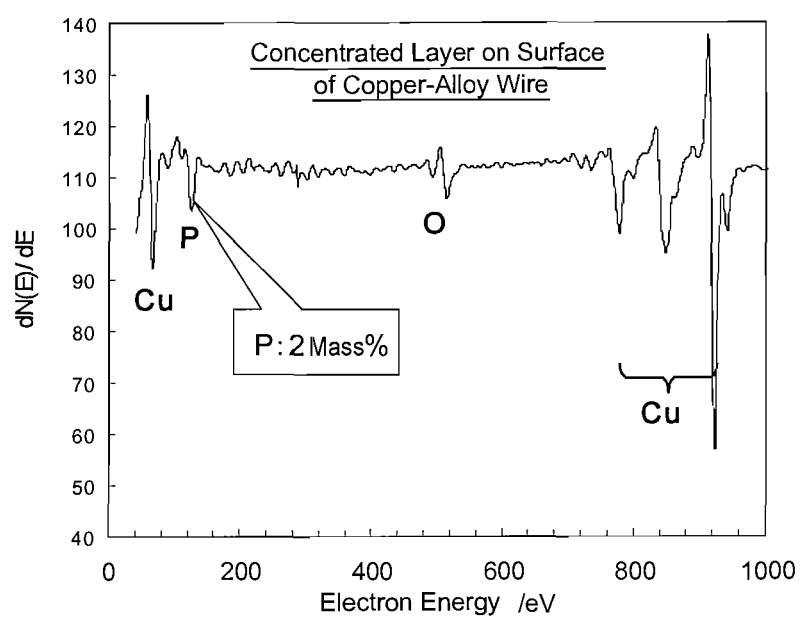
FIG. 1 is a diagram showing Auger analysis spectrum of the surface of a copper-alloy wire.

Regarding a bonding wire, the effects of the contained components in the bonding wire made of a copper material were earnestly researched. As a result, it became apparent that by adding at least one element of Mg and P in copper, the shape of a ball joining portion is likely to be improved, but the variability in manufacturing is large, and the characteristic changes with time in manufacturing and storing. Therefore, in addition to adding metal elements, the effects of a tiny amount of impurities, and gas component in copper were examined, and as a result, it was found that adding at least one element of Mg and P to copper at a moderate amount and causing a tiny amount of oxygen to be contained in the copper are effective to stabilize the joining characteristic and the loop controllability, and the like.

The present invention therefore discloses a semiconductor-device copper-alloy bonding wire (hereinafter called "copper-alloy bonding wire") which contains at least either one of Mg and P (first element group) in total of 10 to 700 mass ppm, and oxygen within a range from 6 to 30 mass ppm.

By adding the first element group (Mg and P), the possibility of the deformation failure of a joined ball portion, such as an irregular shape, a petal shape, and the like, is likely reduced. This is expected to be a result of miniaturization of the crystal grain of the ball due to dendrite growth control or the like. However, the shape variability of balls in joining is not stabilized even if at least either one of Mg and P is merely contained. If highly-concentrated Mg and P are added to improve the ball deformation, the ball is hardened, thereby damaging a chip.

If a tiny amount of oxygen is contained, the improvement of the ball deformation by adding the first element group is enhanced, and the amount of the element to be added can be reduced. Further, effects of miniaturizing the recrystallized structure of a neck portion right ahead of a ball, and of improving the pull strength were confirmed. It is expected that by causing oxygen to be contained in the interior, surface, and the like of a copper-alloy bonding wire, a part of Mg and P form oxidative products which work to improve the circularity in deforming a ball, and to suppress the growth of recrystallized grain of a neck portion.

When a copper-based bonding wire is left in the air, the surface copper is oxidized with time, so that it is considered that the wedge joining characteristic may be deteriorated and a ball may be oxidized. In accordance with the longer period at which the bonding wire is left in the air, the copper oxide film becomes thick, and degradation progresses. Such a time degradation is likely to be accelerated when an element which is likely to be oxidized is added to Cu. Even in case of a copper-alloy bonding wire to which only Mg and P are added, if the period at which the bonding wires are left in the air becomes long, the ball shape variability may become large. On the other hand, by containing Mg and P and oxygen, changes due to oxidization, sulfuration and the like of the wire surface are reduced, and the stabilized characteristic can be obtained even if the bonding wire is used after it has been stocked for some period.

If the contained density (concentration) of Mg or P is less than 10 mass ppm, the possibility of ball deformation failure, such as irregular shape, and petal shape, increases as mentioned above. If the contained density of Mg or P is greater than or equal to 10 mass ppm, however, the effect of improving the circularity of the joining shape of a ball is further enhanced, a sufficient addition effect of stabilizing the ball joining shape is obtained, and if it exceeds 700 mass ppm, a chip may be damaged. Preferably, if it is greater than or equal to 45 mass ppm, effects of improving the strength of a neck portion, and of stabilizing a loop shape can be obtained in addition to improvement of the joining shape of a ball. Desirably, if it is within a range from 60 to 500 mass ppm, an effect of suppressing poor joining by wedge joining is obtained, and further preferably, if it is within a range from 100 to 400 mass ppm, peeling or the like is suppressed and the good successive ball joining characteristic can be obtained.

With the contained concentration of Mg and P being within a concentration range from 10 to 700 mass ppm, if the total oxygen concentration to be contained is greater than or equal to 6 mass ppm, an effect of improving the ball joining shape is obtained, and if it exceeds 30 mass ppm, a ball portion is hardened, thus damaging a chip and reducing the ball joining strength. Preferably, if it is within a range from 6 to 20 mass ppm, a good characteristic can be obtained in wedge joining after a bonding wire is stocked for a certain period.

By evaluating a copper bonding wire, it was confirmed that there is a correlation between the total concentration of oxygen and the characteristic. It is expected that oxygen complicatedly affects the characteristics of a copper bonding wire, such as the ball joining characteristic due to the organization of a melted ball portion, compression deformation behavior, and the like, the wedge joining characteristic due to oxidization of the adjacent portion of the wire surface, a loop shape characteristic, and a long-term reliability. The total concentration of oxygen contained in a copper-alloy bonding wire is a total of oxygen, such as deposited solid solution oxygen in the copper-alloy bonding wire, an oxidative product, oxygen contained in the oxidative product on the wire surface, and oxygen contained in an organic material attached to the surface, which is measured through analysis of the copper-alloy bonding wire. The oxidization target is mainly copper, but partially includes oxidization of alloy elements included in copper.

Various schemes are possible for introducing oxygen. For example, the concentration of oxygen contained in a copper-alloy bonding wire can be comprehensively adjusted by the following independent or combined schemes: (1) adjusting oxygen amount contained in a copper raw material; (2) controlling the atmosphere in a dissolving step or using deoxidation elements; (3) performing pickling on an oxide film on the surface of an ingot; (4) controlling oxidation of a wire surface during a wire drawing step; (5) controlling an oxygen concentration in a heating atmosphere in a middle annealing or a final annealing step; (6) applying an organic film or a protective coat to a wire surface; (7) suppressing oxidation of a final wire product in storing, and the like. For example, an example of a manufacturing scheme of controlling oxidation in annealing is a scheme of adjusting an oxygen concentration at a heated area during a procedure of causing wires to successively pass through a heater, or a scheme of causing a bonding wire to be exposed to an atmosphere at some temperature range by controlling a passing speed of a bonding wire, the temperature of an area to be cold, and the like. Those schemes make it possible to control the concentration of oxygen contained in a copper-alloy bonding wire.

It is difficult to completely separate solid solution oxygen and oxygen of an oxide from each other during concentration analysis of a tiny amount of oxygen, so that detecting oxygen in a total concentration is much easier. It was expected that the concentration of a tiny amount of oxygen would change even though an analysis method was employed, so that a combustion method was employed for the present invention. More specifically, an inert gas melting infrared absorption scheme (JIS H 1067) was employed, and the foregoing concentration range was decided based on the total concentration of oxygen using a LECO-made analysis device which is generally used. Specifically, extraction was performed by an impulse heating and melting scheme, and detection was performed by an infrared absorption scheme. The reason why such schemes were employed was because those schemes are relatively easy for preparing samples, and an analysis scheme has been established with various samples. In a case where a different analysis scheme is employed, the top and bottom limits of the concentration may slightly shift, but if quantification is performed through comparison with the combustion scheme, the same concentration management can be applied.

Controlling surface oxide film in the form of oxygen, such as solid solution oxygen, oxide, and surface oxide film, is important and relatively easy. It is desirable that the ratio of oxygen in an oxide film in a total oxygen concentration should be within a range from 10 to 80 mass %. Let us simply estimate a relationship between the thickness of a surface oxide film and an oxygen concentration. Suppose that all oxygen is an oxide film ($Cu_2O$) on a surface, the thickness of the oxide film is then estimated. For example, if oxygen of 6 mass ppm is contained only in a surface oxide film, the thickness of the surface oxide film becomes 0.5 nm, 1 nm for copper-alloy bonding wires having diameters of 25 μm and 50 μm, respectively. In case of oxygen of 30 mass ppm, the thicknesses become 2.4 nm and 4.8 nm for the respective diameters. In practice, it is necessary to consider solid solution oxygen in copper, so that it is presumed that the substantial thickness of a Cu oxide film estimated from an oxygen concentration becomes further thin. Preferably, if the thickness of the surface oxide film is within a range from 0.5 to 20 nm, the effects of improving the shape of a ball, and of improving the pull strength can be stably and easily obtained.

Auger spectrometry can be employed as the analysis scheme of the thickness of a surface oxide film. According to such a scheme, a film thickness can be measured in some nm order of a surface. However, the result of Auger analysis is local information, analysis of complex substances may be difficult, and it is difficult to calculate a total concentration of oxygen based on only an oxide film thickness obtained from an analysis result. Therefore, it is desirable that Auger analysis is used for complementing the foregoing chemical result.

According to a copper-alloy bonding wire containing at least one of Mg and P (first element group) in total of 10 to 700 mass ppm, at least one of Ag, Pd, Pt and Au (second element group) in total of 10 to 5000 mass ppm, and oxygen within a range from 6 to 30 mass ppm, the joining shape of a ball portion can be improved and the joining strength can be enhanced.

The ball joining shape can be improved using both the foregoing first element group and oxygen, but if a second element group is further added, it is possible to suppress misalignment of a ball formed at the leading end of a wire. Eccentricity in joining a ball is suppressed, thereby improving the circularity of a joining shape. As another effect of adding the second element group, oxidation of a ball surface is suppressed, thereby improving the joining strength of a Cu ball with an aluminum electrode. By adding the second element group with Mg and P rather than adding the second element group only, the effect of improving the joining strength is further advanced.

If the contained concentration of the second element group is greater than or equal to 10 mass ppm, the foregoing addition effect can be achieved, but if it exceeds 5000 mass ppm, a ball portion is so hardened that a chip is damaged. Preferably, if the concentration is within a range from 20 to 4000 mass ppm, it is effective to obtain both the good ball shape characteristic and the good joining strength in general-purpose pitch connection having a pad electrode clearance of less than or equal to 80 μm and low temperature connection having a joining temperature of less than or equal to 200° C. On the other hand, in case of giving a preference to the long-term joining reliability at a high temperature, it is desirable that the total concentration of the second element group should be 500 to 3000 mass ppm.

According to a copper-alloy bonding wire containing at least one of Mg and P (first element group) in total of 10 to 700 mass ppm, at least one of Be, Al, Bi, Si, In, Ge, Ti and V (third element group) in total of 6 to 300 mass ppm, and oxygen within a range from 6 to 300 mass ppm, the mechanical characteristics, such as the wire strength, and the elasticity, can be improved in addition to improvement on a ball joining shape, thereby improving the usability of a thin wire.

Adding the third element group brings about an effect of enhancing the strength, but because of a problem like oxidation, high concentration addition is difficult, so that the usability of such an effect is limited. By using both the third element group and the first element group, the effect of suppressing petal deformation failure of ball joining is obtained, and further, the effect of enhancing the wire strength can be obtained.

This is because that when the third element group is used together with the first element group, preferential oxidation of the third element group is suppressed, so that the solid solubility is likely to be improved, and petal deformation is suppressed, and enhancement of the wire strength is advanced well. A copper-alloy bonding wire is generally so manufactured as to be elongated well in comparison with an Au bonding wire to improve the wedge joining characteristic, so that the strength is often reduced. Using the first element group and the third element group together brings about the effect of enhancing the strength even if a bonding wire is subjected to elongation, so that it serves many uses. Even if a copper-alloy bonding wire is stocked for a long period, addition of the first element group delays segregation of the third element group to a surface, thereby maintaining the wedge joining characteristic in a good state which is a subject of time degradation.

If the contained concentration of the third element group is greater than or equal to 5 mass ppm, then the foregoing effects can be obtained, but if it exceeds 300 mass ppm, the third element group may deposit on the surface of a ball portion, and the joining strength may be reduced. Preferably, if it is within a range from 5 to 200 mass ppm, precipitation on a ball surface, concentration and the like which are the factors of reducing the joining strength are suppressed and a clean ball can be obtained, thereby improving the successive ball joining characteristic. Further preferably, if the concentration is within a range from 10 to 100 mass ppm, the peel strength at low temperature joining of less than or equal to 180° C. can be enhanced. Measurement of a peel strength can be substituted by a simple scheme of measuring a pull strength at a portion adjacent to that portion where wedge joining is performed.

According to a copper-alloy bonding wire containing at least one of Mg and P (first element group) in total of 10 to 700 mass ppm, at least one of Ca, Y, La, Ce, Pr, and Nd (fourth element group) in total of 5 to 300 mass ppm, and oxygen within a range from 6 to 40 mass ppm, recrystallization of a neck portion is controlled, and a portion affected by heat is shortened, and it is advantageous for low-height looping, in addition to improvement of the joining shape of a ball portion.

There is a tendency such that low-height looping is achieved by adding the fourth element group, but because of a problem like oxidation, high concentration addition is difficult, and the usability of such an effect is limited. By adding both fourth element group and first element group, however, the effect of suppressing elliptic deformation of a joined ball in an ultrasonic wave direction and the effect of suppressing recrystallization are further enhanced. For example, low-height looping of greater than or equal to 20% can be achieved by complex addition. This is because that when the fourth element group is used together with the first element group, preferential oxidation of the fourth element group is suppressed, precipitation of the fourth element group is suppressed, the solid solubility is likely to be improved, elliptic deformation of a ball portion is suppressed, or damaging a neck portion is suppressed by the multiple action of the fourth element group and the first element group, thereby accelerating low-height looping. Even if a copper-alloy bonding wire is stocked for a long period, the first element group delays segregation of the fourth element group to a surface, thereby maintaining the wedge joining characteristic in a good state which is a subject of time degradation.

If the contained concentration of the fourth element group is greater than or equal to 5 mass ppm, the foregoing addition effects can be obtained, but if it exceeds 300 mass ppm, the fourth element group may deposit on the surface of a ball, and the joining strength may be reduced. Preferably, if the concentration is within a range from 10 to 200 mass ppm, the successive ball joining characteristic is improved. Further preferably, if the concentration is within a range from 15 to 100 mass ppm, the peel strength in low temperature joining less than or equal to 180° C. can be enhanced.

According to a copper-alloy bonding wire containing at least one of Mg and P (first element group) in total of 10 to 700 mass ppm, at least one of Ag, Pd, Pt and Au (second element group) in total of 10 to 5000 mass ppm, at least one of Be, Al, Bi, Si, In, Ge, Ti, and V (third element group) in total of 6 to 300 mass ppm, and oxygen within a range from 6 to 30 mass ppm, the elasticity of a copper-alloy bonding wire is improved in addition to improvement of the joining shape of a ball portion, and the linearity of the copper-alloy bonding wire can be ensured in case of a long span which requires a wire length of greater than or equal to 4 mm, and the bonding wire can be applied to BGA mounting.

According to a copper-alloy bonding wire containing at least one of Mg and P (first element group) in total of 10 to 700 mass ppm, at least one of Ag, Pd, Pt and Au (second element group) in total of 10 to 5000 mass ppm, at least one of Ca, Y, La, Ce, Pr, and Nd (fourth element group) in total of 5 to 300 mass ppm, and oxygen within a range from 6 to 30 mass ppm, recrystallization of a neck portion is controlled in addition to improvement of the joining shape of a ball portion, stabilization of a loop shape can be improved in case of multistage wiring having different loop heights, so that it is possible to cope with high-density connection of plural pins which is greater than or equal to 200 pins.

According to a copper-alloy bonding wire containing at least one of Mg and P (first element group) in total of 10 to 700 mass ppm, at least one of Ag, Pd, Pt and Au (second element group) in total of 10 to 5000 mass ppm, at least one of Be, Al, Bi, Si, In, Ge, Ti and V (third element group) in total of 6 to 300 mass ppm, at least one of Ca, Y, La, Ce, Pr and Nd (fourth element group) in total of 5 to 300 mass ppm, and oxygen within a range from 6 to 30 mass ppm, it is observed that in addition to improvement of the joining shape of a ball portion, the wire strength is enhanced, and the adaptability to low-height looping, the linearity for a long span, and the stability of a loop are improved, and what is more, wire deformation in filling a resin is suppressed. It is expected that such a bonding wire having improved overall characteristics can cope with narrow-pitch connection having a pad electrode clearance of less than or equal to 60 μm.

(2) Examples

An explanation will be given of examples of the invention.

Copper alloys containing individual chemical components shown in tables 1 to 3 were cast by a melting furnace. The ingots thereof were rolled, and were subjected to drawing using a dice, and a post heating process of performing heating while successively sweeping wires was performed, thereby manufacturing copper-alloy bonding wires. The final wire diameter was set to a range from 20 to 75 μm.

The detail of the manufacturing process will be explained below. Using high-purity copper whose copper purity was 4N to 6N (99.99 to 99.9999 mass %), necessary components to be contained were added, and melting was performed at a temperature of greater than or equal to 1100° C. under a vacuum, nitrogen, or Ar gas atmosphere. Thereafter, the target was annealed in a furnace, and an ingot having a diameter of 6 to 30 mm was made. To clean the surface of the ingot, pickling and rinsing with water was performed on the ingot, and the ingot was dried. In a rolling step, a grooved roll was used, and the ingot was machined at a speed of 30 to 200 m/min until a wire diameter became 0.5 to 1.5 mm. In a drawing step, using a successive drawing device to which a plurality of dices can be set, and a diamond-coated dices, drawing was performed at a drawing speed within a range from 50 to 400 m/s. To clean the inner wall of a dice, ultrasonic cleaning was performed on a dice before it was used. In a post heating process step, an infrared heater having a soaking band (even heat band) of greater than or equal to 10 cm was used, and wires were successively moved through a furnace set to a temperature of 250 to 600° C. at a speed of 50 to 500 m/min, and a sweeping tensile within a range from 2 to 30 mN, and adjustment was performed in such a way that the elongation value of a tensile test would become 4 to 25%. By moderating adjustment of a wire passing speed, a temperature distribution in the even heat band and a distance from the even heat band to the eject port, it is possible to control oxidation progression of a wire surface. A rust-preventive agent was applied on a wire surface as necessity, a spool on which a copper-alloy bonding wire was winded was covered with a protective bag, and was sealed under an $N_2$ atmosphere in storing. Regarding analysis on a tiny amount of elements in copper, an ICP device was used for alloy element concentration analysis, and an LECO-made infrared absorption measurement device was used for oxygen concentration analysis based on JIS H 1067.

An ASM-made general-purpose automatic wire bonder device was used for performing ball/wedge joining to connect a copper-alloy bonding wire. In ball joining, a ball portion was formed at the leading end of a wire by arc discharge, and was joined to an electrode film by thermal pressure bonding with an ultrasonic wave. In case of a copper-alloy bonding wire, to suppress oxidation in melting, a ball was formed with an inert gas applied to the leading end of the wire. An $N_2+5\%$ $H_2$ gas was used as the inert gas. The other end of the wire was subjected to wedge joining to a lead frame or a lead portion of a BGA substrate.

As a joining target, an Al alloy film (Al-1% Si-0.5% Cu) having a thickness of approximately 0.8 to 3 μm which was a material of an electrode film on a silicon substrate was used. The same effectiveness can be acquired if the target is Al-0.5% Cu. As a target of wedge joining, a lead frame having an Ag plating (thickness: 1 to 4 μm) formed on the surface thereof was used. The difference between the example and a comparative example was confirmed even if a glass-epoxy resin substrate having Au plating/Ni plating/Cu wiring (G display) formed on the surface thereof was used.

Typical mechanical characteristics of a copper-alloy bonding wire, such as a wire strength ("tensile strength" in tables) and an elasticity ("elongation" in tables) were measured through an tensile test. A sample length was 10 mm, and five samples were subjected to measurement, and the average of breaking strengths per unit area was used.

10 ball portions were observed through an optical microscope or an SEM to check the shape of a ball portion. Regarding misalignment that a ball was so formed as to be inclined from the center of a wire, when obvious misalignment was observed for greater than or equal to one ball, it was determined as no-good, and a cross mark was put on a corresponding field "ball misalignment" in a table, when a minor curving was observed for less than or equal to one ball, it was determined as no problem, and a single-circle mark was put on a corresponding field, and when no misalignment observed, it was determined as good, and a double-circle mark was put on a corresponding field.

A ball portion was joined to an electrode film on a silicon substrate to evaluate the shape of a ball joining portion. The evaluation was carried out at stage temperatures of 220° C., which was a normal temperature, and 175° C., which was a low temperature at which wedge joining became difficult. Regarding anisotropic evaluation of ball deformation, the ball deformation was categorized to petal deformation, elliptic deformation, and misaligned deformation, and bonding conditions which accelerated the individual failures were applied.

500 ball joining portions were observed through an optical microscope to check occurrence of elliptic deformation and petal deformation of a ball joining portion. When there were greater than or equal to three ball joining portions in elliptic forms, it was determined as no-good, and an evaluation of ellipsoid occurrence was indicated by a cross mark in a field "elliptic deformation" in a table, when there were one or two ball joining portions subjected to minor elliptic deformation, a single-circle mark was put on a corresponding field, and when no deformation occurred, a double-circle mark was put on a corresponding field. Moreover, regarding petal concavity and convexity, when noticeable petal deformation was observed for more than or equal to 4 ball joining portions, it was determined as no-good, and a cross mark was put on a field "petal deformation" in a table, when minor petal deformation occurred for one to three ball joining portions, a single-circle mark was put on a corresponding field, and when no petal deformation occurred, a double-circle mark was put on a corresponding field.

Regarding misalignment failure, 500 ball joining portions were observed through an optical microscope, when the center of a ball joining portion was misaligned from the center of a wire right above that ball joining portion at greater than or equal to 5 μm, it was determined as misalignment, and based on a relatively exact determination condition, when misalignment occurred for more than or equal to three ball joining portions, a cross mark was put on a field "misalignment deformation" in a table, and when misalignment occurred for one to two ball joining portions, a single-circle mark was put on a corresponding field, and when no misalignment occurred, a double-circle mark was put on a corresponding field.

Regarding successive bonding evaluation for ball joining portions, 1000 wires were connected, and evaluation was carried out based on the number of peelings of ball joining portions. To do acceleration evaluation, a load and ultrasonic wave vibration were so set as to be slightly lower than those of a mass-production condition. If the number of peelings was greater than or equal to six, joining was not sufficient so that a cross mark was put on a field "successive ball joining" in a table, when the number of peelings was three to five, a triangle mark was put on a corresponding field, when the number of peelings was one to two, it was determined as no problem for mass-production, and a single-circle mark was put on a corresponding field, and when no peeling was observed, it was determined that sufficient joining strength was achieved, and a double-circle mark was put on a corresponding field.

Regarding evaluation for a damage to a chip, a ball portion was joined to an electrode film, the electrode film was etched and removed, and a damage to an insulation film or a silicon chip was observed through an SEM. 400 electrode portions were observed. When no damage was observed, a double-circle mark was put on a field "chip damage" in a table, when less than or equal to two cracks of less than or equal to 5 μm were observed, it was determined as no-problem and a single-circle mark was put on a corresponding field, when more than or equal to two cracks of greater than or equal to 5 μm and less than 20 μm were observed, it was determined as a considerable level, an a triangle mark was put on a corresponding field, and when more than or equal to one crack of more than or equal to 20 μm or crater damage was observed, it was determined as no-good, and a cross mark was put on a corresponding field.

Regarding evaluation for the strength of a neck portion, a pull test (neck pull strength) was carried out near a ball joining portion, and twenty breaking loads (pull strength) were measured. When a neck pull strength was greater than or equal to 60% of a tensile strength, it was determined as good, and a double-circle mark was put on a field "neck pull strength" in a table, when less than 30%, it was determined as improvement necessary, and a triangle mark was put on a corresponding field, and when a neck pull strength was in a middle of those percentages, a single-circle mark was put on a corresponding field.

Joining targets and stage temperatures were set differently to effectively evaluate a wedge joining characteristic. Specifically, conditions were set to two cases where a wire was joined on an Ag plating on the surface of a lead frame at a normal temperature of 220° C., and where a wire was joined on Au plating/Ni plating/Cu wiring on the surface of a resin substrate at a low temperature of 175° C. Further, regarding copper-alloy bonding wires used for the evaluation, two samples were used: one of the samples had undergone bonding within three days after the wire was manufactured, and the other had undergone bonding after it was stocked for thirty days in a condition where it was packed and sealed with an $N_2$ gas after the wire was manufactured. Regarding the former three days condition, there would be little differences in wire characteristics, and low temperature joining at 175° C. was carried out, and regarding the latter condition, a wire left for a long time was joined at a normal temperature of 220° C.

A total of 1000 copper-alloy bonding wires were connected for evaluating a wedge joining characteristic. For a sample, the foregoing sample which was a copper-alloy bonding wire manufactured within three days and was subjected to low temperature joining of 175° C. was used. As an evaluation criteria, when a successive bonding operation was interrupted once or more times because of a failure of a wedge joined portion or more than or equal to seven failure phenomenon like peeling were observed through an optical microscope, it was determined as a poor wedge joining characteristic, and a cross mark was put on a field "wedge joining characteristic" in the table, when 5 to 6 failures were observed, it was determined as an insufficient wedge joining characteristic, and a triangle mark was put on a corresponding field, when successive bonding was possible but one peeling phenomenon was observed, it was determined as normally no-problem, and a single-circle mark was put on a corresponding field, and when no failure phenomenon was observed through successive bonding, it was determined as a good wedge joining characteristic, and a double-circle mark was put on a corresponding field.

For evaluating a peel joining strength, a pull test for a wedge joined portion was carried out. Specifically, a hook hooked to loops at a portion close to a wedge joined portion beyond ¾ of a wire length was moved upward, and a breaking strength of a copper-alloy bonding wire was measured. Because a pull strength depends on a diameter of a copper-alloy bonding wire, a loop shape, a joining condition and the like, a relative ratio (Rp) of pull strength/wire tensile strength was used instead of the absolute value of a pull strength. When an Rp was greater than or equal to 20%, it was determined that a wedge joining characteristic was good, and a double-circle mark was put on a field "low temperature joining peel strength" in a table, when it was greater than or equal to 15% but less than 20%, it was determined as no problem, and a single-circle mark was put on a corresponding field, when it was greater than or equal to 10% but less than 15%, it was determined that a failure may occur, and a triangle mark was put on a corresponding field, and when it was less than 10%, it was determined that there was a failure in a mass-production step, and a cross mark was put on a corresponding field.

To evaluate the linearity of a bonded loop, using thirty copper-alloy bonding wires undergone bonding in such a manner as to have a 4 mm wire clearance (span), the bonding wires were observed from the above through a projection device. With respect to a straight line which connected a portion of a joined portion at a ball side and a portion thereof at a wedge side, a misalignment of that portion where copper-alloy bonding wires were most distant from each other was measured as a bending degree. When the average of bending degrees were less than the diameter of one wire, it was determined as good, and a double-circle mark was put on a field "linearity" in a table, when it is more than or equal to the diameters of two wires, it was determined as failure, and a triangle mark was put on a corresponding field, and when it was a middle value therebetween, it was determined as normally no-problem, and a single-circle mark was put on a corresponding field.

Regarding the stability of a loop shape in a bonding step, plural sets of thirty trapezoidal loops were so connected as to have loop heights of 200 μm and 350 μm, respectively, at a wire length of 3 mm, and evaluation was carried out based on the standard deviation of heights. When a loop height changes, a variability factor changes, so that there may be different behaviors between the loop heights of 200 μm and 350 μm. An optical micrometer was used for measurement, and the measurement was carried out at three portions: a rising portion right above a ball portion; a top portion; and the center of a wire. When the standard deviation of the loop heights was greater than or equal to ½ of a wire diameter, it was determined as a large variability, and when it was less than ½, it was determined as a small variability. Based on such criteria, when the variability was small for all three portions, it was determined that the loop shape was stable, and a double-circle mark was put on a field "height stability" in a table, when there was one portion having a large variability, it was determined as relatively good, a single-circle mark was put on a corresponding field, when there were two portions, a triangle mark was put on a corresponding field, and when there were three portions having large variability, a cross mark was put on a field.

Regarding evaluation for a low loop characteristic, thirty trapezoidal loops were connected at a wire length of 2 mm, and the evaluation was carried out based on the standard deviation of heights. Because a loop height depends on a wire diameter, adjustment was carried out in such a manner as to have a target loop height of 150 μm for a wire diameter of 20 to 30 μm, and a target loop height of 200 μm for a wire diameter of 50 to 75 μm. Measurement of a loop height, determination criteria based on a standard deviation, and the like were the same as the foregoing ones, and the evaluation results were indicated in fields "low loop characteristic" in a table.

In the tables 1 to 4, copper-alloy bonding wires according to claim 1 are examples 1 to 104, copper-alloy bonding wires according to claim 2 are examples 9 to 20, 64 to 72, 79 to 82, 86, 87, 98 to 104, copper-alloy bonding wires according to claim 3 are examples 24 to 41, 64 to 66, 70 to 82, 88 to 95, 98 to 100, 103, 104, copper-alloy bonding wires according to claim 4 are examples 45 to 60, 67 to 72, 81, 82, 96, 97, 101 to 104, copper-alloy bonding wires according to claim 5 are examples 64 to 66, 70 to 72, 79 to 82, 98 to 100, 103, 104, copper-alloy bonding wires according to claim 6 are examples 67 to 72, 81, 82, 101 to 104, copper-alloy bonding wires according to claim 7 are examples 70 to 72, 81, 82, 103, 104, copper-alloy bonding wires according to claim 8 are examples 1 to 82, copper-alloy bonding wires according to claim 9 are examples 1 to 104, and copper-alloy bonding wires according to claim 10 are examples 1 to 104.

Examples 21 to 23 correspond to a copper-alloy bonding wire which satisfies claim 1, contains the second element group, but not satisfy claim 2, examples 42 to 44 correspond to a copper-alloy bonding wire which contains the third element group but not satisfy claim 3, and examples 61 to 63 correspond to a copper-alloy bonding wire which contains the fourth element group but not satisfy claim 4.

Comparative examples 1 to 18 correspond to a copper-alloy bonding wire which does not satisfy claim 1

TABLE 1

| | | Component Concentration (Mass ppm) | | | | | | | | | | | | |
|---|---|---|---|---|---|---|---|---|---|---|---|---|---|---|
| | | First Element Group | | | Second Element Group | | | | | Third Element Group | | | | |
| | | Mg | P | Total | Ag | Pd | Pt | Au | Total | Be | Al | Bi | Si | In |
| Examples | 1 | 50 | | 50 | | | | | 0 | | | | | |
| | 2 | | 48 | 48 | | | | | 0 | | | | | |
| | 3 | 90 | | 90 | | | | | 0 | | | | | |
| | 4 | | 90 | 90 | | | | | 0 | | | | | |
| | 5 | | 210 | 210 | | | | | 0 | | | | | |
| | 6 | | 630 | 630 | | | | | 0 | | | | | |
| | 7 | 25 | 160 | 185 | | | | | 0 | | | | | |
| | 8 | 40 | 440 | 480 | | | | | 0 | | | | | |
| | 9 | 47 | | 47 | 30 | | | | 30 | | | | | |
| | 10 | | 200 | 200 | 300 | | | | 300 | | | | | |
| | 11 | 45 | 100 | 145 | 4300 | | | | 4300 | | | | | |
| | 12 | 25 | 200 | 225 | | 45 | | | 45 | | | | | |
| | 13 | 30 | 150 | 180 | | 1100 | | | 1100 | | | | | |
| | 14 | | 100 | 100 | | 3000 | | | 3000 | | | | | |
| | 15 | 15 | 300 | 315 | | | 45 | | 45 | | | | | |
| | 16 | | 52 | 52 | | | 35000 | | 35000 | | | | | |
| | 17 | 240 | 310 | 550 | | | | 23 | 23 | | | | | |
| | 18 | | 200 | 200 | | | | 2800 | 2800 | | | | | |
| | 19 | 25 | 85 | 110 | 50 | 900 | | | 950 | | | | | |
| | 20 | 68 | | 68 | | | 220 | 115 | 335 | | | | | |
| | 21 | | 120 | 120 | | 3 | | 4 | 7 | | | | | |
| | 22 | 30 | 57 | 87 | 4 | | 2 | 3 | 9 | | | | | |
| | 23 | 180 | 60 | 240 | 1500 | 2000 | 1500 | 1400 | 6400 | | | | | |
| | 24 | | 120 | 120 | | | | | 0 | 7 | | | | |
| | 25 | | 200 | 200 | | | | | 0 | 32 | | | | |
| | 26 | 20 | 63 | 83 | | | | | 0 | 160 | | | | |
| | 27 | | 200 | 200 | | | | | 0 | | 30 | | | |
| | 28 | 80 | | 80 | | | | | 0 | | 190 | | | |
| | 29 | | 240 | 240 | | | | | 0 | | | 16 | | |
| | 30 | | 60 | 60 | | | | | 0 | | | 157 | | |
| | 31 | | 160 | 160 | | | | | 0 | | | | 9 | |
| | 32 | | 140 | 140 | | | | | 0 | | | | 64 | |
| | 33 | 57 | 6 | 63 | | | | | 0 | | | | 240 | |
| | 34 | 130 | | 130 | | | | | 0 | | | | | 9 |
| | 35 | | 90 | 90 | | | | | 0 | | | | | 23 |
| | 36 | 90 | | 90 | | | | | 0 | | | | | 45 |
| | 37 | 235 | | 235 | | | | | 0 | | | | | |
| | 38 | 55 | 50 | 105 | | | | | 0 | | | | | |
| | 39 | 25 | 65 | 90 | | | | | 0 | 8 | | 4 | | |
| | 40 | | 200 | 200 | | | | | 0 | | 60 | | 15 | 45 |
| | 41 | 20 | 220 | 240 | | | | | 0 | | 15 | 25 | 20 | 55 |
| | 42 | 40 | 23 | 63 | | | | | 0 | 3 | | 2 | | |
| | 43 | 25 | 60 | 85 | | | | | 0 | | 1 | | | 2 |
| | 44 | 40 | 130 | 170 | | | | | 0 | 50 | 90 | 40 | 50 | 55 |

| | | Component Concentration (Mass ppm) | | | | | | | | | | | | |
|---|---|---|---|---|---|---|---|---|---|---|---|---|---|---|
| | | Third Element Group | | | | Fourth Element Group | | | | | | | | |
| | | Ge | Ti | V | Total | Ca | Y | La | Ce | Pr | Nd | Total | O | Cu |
| Examples | 1 | | | | 0 | | | | | | | 0 | 15 | Remained | 1 |
| | 2 | | | | 0 | | | | | | | 0 | 6 | Remained | 2 |
| | 3 | | | | 0 | | | | | | | 0 | 8 | Remained | 3 |
| | 4 | | | | 0 | | | | | | | 0 | 8 | Remained | 4 |
| | 5 | | | | 0 | | | | | | | 0 | 6 | Remained | 5 |
| | 6 | | | | 0 | | | | | | | 0 | 15 | Remained | 6 |

TABLE 1-continued

| | | | | | | |
|---|---|---|---|---|---|---|
| 7 | | 0 | | 0 | 28 | Remained | 7 |
| 8 | | 0 | | 0 | 18 | Remained | 8 |
| 9 | | 0 | | 0 | 27 | Remained | 9 |
| 10 | | 0 | | 0 | 8 | Remained | 10 |
| 11 | | 0 | | 0 | 11 | Remained | 11 |
| 12 | | 0 | | 0 | 13 | Remained | 12 |
| 13 | | 0 | | 0 | 8 | Remained | 13 |
| 14 | | 0 | | 0 | 9 | Remained | 14 |
| 15 | | 0 | | 0 | 24 | Remained | 15 |
| 16 | | 0 | | 0 | 7 | Remained | 16 |
| 17 | | 0 | | 0 | 16 | Remained | 17 |
| 18 | | 0 | | 0 | 12 | Remained | 18 |
| 19 | | 0 | | 0 | 11 | Remained | 19 |
| 20 | | 0 | | 0 | 9 | Remained | 20 |
| 21 | | 0 | | 0 | 12 | Remained | 21 |
| 22 | | 0 | | 0 | 9 | Remained | 22 |
| 23 | | 0 | | 0 | 10 | Remained | 23 |
| 24 | | 7 | | 0 | 10 | Remained | 24 |
| 25 | | 32 | | 0 | 6 | Remained | 25 |
| 26 | | 160 | | 0 | 8 | Remained | 26 |
| 27 | | 30 | | 0 | 8 | Remained | 27 |
| 28 | | 190 | | 0 | 15 | Remained | 28 |
| 29 | | 16 | | 0 | 15 | Remained | 29 |
| 30 | | 157 | | 0 | 8 | Remained | 30 |
| 31 | | 9 | | 0 | 8 | Remained | 31 |
| 32 | | 64 | | 0 | 7 | Remained | 32 |
| 33 | | 240 | | 0 | 8 | Remained | 33 |
| 34 | | 9 | | 0 | 10 | Remained | 34 |
| 35 | | 23 | | 0 | 8 | Remained | 35 |
| 36 | | 45 | | 0 | 8 | Remained | 36 |
| 37 | 25 | 25 | | 0 | 25 | Remained | 37 |
| 38 | 146 | 146 | | 0 | 8 | Remained | 38 |
| 39 | 5 | 17 | | 0 | 13 | Remained | 39 |
| 40 | | 120 | | 0 | 8 | Remained | 40 |
| 41 | 30 | 145 | | 0 | 7 | Remained | 41 |
| 42 | | 5 | | 0 | 9 | Remained | 42 |
| 43 | | 3 | | 0 | 12 | Remained | 43 |
| 44 | 50 | 335 | | 0 | 15 | Remained | 44 |

TABLE 2

| | | First Element Group | | | Second Element Group | | | | | Third Element Group | | | | | | | | |
|---|---|---|---|---|---|---|---|---|---|---|---|---|---|---|---|---|---|---|
| | | Mg | P | Total | Ag | Pd | Pt | Au | Total | Be | Al | Bi | Si | In | Ge | Ti | V | Total |
| Examples | 45 | 60 | 40 | 100 | | | | | 0 | | | | | | | | | 0 |
| | 46 | | 160 | 160 | | | | | 0 | | | | | | | | | 0 |
| | 47 | | 110 | 110 | | | | | 0 | | | | | | | | | 0 |
| | 48 | 40 | 45 | 85 | | | | | 0 | | | | | | | | | 0 |
| | 49 | | 100 | 100 | | | | | 0 | | | | | | | | | 0 |
| | 50 | 10 | 45 | 55 | | | | | 0 | | | | | | | | | 0 |
| | 51 | | 120 | 120 | | | | | 0 | | | | | | | | | 0 |
| | 52 | 14 | 220 | 234 | | | | | 0 | | | | | | | | | 0 |
| | 53 | 25 | 80 | 105 | | | | | 0 | | | | | | | | | 0 |
| | 54 | | 130 | 130 | | | | | 0 | | | | | | | | | 0 |
| | 55 | 30 | 70 | 100 | | | | | 0 | | | | | | | | | 0 |
| | 56 | | 170 | 170 | | | | | 0 | | | | | | | | | 0 |
| | 57 | 65 | 20 | 85 | | | | | 0 | | | | | | | | | 0 |
| | 58 | | 150 | 150 | | | | | 0 | | | | | | | | | 0 |
| | 59 | 20 | 140 | 160 | | | | | 0 | | | | | | | | | 0 |
| | 60 | 110 | 50 | 160 | | | | | 0 | | | | | | | | | 0 |
| | 61 | 220 | | 220 | | | | | 0 | | | | | | | | | 0 |
| | 62 | | 140 | 140 | | | | | 0 | | | | | | | | | 0 |
| | 63 | 20 | 130 | 150 | | | | | 0 | | | | | | | | | 0 |
| | 64 | 40 | 140 | 180 | 6 | | | 7 | 13 | | | 3 | | 4 | 4 | | | 11 |
| | 65 | | 240 | 240 | | 200 | 150 | | 350 | 20 | 15 | | 17 | | 25 | | | 77 |
| | 66 | | 120 | 120 | 400 | 450 | | 1300 | 2150 | 6 | 20 | | 25 | 50 | | | | 101 |
| | 67 | | 120 | 120 | 55 | | | 72 | 127 | | | | | | | | | 0 |
| | 68 | 25 | 130 | 155 | | 350 | 1400 | | 1750 | | | | | | | | | 0 |
| | 69 | | 100 | 100 | 1200 | 300 | | | 1500 | | | | | | | | | 0 |
| | 70 | | 140 | 140 | 450 | | | | 450 | 25 | | | 45 | 70 | | | | 140 |
| | 71 | 120 | | 120 | | 70 | 50 | 45 | 165 | 50 | 10 | 20 | | | | | | 80 |
| | 72 | | 140 | 140 | 230 | 140 | 170 | 40 | 580 | 7 | | 40 | | 50 | 70 | | | 167 |
| | 73 | | 50 | 50 | | | | | 0 | | | | | | | 8 | | 8 |

TABLE 2-continued

```
74   70        70                          0                              250            250
75        60   60                          0                                    6          6
76   15   35   50                          0                                    150      150
77        50   50                          0    20        20                    50        90
78       100  100                          0         10        10              20        40
79   50        50             50          50   10  20                    30              60
80       100  100   50        30          80                      20          30        50
81   20   50   70   50   50        30    130   20   20        10              30   10   90
82       150  150   20   10             30     30        10   10        10    10   20   90
```

|  |  | Component Concentration (Mass ppm) | | | | | | |
|---|---|---|---|---|---|---|---|---|
|  |  | Fourth Element Group | | | | | | |
|  |  | Ca | Y | La | Ce | Pr | Nd | Total | O | Cu |
| Examples | 45 | 12 |  |  |  |  |  | 12 | 11 | Remained | 45 |
|  | 46 | 47 |  |  |  |  |  | 47 | 7 | Remained | 46 |
|  | 47 | 270 |  |  |  |  |  | 270 | 8 | Remained | 47 |
|  | 48 |  | 8 |  |  |  |  | 8 | 14 | Remained | 48 |
|  | 49 |  | 60 |  |  |  |  | 60 | 8 | Remained | 49 |
|  | 50 |  |  | 6 |  |  |  | 6 | 11 | Remained | 50 |
|  | 51 |  |  | 130 |  |  |  | 130 | 6 | Remained | 51 |
|  | 52 |  |  |  | 7 |  |  | 7 | 7 | Remained | 52 |
|  | 53 |  |  |  | 140 |  |  | 140 | 12 | Remained | 53 |
|  | 54 |  |  |  |  | 6 |  | 6 | 8 | Remained | 54 |
|  | 55 |  |  |  |  | 100 |  | 100 | 8 | Remained | 55 |
|  | 56 |  |  |  |  |  | 7 | 7 | 10 | Remained | 56 |
|  | 57 |  |  |  |  |  | 160 | 160 | 8 | Remained | 57 |
|  | 58 | 2 |  | 3 |  |  | 4 | 9 | 8 | Remained | 58 |
|  | 59 |  | 25 | 35 | 30 | 22 | 30 | 142 | 8 | Remained | 59 |
|  | 60 | 40 |  | 15 |  | 14 |  | 69 | 8 | Remained | 60 |
|  | 61 |  | 2 |  | 1 |  | 1 | 4 | 15 | Remained | 61 |
|  | 62 | 1 |  | 2 |  | 1 |  | 4 | 12 | Remained | 62 |
|  | 63 | 50 | 45 | 40 | 54 | 60 | 70 | 319 | 10 | Remained | 63 |
|  | 64 |  |  |  |  |  |  | 0 | 23 | Remained | 64 |
|  | 65 |  |  |  |  |  |  | 0 | 8 | Remained | 65 |
|  | 66 |  |  |  |  |  |  | 0 | 10 | Remained | 66 |
|  | 67 | 3 |  |  | 2 |  | 3 | 8 | 8 | Remained | 67 |
|  | 68 |  | 30 | 15 |  | 25 |  | 70 | 10 | Remained | 68 |
|  | 69 | 35 | 25 |  | 40 |  | 20 | 120 | 8 | Remained | 69 |
|  | 70 |  | 30 | 10 |  | 30 |  | 70 | 6 | Remained | 70 |
|  | 71 | 25 | 20 |  | 17 |  | 20 | 82 | 9 | Remained | 71 |
|  | 72 | 30 | 40 | 20 |  | 30 |  | 120 | 7 | Remained | 72 |
|  | 73 |  |  |  |  |  |  | 0 | 6 | Remained | 73 |
|  | 74 |  |  |  |  |  |  | 0 | 9 | Remained | 74 |
|  | 75 |  |  |  |  |  |  | 0 | 6 | Remained | 75 |
|  | 76 |  |  |  |  |  |  | 0 | 10 | Remained | 76 |
|  | 77 |  |  |  |  |  |  | 0 | 9 | Remained | 77 |
|  | 78 |  |  |  |  |  |  | 0 | 12 | Remained | 78 |
|  | 79 |  |  |  |  |  |  | 0 | 11 | Remained | 79 |
|  | 80 |  |  |  |  |  |  | 0 | 7 | Remained | 80 |
|  | 81 | 10 |  | 10 |  |  |  | 20 | 10 | Remained | 81 |
|  | 82 |  | 20 |  | 20 | 20 |  | 60 | 7 | Remained | 82 |

TABLE 3

|  |  | Component Concentration in Wire (Mass ppm) | | | | | | | | | | | | | | | |
|---|---|---|---|---|---|---|---|---|---|---|---|---|---|---|---|---|---|
|  |  | First Element Group | | | Second Element Group | | | | | Third Element Group | | | | | | | | |
|  |  | Mg | P | Total | Ag | Pd | Pt | Au | Total | Be | Al | Bi | Si | In | Ge | Ti | V | Total |
| Examples | 83 | 15 |  | 15 |  |  |  |  | 0 |  |  |  |  |  |  |  |  | 0 |
|  | 84 |  | 15 | 15 |  |  |  |  | 0 |  |  |  |  |  |  |  |  | 0 |
|  | 85 | 5 | 10 | 15 |  |  |  |  | 0 |  |  |  |  |  |  |  |  | 0 |
|  | 86 | 10 | 20 | 30 |  | 100 |  |  | 100 |  |  |  |  |  |  |  |  | 0 |
|  | 87 | 40 |  | 40 | 20 |  | 50 | 50 | 120 |  |  |  |  |  |  |  |  | 0 |
|  | 88 | 20 |  | 20 |  |  |  |  | 0 | 20 |  |  |  |  |  |  |  | 20 |
|  | 89 |  | 15 | 15 |  |  |  |  | 0 |  | 10 |  |  |  |  |  |  | 10 |
|  | 90 |  | 20 | 20 |  |  |  |  | 0 |  |  |  | 30 |  |  |  |  | 30 |
|  | 91 | 10 | 10 | 20 |  |  |  |  | 0 |  |  |  |  |  |  | 40 |  | 40 |
|  | 92 |  | 20 | 20 |  |  |  |  | 0 |  |  |  |  |  |  |  | 30 | 30 |
|  | 93 | 10 | 15 | 25 |  |  |  |  | 0 |  | 15 |  | 5 | 20 | 20 |  |  | 60 |
|  | 94 | 5 | 10 | 15 |  |  |  |  | 0 | 10 | 15 |  |  | 10 | 10 |  |  | 45 |
|  | 95 |  | 20 | 20 |  |  |  |  | 0 |  | 20 |  |  |  |  | 20 |  | 40 |

TABLE 3-continued

| # | Mg | P | Total | Ag | Pd | Pt | Au | Total | Be | Al | Bi | Si | In | Ge | Ti | V | Total |
|---|---|---|---|---|---|---|---|---|---|---|---|---|---|---|---|---|---|
| 96 |  | 15 | 15 |  |  |  |  | 0 |  |  |  |  |  |  |  |  | 0 |
| 97 | 30 |  | 30 |  |  |  |  | 0 |  |  |  |  |  |  |  |  | 0 |
| 98 |  | 25 | 25 | 80 |  |  |  | 80 | 10 |  | 15 |  |  |  |  |  | 25 |
| 99 | 5 | 20 | 25 | 10 | 50 | 40 |  | 100 |  | 20 |  |  |  | 20 |  | 20 | 60 |
| 100 |  | 20 | 20 | 30 | 100 |  |  | 130 | 15 |  |  | 25 |  |  | 10 |  | 50 |
| 101 |  | 30 | 30 |  | 20 | 30 |  | 50 |  |  |  |  |  |  |  |  | 0 |
| 102 | 5 | 20 | 25 | 30 | 60 |  |  | 90 |  |  |  |  |  |  |  |  | 0 |
| 103 | 20 |  | 20 | 60 |  | 40 |  | 100 | 10 |  |  |  | 10 | 10 |  |  | 30 |
| 104 | 15 | 15 | 30 |  | 50 | 20 |  | 70 |  | 15 |  |  |  |  | 10 |  | 25 |

| | | Ca | Y | C | La | e | Pr | Nd | Total | O | Cu |
|---|---|---|---|---|---|---|---|---|---|---|---|
| Examples | 83 |  |  |  |  |  |  |  | 0 | 7 | Remained 83 |
| | 84 |  |  |  |  |  |  |  | 0 | 6 | Remained 84 |
| | 85 |  |  |  |  |  |  |  | 0 | 7 | Remained 85 |
| | 86 |  |  |  |  |  |  |  | 0 | 7 | Remained 86 |
| | 87 |  |  |  |  |  |  |  | 0 | 8 | Remained 87 |
| | 88 |  |  |  |  |  |  |  | 0 | 9 | Remained 88 |
| | 89 |  |  |  |  |  |  |  | 0 | 8 | Remained 89 |
| | 90 |  |  |  |  |  |  |  | 0 | 7 | Remained 90 |
| | 91 |  |  |  |  |  |  |  | 0 | 7 | Remained 91 |
| | 92 |  |  |  |  |  |  |  | 0 | 8 | Remained 92 |
| | 93 |  |  |  |  |  |  |  | 0 | 9 | Remained 93 |
| | 94 |  |  |  |  |  |  |  | 0 | 7 | Remained 94 |
| | 95 |  |  |  |  |  |  |  | 0 | 8 | Remained 95 |
| | 96 | 10 |  |  | 10 |  |  | 5 | 25 | 12 | Remained 96 |
| | 97 |  | 10 |  |  | 20 | 15 | 10 | 55 | 10 | Remained 97 |
| | 98 |  |  |  |  |  |  |  | 0 | 8 | Remained 98 |
| | 99 |  |  |  |  |  |  |  | 0 | 11 | Remained 99 |
| | 100 |  |  |  |  |  |  |  | 0 | 9 | Remained 100 |
| | 101 | 10 | 10 |  |  |  |  | 10 | 30 | 7 | Remained 101 |
| | 102 |  |  |  | 20 |  |  | 10 | 30 | 8 | Remained 102 |
| | 103 |  |  |  | 10 | 15 |  |  | 25 | 10 | Remained 103 |
| | 104 | 12 |  |  |  |  | 15 |  | 17 | 12 | Remained 104 |

TABLE 4

| | | Mg | P | Total | Ag | Pd | Pt | Au | Total | Be | Al | Bi | Si | In | Ge | Ti | V | Total |
|---|---|---|---|---|---|---|---|---|---|---|---|---|---|---|---|---|---|---|
| Comparative Examples | 1 | 60 |  | 60 |  |  |  |  | 0 |  |  |  |  |  |  |  |  | 0 |
| | 2 |  | 75 | 75 |  |  |  |  | 0 |  |  |  |  |  |  |  |  | 0 |
| | 3 | 70 |  | 70 |  |  |  |  | 0 |  |  |  |  |  |  |  |  | 0 |
| | 4 |  | 140 | 140 |  |  |  |  | 0 |  |  |  |  |  |  |  |  | 0 |
| | 5 |  |  | 0 |  |  |  |  | 0 |  |  |  |  |  |  |  |  | 0 |
| | 6 |  | 4 | 4 |  |  |  |  | 0 |  |  |  |  |  |  |  |  | 0 |
| | 7 | 5 | 3 | 8 |  |  |  |  | 0 |  |  |  |  |  |  |  |  | 0 |
| | 8 | 740 |  | 740 |  |  |  |  | 0 |  |  |  |  |  |  |  |  | 0 |
| | 9 |  | 820 | 820 |  |  |  |  | 0 |  |  |  |  |  |  |  |  | 0 |
| | 10 | 8 |  | 8 | 50 | 350 |  | 15 | 415 |  |  |  |  |  |  |  |  | 0 |
| | 11 | 40 | 40 | 80 | 1000 |  | 250 |  | 1250 |  |  |  |  |  |  |  |  | 0 |
| | 12 |  | 5 | 5 |  |  |  |  | 0 | 18 |  | 15 | 15 |  | 8 |  |  | 56 |
| | 13 | 115 |  | 115 |  |  |  |  | 0 |  | 25 |  | 10 | 25 |  |  |  | 60 |
| | 14 | 3 | 2 | 5 |  |  |  |  | 0 |  |  |  |  |  |  |  |  | 0 |
| | 15 |  | 58 | 58 |  |  |  |  | 0 |  |  |  |  |  |  |  |  | 0 |
| | 16 | 5 | 3 | 8 | 1250 |  | 340 |  | 1590 | 13 | 34 |  |  |  | 22 |  |  | 69 |
| | 17 |  | 60 | 60 |  | 200 |  | 220 | 420 |  |  |  |  |  |  |  |  | 0 |
| | 18 | 5 | 2 | 7 | 300 | 170 |  |  | 470 |  |  |  | 10 |  | 20 | 15 |  | 45 |

| | | Ca | Y | La | Ce | Pr | Nd | Total | O | Cu |
|---|---|---|---|---|---|---|---|---|---|---|
| Comparative Examples | 1 |  |  |  |  |  |  | 0 | 5 | Remained 1 |
| | 2 |  |  |  |  |  |  | 0 | 2 | Remained 2 |
| | 3 |  |  |  |  |  |  | 0 | 38 | Remained 3 |

TABLE 4-continued

|  |  |  |  |  |  | 0 | 60 | Remained | 4 |
|---|---|---|---|---|---|---|---|---|---|
| 5 |  |  |  |  |  | 0 | 15 | Remained | 5 |
| 6 |  |  |  |  |  | 0 | 12 | Remained | 6 |
| 7 |  |  |  |  |  | 0 | 7 | Remained | 7 |
| 8 |  |  |  |  |  | 0 | 15 | Remained | 8 |
| 9 |  |  |  |  |  | 0 | 12 | Remained | 9 |
| 10 |  |  |  |  |  | 0 | 10 | Remained | 10 |
| 11 |  |  |  |  |  | 0 | 2 | Remained | 11 |
| 12 |  |  |  |  |  | 0 | 9 | Remained | 12 |
| 13 |  |  |  |  |  | 0 | 3 | Remained | 13 |
| 14 | 20 |  | 23 |  | 13 | 56 | 12 | Remained | 14 |
| 15 |  | 20 |  | 18 | 27 | 65 | 2 | Remained | 15 |
| 16 |  |  |  |  |  | 0 | 9 | Remained | 16 |
| 17 |  | 25 | 12 |  | 25 | 62 | 2 | Remained | 17 |
| 18 | 30 |  |  | 20 | 20 | 70 | 9 | Remained | 18 |

TABLE 5

|  |  | Wire Diameter/μm | Tensile Strength/MPa | Elongation/% | Ball Formation | | Ball Joining Shape | | | Successive Ball Joining | Low-Temp. Share Joining Strength |
|---|---|---|---|---|---|---|---|---|---|---|---|
|  |  |  |  |  | Ball Misalignment | Ball Surface | Petal Deformation | Elliptic Deformation | Misaligned Deformation |  |  |
| Examples | 1 | 25 | 211 | 10 | ○ | ⊚ | ○ | ○ | ○ | ⊚ | ○ |
|  | 2 | 25 | 212 | 12 | ○ | ⊚ | ○ | ○ | ○ | ⊚ | ○ |
|  | 3 | 25 | 208 | 13 | ○ | ⊚ | ○ | ○ | ○ | ⊚ | ○ |
|  | 4 | 25 | 212 | 12 | ○ | ⊚ | ○ | ○ | ○ | ⊚ | ○ |
|  | 5 | 50 | 205 | 18 | ○ | ⊚ | ○ | ○ | ○ | ⊚ | ○ |
|  | 6 | 25 | 227 | 12 | ○ | ⊚ | ○ | ○ | ○ | ○ | ○ |
|  | 7 | 25 | 213 | 10 | ○ | ⊚ | ○ | ○ | ○ | ⊚ | ○ |
|  | 8 | 25 | 222 | 9 | ○ | ⊚ | ○ | ○ | ⊚ | ○ | ○ |
|  | 9 | 25 | 212 | 12 | ⊚ | ⊚ | ○ | ○ | ○ | ⊚ | ⊚ |
|  | 10 | 20 | 228 | 8 | ⊚ | ⊚ | ○ | ○ | ○ | ⊚ | ⊚ |
|  | 11 | 25 | 221 | 13 | ⊚ | ⊚ | ○ | ○ | ○ | ⊚ | ⊚ |
|  | 12 | 25 | 205 | 12 | ⊚ | ⊚ | ○ | ○ | ○ | ⊚ | ⊚ |
|  | 13 | 75 | 215 | 23 | ⊚ | ⊚ | ○ | ○ | ○ | ⊚ | ⊚ |
|  | 14 | 25 | 228 | 11 | ⊚ | ⊚ | ○ | ○ | ○ | ⊚ | ⊚ |
|  | 15 | 25 | 212 | 12 | ⊚ | ⊚ | ○ | ○ | ○ | ⊚ | ⊚ |
|  | 16 | 25 | 220 | 13 | ⊚ | ⊚ | ○ | ○ | ○ | ⊚ | ⊚ |
|  | 17 | 25 | 215 | 12 | ⊚ | ⊚ | ○ | ○ | ○ | ○ | ⊚ |
|  | 18 | 25 | 223 | 12 | ⊚ | ⊚ | ○ | ○ | ○ | ⊚ | ⊚ |
|  | 19 | 25 | 212 | 12 | ⊚ | ⊚ | ○ | ○ | ○ | ⊚ | ⊚ |
|  | 20 | 25 | 214 | 14 | ⊚ | ⊚ | ○ | ○ | ○ | ⊚ | ⊚ |
|  | 21 | 25 | 201 | 12 | ○ | ⊚ | ○ | ○ | ○ | ⊚ | ○ |
|  | 22 | 25 | 203 | 13 | ○ | ⊚ | ○ | ○ | ○ | ⊚ | ○ |
|  | 23 | 25 | 222 | 11 | ○ | ⊚ | ○ | ○ | ○ | Δ | ○ |
|  | 24 | 25 | 255 | 12 | ○ | ⊚ | ⊚ | ○ | ○ | ⊚ | ○ |
|  | 25 | 25 | 262 | 11 | ○ | ⊚ | ⊚ | ○ | ○ | ⊚ | ○ |
|  | 26 | 25 | 253 | 13 | ○ | ⊚ | ⊚ | ○ | ○ | ⊚ | ○ |
|  | 27 | 25 | 272 | 9 | ○ | ⊚ | ⊚ | ○ | ○ | ⊚ | ○ |
|  | 28 | 25 | 265 | 12 | ○ | ⊚ | ⊚ | ○ | ○ | ⊚ | ○ |
|  | 29 | 25 | 257 | 12 | ○ | ⊚ | ⊚ | ○ | ○ | ⊚ | ○ |
|  | 30 | 25 | 262 | 11 | ○ | ⊚ | ⊚ | ○ | ○ | ⊚ | ○ |
|  | 31 | 25 | 252 | 13 | ○ | ⊚ | ⊚ | ○ | ○ | ⊚ | ○ |
|  | 32 | 50 | 253 | 17 | ○ | ⊚ | ⊚ | ○ | ○ | ⊚ | ○ |
|  | 33 | 25 | 259 | 10 | ○ | ○ | ⊚ | ○ | ○ | ○ | ○ |
|  | 34 | 25 | 264 | 9 | ○ | ⊚ | ⊚ | ○ | ○ | ⊚ | ○ |
|  | 35 | 15 | 268 | 7 | ○ | ⊚ | ⊚ | ○ | ○ | ⊚ | ○ |
|  | 36 | 25 | 258 | 12 | ○ | ⊚ | ⊚ | ○ | ○ | ⊚ | ○ |
|  | 37 | 25 | 260 | 10 | ○ | ⊚ | ⊚ | ○ | ○ | ⊚ | ○ |
|  | 38 | 25 | 257 | 11 | ○ | ⊚ | ⊚ | ○ | ○ | ⊚ | ○ |
|  | 39 | 25 | 261 | 12 | ○ | ⊚ | ⊚ | ○ | ○ | ⊚ | ○ |
|  | 40 | 25 | 256 | 13 | ○ | ⊚ | ⊚ | ○ | ○ | ⊚ | ○ |
|  | 41 | 25 | 257 | 12 | ○ | ⊚ | ⊚ | ○ | ○ | ⊚ | ○ |
|  | 42 | 25 | 225 | 10 | ○ | ⊚ | ○ | ○ | ○ | ⊚ | ○ |

TABLE 5-continued

| | | | | | | | | | | |
|---|---|---|---|---|---|---|---|---|---|---|
| 43 | 25 | 227 | 9 | ○ | ◎ | ○ | ○ | ○ | ◎ | ○ |
| 44 | 25 | 263 | 13 | ○ | ○ | ○ | ○ | ○ | △ | ○ |

| | | Chip Damage | Wirearity | Loop Control Height Stability | | Low-Height Loop Characteristic | Neck Portion Pull Strength | Within 3 days After Manufactured | | 30 days After Manufactured Wedge Joining Characteristic | |
|---|---|---|---|---|---|---|---|---|---|---|---|
| | | | | 200 μm | 350 μm | | | Wedge Joining Characteristic | Low-Temp. Joining Peel Strength | | |
| Examples | 1 | ◎ | ○ | ◎ | ○ | ○ | ◎ | ◎ | ○ | ○ | 1 |
| | 2 | ◎ | ○ | ◎ | ○ | ○ | ◎ | ◎ | ○ | ○ | 2 |
| | 3 | ◎ | ○ | ◎ | ○ | ○ | ◎ | ◎ | ○ | ○ | 3 |
| | 4 | ◎ | ○ | ◎ | ○ | ○ | ◎ | ◎ | ○ | ○ | 4 |
| | 5 | ◎ | ○ | ◎ | ○ | ○ | ◎ | ◎ | ○ | ○ | 5 |
| | 6 | ◎ | ○ | ◎ | ○ | ○ | ◎ | ◎ | ○ | ○ | 6 |
| | 7 | ◎ | ○ | ◎ | ○ | ○ | ◎ | ◎ | ○ | ○ | 7 |
| | 8 | ◎ | ○ | ◎ | ○ | ○ | ◎ | ◎ | ○ | ○ | 8 |
| | 9 | ◎ | ○ | ◎ | ○ | ○ | ◎ | ◎ | ○ | ○ | 9 |
| | 10 | ◎ | ○ | ◎ | ○ | ○ | ◎ | ◎ | ○ | ○ | 10 |
| | 11 | ◎ | ○ | ◎ | ○ | ○ | ◎ | ◎ | ○ | ○ | 11 |
| | 12 | ◎ | ○ | ◎ | ○ | ○ | ◎ | ◎ | ○ | ○ | 12 |
| | 13 | ◎ | ○ | ◎ | ○ | ○ | ◎ | ◎ | ○ | ○ | 13 |
| | 14 | ◎ | ○ | ◎ | ○ | ○ | ◎ | ◎ | ○ | ○ | 14 |
| | 15 | ◎ | ○ | ◎ | ○ | ○ | ◎ | ◎ | ○ | ○ | 15 |
| | 16 | ◎ | ○ | ◎ | ○ | ○ | ◎ | ◎ | ○ | ○ | 16 |
| | 17 | ◎ | ○ | ◎ | ○ | ○ | ◎ | ◎ | ○ | ○ | 17 |
| | 18 | ◎ | ○ | ◎ | ○ | ○ | ◎ | ◎ | ○ | ○ | 18 |
| | 19 | ◎ | ○ | ◎ | ○ | ○ | ◎ | ◎ | ○ | ○ | 19 |
| | 20 | ◎ | ○ | ◎ | ○ | ○ | ◎ | ◎ | ○ | ○ | 20 |
| | 21 | ◎ | ○ | ◎ | ○ | ○ | ◎ | ◎ | ○ | ○ | 21 |
| | 22 | ◎ | ○ | ◎ | ○ | ○ | ◎ | ◎ | ○ | ○ | 22 |
| | 23 | △ | ○ | ◎ | ○ | ○ | ◎ | ◎ | ○ | ○ | 23 |
| | 24 | ○ | ○ | ◎ | ○ | ○ | ◎ | ◎ | ◎ | ○ | 24 |
| | 25 | ○ | ○ | ◎ | ○ | ○ | ◎ | ◎ | ◎ | ○ | 25 |
| | 26 | ○ | ○ | ◎ | ○ | ○ | ◎ | ◎ | ○ | ○ | 26 |
| | 27 | ○ | ○ | ◎ | ○ | ○ | ◎ | ◎ | ◎ | ○ | 27 |
| | 28 | ○ | ○ | ◎ | ○ | ○ | ◎ | ◎ | ○ | ○ | 28 |
| | 29 | ○ | ○ | ◎ | ○ | ○ | ◎ | ◎ | ◎ | ○ | 29 |
| | 30 | ○ | ○ | ◎ | ○ | ○ | ◎ | ◎ | ◎ | ○ | 30 |
| | 31 | ○ | ○ | ◎ | ○ | ○ | ◎ | ◎ | ◎ | ○ | 31 |
| | 32 | ○ | ○ | ◎ | ○ | ○ | ◎ | ◎ | ◎ | ○ | 32 |
| | 33 | ○ | ○ | ◎ | ○ | ○ | ◎ | ○ | ○ | ○ | 33 |
| | 34 | ○ | ○ | ◎ | ○ | ○ | ◎ | ◎ | ◎ | ○ | 34 |
| | 35 | ○ | ○ | ◎ | ○ | ○ | ◎ | ◎ | ○ | ○ | 35 |
| | 36 | ○ | ○ | ◎ | ○ | ○ | ◎ | ○ | ○ | ○ | 36 |
| | 37 | ○ | ○ | ◎ | ○ | ○ | ◎ | ◎ | ◎ | ○ | 37 |
| | 38 | ○ | ○ | ◎ | ○ | ○ | ◎ | ◎ | ○ | ○ | 38 |
| | 39 | ○ | ○ | ◎ | ○ | ○ | ◎ | ◎ | ◎ | ○ | 39 |
| | 40 | ○ | ○ | ◎ | ○ | ○ | ◎ | ◎ | ◎ | ○ | 40 |
| | 41 | ○ | ○ | ◎ | ○ | ○ | ◎ | ◎ | ○ | ○ | 41 |
| | 42 | ○ | ○ | ◎ | ○ | ○ | ◎ | ◎ | ○ | ○ | 42 |
| | 43 | ○ | ○ | ◎ | ○ | ○ | ◎ | ◎ | ○ | ○ | 43 |
| | 44 | △ | ○ | ◎ | ○ | ○ | ◎ | ○ | △ | ○ | 44 |

TABLE 6

| | | Wire Diameter/ μm | Tensile Strength/ MPa | Elongation/% | Ball Formation | | Ball Joining Shape | | | | Low-Temp. Share Joining Strength |
|---|---|---|---|---|---|---|---|---|---|---|---|
| | | | | | Ball Misalignment | Ball Surface | Petal Deformation | Elliptic Deformation | Misaligned Deformation | Successive Ball Joining | |
| Examples | 45 | 25 | 207 | 12 | ○ | ◎ | ○ | ◎ | ○ | ◎ | ○ |
| | 46 | 30 | 215 | 15 | ○ | ◎ | ○ | ◎ | ○ | ◎ | ○ |
| | 47 | 25 | 220 | 12 | ○ | ◎ | ○ | ◎ | ○ | ◎ | ○ |
| | 48 | 25 | 208 | 13 | ○ | ◎ | ○ | ◎ | ○ | ◎ | ○ |
| | 49 | 25 | 216 | 11 | ○ | ◎ | ○ | ◎ | ○ | ◎ | ○ |
| | 50 | 25 | 206 | 10 | ○ | ◎ | ○ | ◎ | ○ | ◎ | ○ |
| | 51 | 25 | 217 | 12 | ○ | ◎ | ○ | ◎ | ○ | ◎ | ○ |
| | 52 | 25 | 210 | 12 | ○ | ◎ | ○ | ◎ | ○ | ◎ | ○ |
| | 53 | 25 | 219 | 11 | ○ | ◎ | ○ | ◎ | ○ | ◎ | ○ |
| | 54 | 25 | 209 | 12 | ○ | ◎ | ○ | ◎ | ○ | ◎ | ○ |
| | 55 | 25 | 217 | 13 | ○ | ◎ | ○ | ◎ | ○ | ○ | ○ |

TABLE 6-continued

| | | | | | | | | | | |
|---|---|---|---|---|---|---|---|---|---|---|
| 56 | 25 | 211 | 12 | ○ | ⊚ | ○ | ⊚ | ○ | ⊚ | ○ |
| 57 | 25 | 222 | 10 | ○ | ⊚ | ○ | ⊚ | ○ | ⊚ | ○ |
| 58 | 25 | 213 | 12 | ○ | ⊚ | ○ | ⊚ | ○ | ⊚ | ○ |
| 59 | 25 | 220 | 11 | ○ | ⊚ | ○ | ⊚ | ○ | ⊚ | ○ |
| 60 | 25 | 215 | 12 | ○ | ⊚ | ○ | ⊚ | ○ | ⊚ | ○ |
| 61 | 25 | 210 | 13 | ○ | ⊚ | ○ | ○ | ○ | ⊚ | ○ |
| 62 | 25 | 217 | 10 | ○ | ⊚ | ○ | ○ | ○ | ⊚ | ○ |
| 63 | 25 | 227 | 12 | ○ | Δ | ○ | ○ | ○ | Δ | ○ |
| 64 | 25 | 264 | 12 | ⊚ | ⊚ | ⊚ | ⊚ | ⊚ | ⊚ | ⊚ |
| 65 | 25 | 268 | 12 | ⊚ | ⊚ | ⊚ | ○ | ⊚ | ⊚ | ⊚ |
| 66 | 25 | 274 | 12 | ⊚ | ⊚ | ⊚ | ○ | ⊚ | ⊚ | ⊚ |
| 67 | 25 | 222 | 13 | ⊚ | ⊚ | ⊚ | ⊚ | ⊚ | ⊚ | ⊚ |
| 68 | 25 | 226 | 12 | ⊚ | ⊚ | ⊚ | ⊚ | ⊚ | ⊚ | ⊚ |
| 69 | 25 | 227 | 11 | ⊚ | ⊚ | ⊚ | ○ | ⊚ | ⊚ | ⊚ |
| 70 | 25 | 263 | 12 | ⊚ | ⊚ | ⊚ | ⊚ | ⊚ | ⊚ | ⊚ |
| 71 | 25 | 267 | 11 | ⊚ | ⊚ | ⊚ | ⊚ | ⊚ | ⊚ | ⊚ |
| 72 | 25 | 266 | 12 | ⊚ | ⊚ | ⊚ | ⊚ | ⊚ | ⊚ | ⊚ |
| 73 | 20 | 263 | 8 | ○ | ⊚ | ⊚ | ○ | ○ | ⊚ | ○ |
| 74 | 50 | 273 | 12 | ○ | ⊚ | ⊚ | ○ | ○ | ○ | ○ |
| 75 | 25 | 256 | 7 | ○ | ⊚ | ⊚ | ○ | ○ | ⊚ | ○ |
| 76 | 20 | 258 | 7 | ○ | ⊚ | ⊚ | ○ | ○ | ⊚ | ○ |
| 77 | 20 | 262 | 6 | ○ | ⊚ | ⊚ | ○ | ○ | ⊚ | ○ |
| 78 | 18 | 260 | 6 | ○ | ⊚ | ⊚ | ○ | ○ | ⊚ | ○ |
| 79 | 25 | 255 | 10 | ⊚ | ⊚ | ⊚ | ○ | ⊚ | ⊚ | ○ |
| 80 | 22 | 264 | 8 | ⊚ | ⊚ | ⊚ | ○ | ⊚ | ⊚ | ⊚ |
| 81 | 20 | 263 | 7 | ⊚ | ⊚ | ⊚ | ⊚ | ⊚ | ⊚ | ⊚ |
| 82 | 15 | 258 | 5 | ⊚ | ⊚ | ⊚ | ⊚ | ⊚ | ⊚ | ⊚ |

| | | | Loop Control | | Low-Height | Neck Portion | Within 3 days After Manufactured | | 30 days After Manufactured | |
|---|---|---|---|---|---|---|---|---|---|---|
| | | | Height Stability | | Loop | Pull | Wedge Joining | Low-Temp. Joining | Wedge Joining | |
| | | Chip Damage | Wirearity | 200 μm | 350 μm | Characteristic | Strength | Characteristic | Peel Strength | Characteristic | |
| Examples | 45 | ⊚ | ○ | ⊚ | ○ | ⊚ | ⊚ | ⊚ | ⊚ | ○ | 45 |
| | 46 | ⊚ | ○ | ⊚ | ○ | ⊚ | ⊚ | ⊚ | ⊚ | ○ | 46 |
| | 47 | ⊚ | ○ | ⊚ | ○ | ⊚ | ⊚ | ⊚ | ○ | ○ | 47 |
| | 48 | ⊚ | ○ | ⊚ | ○ | ⊚ | ⊚ | ⊚ | ⊚ | ○ | 48 |
| | 49 | ⊚ | ○ | ⊚ | ○ | ⊚ | ⊚ | ⊚ | ○ | ○ | 49 |
| | 50 | ⊚ | ○ | ⊚ | ○ | ⊚ | ⊚ | ⊚ | ⊚ | ○ | 50 |
| | 51 | ⊚ | ○ | ⊚ | ○ | ⊚ | ⊚ | ⊚ | ○ | ○ | 51 |
| | 52 | ⊚ | ○ | ⊚ | ○ | ⊚ | ⊚ | ⊚ | ⊚ | ○ | 52 |
| | 53 | ⊚ | ○ | ⊚ | ○ | ⊚ | ⊚ | ⊚ | ○ | ○ | 53 |
| | 54 | ⊚ | ○ | ⊚ | ○ | ⊚ | ⊚ | ⊚ | ⊚ | ○ | 54 |
| | 55 | ⊚ | ○ | ⊚ | ○ | ⊚ | ⊚ | ⊚ | ○ | ○ | 55 |
| | 56 | ⊚ | ○ | ⊚ | ○ | ⊚ | ⊚ | ⊚ | ⊚ | ○ | 56 |
| | 57 | ⊚ | ○ | ⊚ | ○ | ⊚ | ⊚ | ⊚ | ⊚ | ○ | 57 |
| | 58 | ⊚ | ○ | ⊚ | ○ | ⊚ | ⊚ | ⊚ | ⊚ | ○ | 58 |
| | 59 | ⊚ | ○ | ⊚ | ○ | ⊚ | ⊚ | ⊚ | ⊚ | ○ | 59 |
| | 60 | ⊚ | ○ | ⊚ | ○ | ⊚ | ⊚ | ⊚ | ⊚ | ○ | 60 |
| | 61 | ⊚ | ○ | ⊚ | ○ | ⊚ | ○ | ⊚ | ⊚ | ○ | 61 |
| | 62 | ⊚ | ○ | ⊚ | ○ | ⊚ | ⊚ | ⊚ | ⊚ | ○ | 62 |
| | 63 | Δ | ○ | ⊚ | ○ | ⊚ | ⊚ | ○ | Δ | ○ | 63 |
| | 64 | ⊚ | ⊚ | ⊚ | ○ | ⊚ | ⊚ | ⊚ | ⊚ | ○ | 64 |
| | 65 | ⊚ | ⊚ | ⊚ | ○ | ○ | ⊚ | ⊚ | ⊚ | ○ | 65 |
| | 66 | ⊚ | ⊚ | ⊚ | ○ | ○ | ⊚ | ⊚ | ⊚ | ○ | 66 |
| | 67 | ⊚ | ⊚ | ⊚ | ⊚ | ⊚ | ⊚ | ⊚ | ⊚ | ○ | 67 |
| | 68 | ⊚ | ⊚ | ⊚ | ⊚ | ⊚ | ⊚ | ⊚ | ⊚ | ○ | 68 |
| | 69 | ⊚ | ⊚ | ⊚ | ⊚ | ⊚ | ⊚ | ⊚ | ⊚ | ○ | 69 |
| | 70 | ⊚ | ⊚ | ⊚ | ⊚ | ⊚ | ⊚ | ⊚ | ⊚ | ○ | 70 |
| | 71 | ⊚ | ⊚ | ⊚ | ⊚ | ⊚ | ⊚ | ⊚ | ⊚ | ○ | 71 |
| | 72 | ⊚ | ⊚ | ⊚ | ⊚ | ⊚ | ⊚ | ⊚ | ⊚ | ○ | 72 |
| | 73 | ⊚ | ○ | ⊚ | ○ | ○ | ⊚ | ⊚ | ⊚ | ○ | 73 |
| | 74 | ⊚ | ○ | ⊚ | ○ | ○ | ○ | ○ | ○ | ○ | 74 |
| | 75 | ⊚ | ○ | ⊚ | ○ | ○ | ⊚ | ⊚ | ⊚ | ○ | 75 |
| | 76 | ⊚ | ○ | ⊚ | ○ | ○ | ⊚ | ⊚ | ⊚ | ○ | 76 |
| | 77 | ⊚ | ○ | ⊚ | ○ | ○ | ⊚ | ⊚ | ⊚ | ○ | 77 |
| | 78 | ⊚ | ○ | ⊚ | ○ | ○ | ⊚ | ⊚ | ⊚ | ○ | 78 |
| | 79 | ⊚ | ○ | ⊚ | ○ | ○ | ⊚ | ⊚ | ⊚ | ○ | 79 |
| | 80 | ⊚ | ⊚ | ⊚ | ○ | ○ | ⊚ | ⊚ | ⊚ | ○ | 80 |
| | 81 | ⊚ | ⊚ | ⊚ | ⊚ | ○ | ⊚ | ⊚ | ⊚ | ○ | 81 |
| | 82 | ⊚ | ⊚ | ⊚ | ⊚ | ⊚ | ⊚ | ⊚ | ⊚ | ○ | 82 |

TABLE 7

| | | Wire Diameter/μm | Tensile Strength/MPa | Elongation/% | Ball Formation | | Ball Joining Shape | | | Successive Ball Joining | Low-Temp. Share Joining Strength |
|---|---|---|---|---|---|---|---|---|---|---|---|
| | | | | | Ball Misalignment | Ball Surface | Petal Deformation | Elliptic Deformation | Misaligned Deformation | | |
| Examples | 83 | 25 | 212 | 4 | ○ | ◎ | ○ | ○ | ○ | ◎ | ○ |
| | 84 | 23 | 215 | 7 | ○ | ◎ | ○ | ○ | ○ | ◎ | ○ |
| | 85 | 25 | 221 | 6 | ○ | ◎ | ○ | ○ | ○ | ◎ | ○ |
| | 86 | 25 | 217 | 7 | ◎ | ◎ | ○ | ○ | ◎ | ◎ | ◎ |
| | 87 | 25 | 220 | 6 | ◎ | ◎ | ○ | ○ | ◎ | ◎ | ◎ |
| | 88 | 25 | 253 | 7 | ○ | ◎ | ◎ | ○ | ○ | ◎ | ○ |
| | 89 | 50 | 252 | 10 | ○ | ◎ | ◎ | ○ | ○ | ◎ | ○ |
| | 90 | 22 | 255 | 8 | ○ | ◎ | ◎ | ○ | ○ | ◎ | ○ |
| | 91 | 25 | 254 | 6 | ○ | ◎ | ◎ | ○ | ○ | ◎ | ○ |
| | 92 | 25 | 253 | 7 | ○ | ◎ | ◎ | ○ | ○ | ◎ | ○ |
| | 93 | 25 | 265 | 5 | ○ | ◎ | ◎ | ○ | ○ | ◎ | ○ |
| | 94 | 25 | 261 | 9 | ○ | ◎ | ◎ | ○ | ○ | ◎ | ○ |
| | 95 | 25 | 257 | 4 | ○ | ◎ | ◎ | ○ | ○ | ◎ | ○ |
| | 96 | 25 | 221 | 7 | ○ | ◎ | ○ | ◎ | ○ | ◎ | ○ |
| | 97 | 25 | 224 | 6 | ○ | ◎ | ○ | ◎ | ○ | ◎ | ○ |
| | 98 | 20 | 262 | 5 | ◎ | ◎ | ◎ | ○ | ◎ | ◎ | ◎ |
| | 99 | 25 | 263 | 5 | ◎ | ◎ | ◎ | ○ | ◎ | ◎ | ◎ |
| | 100 | 25 | 263 | 6 | ◎ | ◎ | ◎ | ○ | ◎ | ◎ | ◎ |
| | 101 | 30 | 223 | 8 | ◎ | ◎ | ○ | ◎ | ◎ | ◎ | ◎ |
| | 102 | 25 | 225 | 8 | ◎ | ◎ | ○ | ◎ | ◎ | ◎ | ◎ |
| | 103 | 25 | 257 | 7 | ◎ | ◎ | ◎ | ◎ | ◎ | ◎ | ◎ |
| | 104 | 25 | 253 | 8 | ◎ | ◎ | ◎ | ◎ | ◎ | ◎ | ◎ |

| | | Chip Damage | Loop Control | | | Low-Height Loop Characteristic | Neck Portion Pull Strength | Within 3 days After Manufactured Wedge Joining Characteristic | Low-Temp. Joining Peel Strength | 30 days After Manufactured Wedge Joining Characteristic | |
|---|---|---|---|---|---|---|---|---|---|---|---|
| | | | Wirearity | Height Stability 200 μm | 350 μm | | | | | | |
| Examples | 83 | ◎ | ○ | ○ | ○ | ○ | ○ | ◎ | ○ | ○ | 83 |
| | 84 | ◎ | ○ | ○ | ○ | ○ | ○ | ◎ | ○ | ○ | 84 |
| | 85 | ◎ | ○ | ○ | ○ | ○ | ○ | ◎ | ○ | ○ | 85 |
| | 86 | ◎ | ○ | ○ | ○ | ○ | ○ | ◎ | ○ | ○ | 86 |
| | 87 | ◎ | ○ | ○ | ○ | ○ | ○ | ◎ | ○ | ○ | 87 |
| | 88 | ◎ | ○ | ○ | ○ | ○ | ○ | ◎ | ◎ | ○ | 88 |
| | 89 | ◎ | ○ | ○ | ○ | ○ | ○ | ◎ | ◎ | ○ | 89 |
| | 90 | ◎ | ○ | ○ | ○ | ○ | ○ | ◎ | ◎ | ○ | 90 |
| | 91 | ◎ | ○ | ○ | ○ | ○ | ○ | ◎ | ◎ | ○ | 91 |
| | 92 | ◎ | ○ | ○ | ○ | ○ | ○ | ◎ | ◎ | ○ | 92 |
| | 93 | ◎ | ○ | ○ | ○ | ○ | ○ | ◎ | ◎ | ○ | 93 |
| | 94 | ◎ | ○ | ○ | ○ | ○ | ○ | ◎ | ◎ | ○ | 94 |
| | 95 | ◎ | ○ | ○ | ○ | ○ | ○ | ◎ | ◎ | ○ | 95 |
| | 96 | ◎ | ○ | ○ | ○ | ◎ | ○ | ◎ | ◎ | ○ | 96 |
| | 97 | ◎ | ○ | ○ | ○ | ◎ | ○ | ◎ | ◎ | ○ | 97 |
| | 98 | ◎ | ◎ | ○ | ○ | ○ | ○ | ◎ | ◎ | ○ | 98 |
| | 99 | ◎ | ◎ | ○ | ○ | ○ | ○ | ◎ | ◎ | ○ | 99 |
| | 100 | ◎ | ◎ | ○ | ○ | ○ | ○ | ◎ | ◎ | ○ | 100 |
| | 101 | ◎ | ◎ | ○ | ◎ | ◎ | ○ | ◎ | ◎ | ○ | 101 |
| | 102 | ◎ | ◎ | ○ | ◎ | ◎ | ○ | ◎ | ◎ | ○ | 102 |
| | 103 | ◎ | ◎ | ○ | ◎ | ◎ | ○ | ◎ | ◎ | ○ | 103 |
| | 104 | ◎ | ◎ | ○ | ◎ | ◎ | ○ | ◎ | ◎ | ○ | 104 |

TABLE 8

| | | Wire Diameter/μm | Tensile Strength/MPa | Elongation/% | Ball Formation | | Ball Joining Shape | | | Successive Ball Joining | Low-Temp. Share Joining Strength |
|---|---|---|---|---|---|---|---|---|---|---|---|
| | | | | | Ball Misalignment | Ball Surface | Petal Deformation | Elliptic Deformation | Misaligned Deformation | | |
| Comparative Examples | 1 | 25 | 205 | 9 | △ | ◎ | X | X | X | ◎ | ○ |
| | 2 | 25 | 208 | 11 | △ | ◎ | X | X | X | ◎ | ○ |
| | 3 | 25 | 209 | 12 | △ | ○ | △ | △ | △ | ○ | X |
| | 4 | 25 | 212 | 11 | △ | ○ | △ | △ | △ | ○ | X |
| | 5 | 50 | 195 | 16 | △ | ◎ | X | X | X | ◎ | ○ |
| | 6 | 25 | 206 | 11 | △ | ◎ | X | X | X | ◎ | ○ |

TABLE 8-continued

| 7 | 25 | 208 | 12 | △ | ◎ | X | X | X | ◎ | ○ |
| 8 | 25 | 223 | 12 | △ | △ | X | X | X | ○ | △ |
| 9 | 25 | 221 | 12 | △ | △ | X | X | X | ○ | △ |
| 10 | 25 | 214 | 13 | ○ | ◎ | X | X | △ | ◎ | ○ |
| 11 | 25 | 217 | 12 | ○ | ◎ | △ | △ | △ | ◎ | ○ |
| 12 | 25 | 228 | 11 | △ | ◎ | X | X | X | ◎ | ○ |
| 13 | 25 | 227 | 12 | △ | ◎ | △ | △ | △ | ◎ | ○ |
| 14 | 25 | 213 | 13 | △ | ◎ | X | X | X | ◎ | ○ |
| 15 | 25 | 218 | 12 | △ | ◎ | △ | △ | △ | ◎ | ○ |
| 16 | 25 | 224 | 11 | ○ | ◎ | X | X | X | ◎ | ○ |
| 17 | 25 | 217 | 12 | ○ | ◎ | △ | △ | △ | ◎ | ○ |
| 18 | 25 | 223 | 10 | ○ | ◎ | X | X | X | ◎ | ○ |

| | | | Loop Control | | | Low-Height | Neck Portion Pull | Within 3 days After Manufactured | | 30 days After Manufactured | |
| | | Chip Damage | Wirearity | Height Stability 200 μm | 350 μm | Loop Characteristic | Strength | Wedge Joining Characteristic | Low-Temp. Joining Peel Strength | Wedge Joining Characteristic | |
|---|---|---|---|---|---|---|---|---|---|---|---|
| Comparative Examples | 1 | ○ | △ | X | X | △ | △ | ◎ | ○ | X | 1 |
| | 2 | ○ | △ | X | X | △ | △ | ◎ | ○ | X | 2 |
| | 3 | X | △ | X | X | X | △ | ◎ | ○ | X | 3 |
| | 4 | X | △ | X | X | X | △ | ◎ | ○ | X | 4 |
| | 5 | ◎ | X | X | X | X | △ | ◎ | ○ | △ | 5 |
| | 6 | ◎ | X | X | X | X | △ | ◎ | ○ | △ | 6 |
| | 7 | ◎ | △ | X | X | X | △ | ◎ | ○ | △ | 7 |
| | 8 | X | △ | X | X | △ | △ | ○ | ○ | △ | 8 |
| | 9 | X | △ | X | X | △ | △ | ○ | ○ | △ | 9 |
| | 10 | ◎ | X | X | X | △ | △ | ◎ | ○ | △ | 10 |
| | 11 | ◎ | △ | X | X | △ | △ | ◎ | ○ | X | 11 |
| | 12 | ◎ | △ | X | X | △ | △ | ◎ | ○ | △ | 12 |
| | 13 | ◎ | △ | X | X | △ | △ | ◎ | ○ | X | 13 |
| | 14 | ◎ | X | △ | △ | ○ | △ | ◎ | ○ | △ | 14 |
| | 15 | ◎ | △ | △ | △ | ○ | △ | ◎ | ○ | X | 15 |
| | 16 | ◎ | △ | X | X | X | △ | ◎ | ○ | △ | 16 |
| | 17 | ◎ | X | △ | △ | ○ | △ | ◎ | ○ | X | 17 |
| | 18 | ◎ | △ | △ | △ | △ | △ | ◎ | ○ | △ | 18 |

Regarding representative examples of respective claims, evaluation results will be partially explained.

For the copper-alloy bonding wires of the examples 1 to 104, it was confirmed that a ball joining shape was substantially good, and the wedge joining characteristic after a wire was stocked for a long period (thirty days after manufactured) was also good by containing Mg and P (first element group) in total of 10 to 700 mass ppm, and oxygen within a range from 6 to 30 mass ppm, according to the invention. In contrast, for the comparative examples 1 to 18, at least either concentration of Mg and P or oxygen concentration did not satisfy the condition of claim 1, sufficient characteristics were not achieved for all of petal deformation, elliptic deformation, and misalignment of a ball joining shape, and a wedge joining characteristic after storing was reduced.

For the copper-alloy bonding wires of the examples 1 to 82, it resulted in stabilization of a loop shape having a target loop height of 200 μm, and enhancement of a neck pull strength in addition to improvement on a ball joining shape in comparison with the examples 83 to 104 which did not satisfy some conditions by containing Mg and P (first element group) in total of 45 to 700 mass ppm, and oxygen within a range from 6 to 30 mass ppm, according to the invention.

For the copper-alloy bonding wires of the examples 9 to 20, 64 to 72, 79 to 82, 86, 87, 98 to 104, it was confirmed that the low-temperature shear joining strength was high and an effect of suppressing misalignment deformation was high in addition to improvement of ball joining shape by containing Mg and P (first element group) in total of 10 to 700 mass ppm, Ag, Pd, Pt and Au (second element group) in total of 10 to 5000 mass ppm, and oxygen within a range from 6 to 30 mass ppm, according to the invention. In contrast, for the examples 21, 22, the concentration of the second element group was lower than the foregoing range, increment of a low-temperature shear joining strength was insufficient. For the example 23, because the concentration of the second element group was higher than the foregoing range, there was a tendency such that chip damaging increased. For the comparative examples 10, 11, even though the second element group was contained, the concentration of Mg and P (first element group) or oxygen concentration were not in an appropriate range, no improvement of a ball joining shape or the low-temperature shear joining strength was observed.

For the copper-alloy bonding wires of the examples 24 to 41, 64 to 66, 70 to 82, 88 to 95, 98 to 100, 103, and 104, it was confirmed that a tensile strength was high, and an effect of suppressing petal deformation was high in addition to improvement on a ball joining shape by containing Mg and P (first element group) in total of 10 to 700 mass ppm, Be, Al, Bi, Si, In, Ge, Ti, and V (third element group) in total of 6 to 300 mass ppm, and oxygen within a range from 6 to 30 mass ppm according to the invention. In contrast, for the examples 42, 43, the concentration of the third element group was lower than the foregoing range, and increment of a tensile strength was insufficient. For the example 44, because the concentration of the third element group was higher than the foregoing range, there was a tendency such that chip damaging increased. For the comparative examples 12, 13, even though the third element group was contained, the concentration of Mg and P (first element group) or oxygen concentration was not within an appropriate range, no improvement on a ball joining shape or the tensile strength was observed.

For the copper-alloy bonding wires of the examples 45 to 60, 67 to 72, 81, 82, 96, 97, and 101 to 104, it was confirmed that the bonding wires were useful for low-height looping, and the effect of suppressing elliptic deformation was high, in addition to improvement on a ball joining shape, by containing Mg and P (first element group) in total of 10 to 700 mass ppm, Ca, Y, La, Ce, Pr and Nd (fourth element group) in total of 5 to 300 mass ppm, and oxygen within a range from 6 to 30 mass ppm according to the invention. In contrast, for the examples 61, 62, the concentration of the fourth element group was lower than the foregoing range, resulting in an insufficient low-height looping characteristic, and for the example 63, the concentration of the fourth element group was higher than the foregoing range, there was a tendency such that chip damaging increased. For the comparative examples 14, 15, even though the fourth element group was contained, the concentration of Mg and P (first element group) or the oxygen concentration was not within an appropriate range, no improvements on a ball joining shape and the low-height looping characteristic were observed.

For the copper-alloy bonding wires of the examples 64 to 66, 70 to 72, 79 to 82, 98 to 100, 103 and 104, it was confirmed that the linearity in a long span was improved in addition to improvement on a ball joining shape by containing Mg and P (first element group) in total of 10 to 700 mass ppm, Ag, Pd, Pt and Au (second element group) in total of 10 to 5000 mass ppm, Be, Al, Bi, Si, In, Ge, Ti and V (third element group) in total of 6 to 300 mass ppm, and oxygen within a range from 6 to 30 mass ppm according to the invention. On the other hand, for the comparative example 16, even though the second and third element groups were contained, the concentration of Mg and P (first element group) was not in an appropriate range, no improvement on a ball joining shape, the linearity, and the like was observed.

For the copper-alloy bonding wires of the examples 67 to 72, 81, 82, 101 to 104, it was confirmed that the stability of loop heights having different heights were improved in addition to improvement on a ball joining shape by containing Mg and P (first element group) in total of 10 to 700 mass ppm, Ag, Pd, Pt and Au (second element group) in total of 10 to 5000 mass ppm, Ca, Y, La, Ce, Pr and Nd (fourth element group) in total of 5 to 300 mass ppm, and oxygen within a range from 6 to 30 mass ppm according to the invention. In contrast, for the comparative example 17, even though the second and fourth element groups were contained, the oxygen concentration was not in an appropriate range, resulting in no improvement on a ball joining shape, the stability of a loop shape, and the like.

For the copper-alloy bonding wires of the examples 70 to 72, 81, 82, 103 and 104, it was confirmed that the tensile strength increased, the adaptation characteristic for low-height looping was improved, the linearity in a long span and a loop stability were improved in addition to improvement on a ball joining shape by containing Mg and P (first element group) in total of 10 to 700 mass ppm, Ag, Pd, Pt and Au (second element group) in total of 10 to 5000 mass ppm, Be, Al, Bi, Si, In, Ge, Ti and V (third element group) in total of 6 to 300 mass ppm, Ca, Y, La, Ce, Pr and Nd (fourth element group) in total of 5 to 300 mass ppm, and oxygen within a range from 6 to 30 mass ppm according to the invention. On the other hand, for the comparative example 18, even though the second, third and fourth element groups were contained, the concentration of Mg and P (first element group) was not in an appropriate range, and no sufficient improvement on such characteristics was observed.

2. Second Embodiment (1) Structure

Regarding a bonding wire, the effects of the contained components in a bonding wire made of a copper material were earnestly researched. As a result, it became apparent that by adding at least one element of Mg and P in copper, the shape of a ball joining portion is likely to be improved, but the variability in manufacturing is large, and the characteristic changes with time in manufacturing and storing. Therefore, in addition to adding metal elements, effects of the distribution of metal elements and conditions thereof were examined, and as a result, it was found that adding at least one of Mg and P in copper at an appropriate amount and causing at least one of Mg and P to be concentrated on a surface make it possible to stabilize the joining characteristic, the loop control characteristic, and the like.

That is, according to the invention, there is provided a semiconductor-device copper-alloy bonding wire (hereinafter, "copper-alloy bonding wire") which contains at least either one of Mg and P (first element group) at a containing concentration of 10 to 700 mass ppm in total, and has a concentrated layer where the total concentration of Mg and P is more than or equal to ten times than the foregoing concentration on a surface of the wire.

By adding the elements of Mg and P, deformation of a joined ball portion and deformation failure like petal deformation are likely to be reduced. It is thought that the crystal grains of a ball are miniaturized by controlling dendrite growth of a coagulation organization. The variability of a ball joining shape becomes unstable by merely adding at least one of Mg and P. If Mg or P is added at a high concentration to improve a ball shape, a ball is hardened, resulting in a chip damage.

When the concentrated layer of Mg or P is provided on a wire surface, the effect of improving a ball shape by adding Mg or P is enhanced, and the addition amount of the elements can be reduced. It is thought that the concentrated layer stabilizes arc discharge and suppresses misalignment of a melted ball, thereby stabilizing the joining-shape characteristic of a ball.

The neck portion strength of a ball is improved and a loop shape is stabilized by forming the concentrated layer of Mg or P on a wire surface. It is thought that the concentrated layer suppresses the growth of recrystallized grains at a neck portion, causes the organization of a wire surface to be miniaturized, thereby stabilizing the friction characteristic and smoothness characteristic with respect to a capillary inner wall.

If the contained concentration of Mg and P is less than 10 mass ppm, as mentioned above, it results in deformation failure of a joined ball, such as abnormal deformation, and petal deformation. If the contained concentration of Mg and P is greater than or equal to 10 mass ppm, however, the effect of improving the circularity of the joined shape of a ball is enhanced, and a sufficient addition effect of stabilizing the joining shape of a ball is obtained. If it exceeds 700 mass ppm, however, a chip may be damaged. Preferably, if it is greater than or equal to 45 mass ppm, the strength of a neck portion is improved and a loop shape is stabilized in addition to improvement of a ball joining shape. Desirably, if it is within a range from 60 to 500 mass ppm, an effect of suppressing poor joining by wedge joining is further obtained, and further preferably, if it is within a range from 100 to 400 mass ppm, peeling or the like is suppressed, and a good successive ball joining characteristic can be obtained.

If the contained concentration of Mg and P is within a concentration range from 10 to 700 mass ppm and the average value of the total concentration of Mg and P in the concentrated layer is more than or equal to ten times than the contained concentration of Mg and P in an entire wire, an effect of improving a ball joining shape can be obtained. If the concentration of the concentrated layer is less than or equal to ten times, as mentioned above, the strength of a neck portion right ahead of a ball becomes insufficient, and the stability of a loop shape becomes insufficient. Preferably, if it is more than or equal to twenty times, a high performance in wedge joining after a wire has been stocked for a certain period can be maintained, and further preferably, if it is more than or equal to 100 times, a wire becomes useful for low-height looping. Regarding the maximum limit of the foregoing multiplying factor, if it is less than 50000 times, a uniform concentrated layer can be formed, the productivity becomes good, and a long-term reliability after a wire is mounted to a semiconductor device is stabilized.

When a copper-based bonding wire is left in the air, the surface copper is oxidized with time, so that it is considered that the wedge joining characteristic may be deteriorated and a ball may be oxidized. In accordance with the longer period at which the bonding wire is left in the air, the copper oxide film becomes thick, and degradation progresses. Such a time degradation is likely to be accelerated when an element is added to Cu. Even in case of a bonding wire to which only Mg and P are added, if the period at which the bonding wires are left in the air becomes long, the ball shape variability may become large. On the other hand, by forming the concentrated layer of Mg and P on a wire surface, oxidization, sulfuration and the like of copper in a wire are suppressed, and the stabilized characteristics can be obtained even if the bonding wire is used after it has been stocked for some period.

Separately from the relative ratio of the concentration of Mg and P in the concentrated layer with respect to the containing concentration of a wire, for a relationship with a change with time in the characteristics, it was confirmed that a good correlation with the average value or the maximum concentration value of the total concentration of Mg and P in the concentrated layer can be obtained.

According to a copper-alloy bonding wire which contains at least one of Mg and P in total of 10 to 700 mass ppm, and has a concentrated layer where the total concentration of Mg and P is 0.05 to 10 mass % on a wire surface, an effect of improving a ball joining shape is obtained, and further, an effect of maintaining the wedge joining characteristic well after a wire has been stocked for a while are enhanced. If the contained concentration of Mg and P is within a concentration range from 10 to 700 mass ppm and the total concentration of Mg and P in the concentrated layer is more than or equal to 0.05 mass %, an effect of suppressing time-deterioration of the wedge joining characteristic is obtained, and if it exceeds 10 mass %, however, a ball is so hardened that a chip is damaged, or a ball joining strength is reduced. Preferably, if it is within a range from 0.2 to 5 mass %, the wedge joining characteristic after a wire has been stocked for more than one month can be improved.

According to a copper-alloy bonding wire which contains at least one of Mg and P in total of 10 to 700 mass ppm, and has a concentrated layer where the maximum of the total concentration of Mg and P therein is 0.2 to 30 mass % on a wire surface, it is useful for stabilizing a loop shape, and increasing the strength of a neck portion, in addition to improvement of a ball joining shape. The maximum means the sum of the respective maximum concentrations of Mg and P. It was confirmed that the foregoing effects are maintained after a wire has been stocked for a long period. If the maximum of the total concentration of Mg and P in the concentrated layer is more than or equal to 0.2 mass %, the foregoing effects can be obtained, but if it exceeds 30 mass %, diffusion at a boundary of wedge joining is delayed, and the joining strength may be reduced. Preferably, if it is within a range from 0.5 to 10 mass %, the effect of improving the wedge joining characteristic for a thick line having a wire diameter of greater than or equal to 50 μm can be enhanced.

Regarding formation of the concentrated layer of Mg and P, Mg and P in a wire is likely to diffuse to the surface and the concentration is often increased by forming an oxide film or a deposit on a wire surface. In particular, concentration by forming an oxide film facilitates production, and achieves sufficient effects. An oxide film mainly containing at least one of Mg and P, and a composite oxide film of at least one of Mg and P and Cu can be used.

The effects of such an oxide film on a wire surface, such as suppression of recrystallization, increment of a surface strength, and lubrication of a surface, are achieved at the vicinity of the entire surface of a wire. On the other hand, the oxide film is effective for controlling recrystallization only at a partial area like a neck portion affected by heat. For the elements contained in the concentrated layer, by causing copper, or a part of other elements added to a bonding wire in addition to Mg and P, to be contained in the concentrated layer, the adherence characteristic with a bonding wire is improved, and the concentrated layer becomes stabilized.

It is desirable that the thickness of the concentrated layer of Mg and P should be in a range from 0.2 to 20 nm. If the thickness is more than or equal to 0.2 nm, the foregoing effects can be obtained, and if it exceeds 20 nm, however, the wedge joining characteristic of a thin line is reduced. Preferably, if it is within a range from 0.4 to 10 nm, the good ball joining characteristic can be obtained.

Various schemes can be applied to form the concentrated layer. For example, schemes of (1) controlling the addition concentration of Mg and P, (2) controlling a temperature history and an atmosphere at a melting step, (3) controlling oxidation of a wire surface and deposition in an elongation step, (4) controlling a temperature, a heat distribution, and an atmosphere at an intermediate annealing step or a final annealing step, and (5) suppressing oxidation while a final wire product is stocked, are individually applied or combined schemes thereof are applied to adjust the thickness and concentration distribution of the concentrated layer on a wire surface. It is expected that a part of the concentrated layer may be formed after a wire is subjected to bonding, but it is effective if the concentrated layer is formed before or during a bonding step. This is because, as mentioned above, the effects of the concentrated layer work most effective when a bonding wire is used.

Auger spectrometry can be employed as the analysis method for the concentrated layer on a surface. According to Auger spectrometry, a film thickness and a concentration distribution can be measured in some angstrom (0.1 nm) order of a surface. To obtain information on a depth direction, the analysis is carried out while performing sputtering. In a case where a concentration distribution occurs in a depth direction, the maximum concentration, the average concentration and the like is acquired. It is desirable that the foregoing total concentration of Mg and P in a wire surface should be the average concentration of the total of the two elements of Mg and P. Because of the limitation of an analysis accuracy, it is desirable that a detected concentration of a local part should be 0.05% for quantitative analysis. For determination of a layer boundary when a target element has a concentration inclination, it is desirable that a position where the maximum concentration of the element becomes half should be adopted as a boundary. A scheme of performing etching on a surface layer to cause the surface layer to be melted, and performing chemical analysis on the melted solution, thereby acquiring the average concentration of the surface layer can be employed as another analysis scheme.

According to a copper-alloy bonding wire which has a top skin layer where the maximum concentration of C is more than or equal to 20 mass % and whose thickness is 0.2 to 10 nm on a wire top surface, it is possible to enhance effects of suppressing time-deterioration of the characteristics, reducing scratches and scrapings of a loop surface, extending the life of a capillary, and the like. It is thought that such effects are achieved by the top skin layer which suppresses the progression of sulfuration and oxidation of Cu, thereby facilitating film thickness control of the concentration layer and enhancing the protection of a surface and the lubricity with a capillary interior wall, and the like. It was confirmed that the effects of the top skin layer is enhanced by combining the top skin layer with the concentrated layer of Mg and P. It is expected that the top skin layer enhances addition effects of the second to fourth element groups to be discussed later.

If the maximum concentration of C is 20 mass % and the thickness of the top skin layer is more than or equal to 0.2 nm, a stable surface protection function can be obtained. If the thickness exceeds 10 nm, however, a top skin layer remaining at a boundary of wedge joining increases, resulting in reduction of the joining strength. The location of the top skin layer is outside the concentrated layer of Mg and P, but if there is a partially overlapping portion with the concentrated layer, the adhesion of the boundary of the top skin layer and the concentrated layer can be improved. There may be a case where the boundary of the top skin layer and the concentrated layer cannot be completely separated away from each other by surface analysis, it is fine to consider that both layers are overlapped with each other in this case.

Application of the top skin layer mainly containing C can be likewise applied to the concentrated layer which is defined by the foregoing average concentration or the maximum concentration. That is, according to a copper-alloy bonding wire which has a concentrated layer where the total concentration of Mg and P is 0.05 to 10 mass %, and has a top skin layer that has a thickness of 0.2 to 10 nm and where the maximum concentration of C is more than or equal to 20 mass % outside the concentrated layer, or a copper-alloy bonding wire which has a concentrated layer where the maximum value of the total concentration of Mg and P is 0.2 to 30 mass %, and has a top skin layer that has a thickness of 0.2 to 10 nm and where the maximum concentration of C is more than or equal to 20 mass % outside the concentrated layer, the foregoing effects can be obtained well.

According to a copper-alloy bonding wire whose average of the oxygen concentration is 0.1 to 15 mass % at the concentrated layer and the top skin layer, friction with a capillary is reduced by increasing the oxygen concentration at a wire surface, thereby stabilizing a loop shape, and extending the life of the capillary. As mentioned above, the concentrated layer satisfies at least one of the conditions that the total concentration of Mg and P is 0.05 to 10 mass %, or the maximum of the total concentration of Mg and P in the concentrated layer is 0.2 to 30 mass %, and the top skin layer is located outside the concentrated layer, and which contains C whose maximum concentration is more than or equal to 20 mass %, and which has a thickness of 0.2 to 10 nm. If the average of the oxygen concentration is more than or equal to 0.1 mass %, the foregoing effects can be achieved, and if it exceeds 15 mass %, however, the joining characteristic of a bonding wire is reduced. Preferably, if it is within a range from 0.5 to 10 mass %, a good loop shape and a good joining characteristic can be both achieved in case of a thin line having a diameter of less than or equal to 25 μm.

Figure 2A:
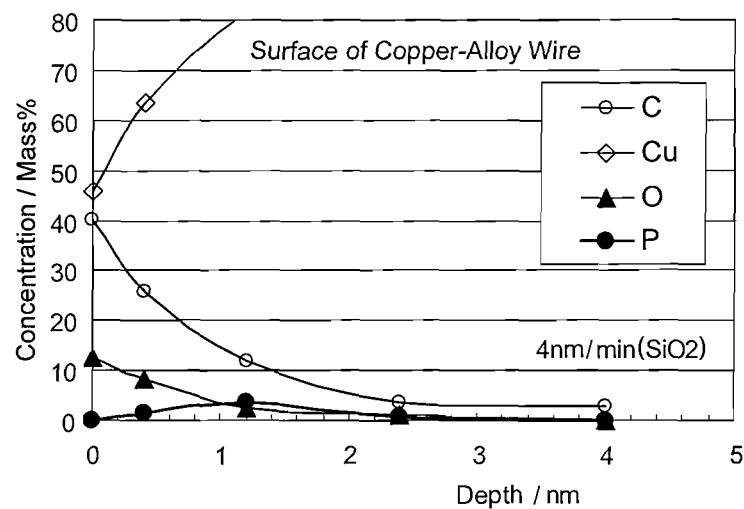
FIG. 2A is a diagram showing the result of Auger analysis in surface depth direction of a copper-alloy wire, and changes in the density of a major element.
Figure 2B:
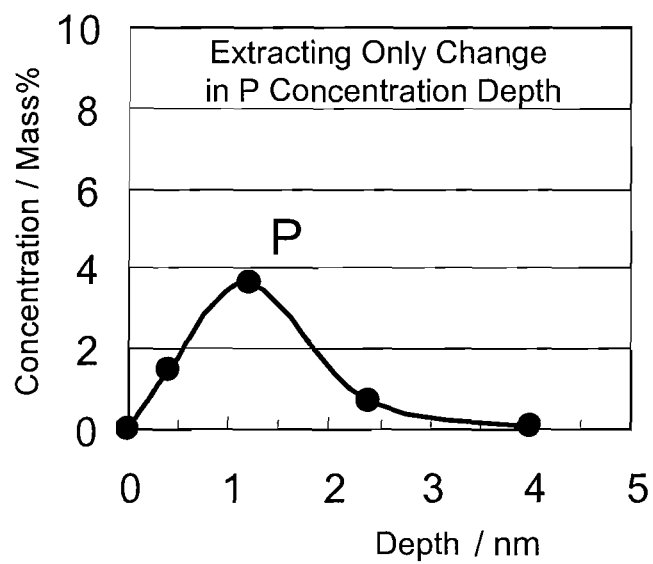
FIG. 2B is a diagram showing the result of Auger analysis in surface depth direction of a copper-alloy wire, and the abstract of P element.

Regarding an actual example of a copper wire surface, examples of the results of Auger analysis are shown in FIGS. 1 and 2. FIG. 1 is a spectrum diagram for a concentrated layer, and the peak of P element can be confirmed. FIG. 2 indicates a concentration profile in a depth direction from a wire surface, FIG. 2A selectively indicates changes in main elements, and FIG. 2B selectively indicates the concentration changes of P element. The copper wire used contained approximately 100 mass ppm of P, and had a wire diameter of 50 μm. It is apparent from FIG. 1 that the concentrated layer of P was formed on a wire surface. With reference to FIG. 2, the concentrated layer contained P whose maximum concentration was 3.8 mass %, and whose average concentration was 1.2 mass %, and which had the thickness of approximately 2 nm, and was within the scope of the present invention. The concentrated layer mainly consists of P oxide. It was confirmed that a top skin layer having a thickness of approximately 1 nm and containing C whose maximum concentration is approximately 40 mass % was present outside the concentrated layer. Moreover, the average of oxygen concentration in the concentrated layer and the top skin layer was approximately 4 mass %.

According to a copper-alloy bonding wire which contains at least one of Mg and P (first element group) in total containing concentration of 10 to 700 mass ppm, at least one of Ag, Pd, Pt and Au (second element group) in total of 10 to 5000 mass ppm, and which has a concentrated layer where the total concentration of Mg and P is more than or equal to ten times than the foregoing contained concentration on a wire surface, the joining strength can be improved in addition to improvement of the joining shape of a ball portion.

Containing Mg and P and having the concentrated layer together make it possible to improve a ball joining shape, and if the second element group is contained, misalignment of a ball formed at the leading end of a wire can be suppressed. The misalignment of the ball when it is joined is reduced, thereby improving the circularity of a joining shape. As another effect of adding the second element group, oxidation of a ball surface is suppressed, and the joining strength of a Cu ball with an aluminum electrode is improved. The improvement effect of the joining strength is further enhanced by using both first and second element groups rather than merely adding the second element group.

If the contained concentration of the second element group is more than or equal to 10 mass ppm, the foregoing addition effects can be acquired, but if it exceeds 5000 mass ppm, however, a ball portion is hardened and a chip may be damaged. Preferably, if it is within a range from 20 to 4000 mass ppm, a good ball shape and a good joining strength can be both acquired in case of general-purpose pitch connection where a pad electrode clearance is less than or equal to 80 μm or in low-temperature connection of less than or equal to 200° C. On the other hand, to give preference to a long-term joining reliability at a high temperature, it is desirable that the total concentration of the second element group should be 500 to 3000 mass ppm.

According to a copper-alloy bonding wire which contains at least one of Mg and P (first element group) in total of 10 to 700 mass ppm, at least one of Be, Al, Bi, Si, In, Ge, Ir and Mn (third element group) in total of 5 to 300 mass ppm, and which has the concentrated layer where the total concentration of Mg and P is more than or equal to ten times than the foregoing concentration on a wire surface, the mechanical characteristics, such as the wire strength, and the elasticity, can be improved in addition to improvement of the joining shape of a ball portion, thereby improving the usability of a thin line.

Addition of the third element group brings about an effect of enhancing the strength, but high-concentration addition is difficult because of a problem like oxidation, so that the usability of the effect is limited. However, by using Mg and P together with the third element group, the possibility of a petal deformation failure of ball joining is reduced, and the wire strength is increased. It is though that using the third element group together with Mg and P suppresses the third element group from being oxidized preferentially, the solid solubility of the third element group is likely to be improved, thereby boosting reduction of petal deformation and enhancement of the wire strength. In case of a copper wire, to improve the wedge joining characteristic or the like, a copper wire is often made in such a manner as to be elongated more than an Au wire, so that the strength is often reduced. When the third element group is used together with the first element group, the effect of improving the strength is high even though a wire is subjected to a high elongation process, so that it is useful. Further, even if a bonding wire is stocked for a long period, segregation of the third element group to a surface is delayed by adding the first element group, thereby maintaining the wedge joining characteristic in a good state which is a subject of time degradation If the concentration of the third element group is more than or equal to 5 mass ppm, the foregoing effects can be acquired, but if it exceeds 300 mass ppm, however, precipitation on a ball surface occurs, and the joining strength may be reduced. Preferably, if it is within a range from 5 to 200 mass ppm, occurrence of segregation, concentration, or the like on a ball surface, which causes reduction of the joining strength can be suppressed, and a clean ball can be obtained, thereby improving the successive ball joining characteristic. Further preferably, if it is within a range from 10 to 100 mass ppm, the peel strength in low-temperature joining of less than or equal to 180° C. can be improved. Note that to measure a peel strength, a simple scheme of measuring a pull strength near a wedge joined portion can be substituted.

According to a copper-alloy bonding wire which contains at least one of Mg and P (first element group) in total of 10 to 700 mass ppm, at least one of Ca, Y, La, Ce, Pr, and Nd (fourth element group) in total of 5 to 300 mass ppm, and which has the concentrated layer where the total concentration of Mg and P is more than or equal to ten times than the foregoing concentration on a wire surface, recrystallization of a neck portion is controlled and a portion affected by heat is shortened, and it is useful for low-height looping, in addition to improvement of the joining shape of a ball portion.

Low-height looping is facilitated by adding the fourth element group, but high-concentration addition is difficult because of a problem like oxidation, so that the usability of the effect is limited. However, by adding the fourth element group together with the first element group, an effect of suppressing elliptic deformation of ball joining in an ultrasonic wave direction, and an effect of suppressing recrystallization are further enhanced. For example, by such complex addition, further low-height looping of more than or equal to 20% can be realized. It is thought that using the fourth element group with the first element group suppresses the fourth element group from being oxidized preferentially, and suppresses the fourth element group from being precipitated, and the solid solubility of the fourth element group is improved, thereby boosting suppression of elliptic deformation of a ball portion, or, because of the synergic action of the fourth and first element groups, a neck portion is suppressed from being damaged, thereby boosting low-height looping. Further, even if a bonding wire is stocked for a long period, segregation of the fourth element group to a surface is delayed by adding the first element group, thereby maintaining the wedge joining characteristic in a good state which is a subject of time degradation.

If the concentration of the fourth element group is more than or equal to 5 mass ppm, the foregoing effects can be acquired, but if it exceeds 300 mass ppm, however, precipitation to a ball surface occurs, and the joining strength may be reduced. Preferably, if it is within a range from 10 to 200 mass ppm, the successive ball joining characteristic is also improved. Further preferably, if it is within a range from 15 to 100 mass ppm, the peel strength in low-temperature joining of less than or equal to 180° C. can be enhanced.

According to a copper-alloy bonding wire which contains at least one of Mg and P in total of 10 to 700 mass ppm, at least one of Ag, Pd, Pt and Au in total of 10 to 5000 mass ppm, at least one of Be, Al, Bi, Si, In, Ge, Ir and Mn in total of 5 to 300 mass ppm, and which has the concentrated layer where the total concentration of Mg and P is more than or equal to ten times than the foregoing concentration on a wire surface, the elasticity of a bonding wire is increased in addition to improvement of the joining shape of a ball portion, and the linearity of the bonding wire is ensured in a long span where a wire length is longer than or equal to 4 mm, and the bonding wire can be applied to BGA mounting.

According to a copper-alloy bonding wire which contains at least one of Mg and P in total of 10 to 700 mass ppm, at least one of Ag, Pd, Pt and Au in total of 10 to 5000 mass ppm, at least one of Ca, Y, La, Ce, Pr and Nd in total of 5 to 300 mass ppm, and which has the concentrated layer where the concentration of Mg and P is more than or equal to ten times than the foregoing concentration, the recrystallized organization of a neck portion is controlled, and the stability of loop shapes of a multistage wiring where loop heights differ is improved, and the bonding wire can be applied to high-density connection of plural pins which are more than or equal to 200 pins, in addition to improvement of the joining shape of a ball portion.

According to a copper-alloy bonding wire which contains at least one of Mg and P in total of 10 to 700 mass ppm, at least one of Ag, Pd, Pt and Au in total of 10 to 5000 mass ppm, at least one of Be, Al, Bi, Si, In, Ge, Ir and Mn in total of 5 to 300 mass ppm, at least one of Ca, Y, La, Ce, Pr and Nd in total of 5 to 300 mass ppm, and which has the concentrated layer where the total concentration of Mg and P is more than or equal to ten times than the foregoing concentration, it is confirmed that the wire strength is improved, the applicability to low-height looping is improved, and the linearity of a long span and the loop stability are improved, in addition to improvement of the joining shape of a ball portion. What is more, it is confirmed that the possibility of a wire deformation failure in resin sealing is reduced. Because of the improvement of such characteristics comprehensively, it is expected that the copper-alloy bonding wire can cope with narrow pitch connection where a pad electrode clearance is less than or equal to 60 μm.

(2) Examples

Next, an explanation will be given of examples of the invention. Note that the examples 1 to 104 and comparative examples 1 to 18 in tables 9 to 16 are bonding wires made by different schemes from the examples 1 to 104 and comparative examples 1 to 18 of the first embodiment. Hereinafter, the examples 1 to 104 and comparative examples 1 to 18 in tables 9 to 16 will be explained.

Copper-alloys containing the individual chemical components shown in tables 9 to 16 were cast by a melting furnace.

The ingots were rolled, and were subjected to drawing using a dice, and a post heating process of performing heating while successively sweeping wires was performed, thereby manufacturing copper-alloy bonding wires. The final wire diameter was set to a range from 20 to 75 μm.

The detail of the manufacturing process will be explained below. Using high-purity copper whose copper purity was 4N to 6N (99.99 to 99.9999 mass %), necessary contained components were added, and melting was performed at a temperature of greater than or equal to 1100° C. under a vacuum, nitrogen, or Ar gas atmosphere. Thereafter, the target was annealed in a furnace, and an ingot having a diameter of 6 to 30 mm was made. To clean the surface of the ingot, pickling and rinsing with water was performed on the ingot, and the ingot was dried. In a rolling step, a grooved roll was used, and the ingot was machined at a speed of 30 to 200 m/min until a wire diameter became 0.5 to 1.5 mm. In a drawing step, using a successive drawing device to which a plurality of dices can be set, and a diamond-coated dices, drawing was performed at a drawing speed within a range from 50 to 400 m/s. To clean the inner wall of a dice, ultrasonic cleaning was performed on a dice before it was used. In a post heating process step, an infrared heater having a soaking band (even heat band) of greater than or equal to 10 cm was used, and wires were successively moved through a furnace set to a temperature of 250 to 600° C. at a speed of 50 to 500 m/min, and a sweeping tensile within a range from 2 to 30 mN, and adjustment was performed in such a way that the elongation value of a tensile test would become 4 to 25%. A rust-preventive agent was applied on a wire surface as necessity, a spool on which a copper-alloy bonding wire was winded was covered with a protective bag, and was sealed under an $N_2$ atmosphere in storing. Regarding analysis on a tiny amount of elements in copper, an ICP device was used for alloy element concentration analysis.

An ASM-made general-purpose automatic wire bonder device was used for performing ball/wedge joining to connect a copper-alloy bonding wire. In ball joining, a ball portion was formed at the leading end of a wire by arc discharge, and was joined to an electrode film by thermal pressure bonding with an ultrasonic wave. In case of a copper bonding wire, to suppress oxidation in melting, a ball was formed with an inert gas applied to the leading end of the wire. An $N_2+5\%$ $H_2$ gas was used as the inert gas. The other end of the wire was subjected to wedge joining to a lead frame or a lead portion of a BGA substrate.

As a joining target, an Al alloy film (Al-1% Si-0.5% Cu) having a thickness of approximately 0.8 to 3 μm which was a material of an electrode film on a silicon substrate was used. The same effectiveness can be acquired if the target is Al-0.5% Cu. As a target of wedge joining, a lead frame having an Ag plating (thickness: 1 to 4 μm) formed on the surface thereof was used. The difference between the example and a comparative example was confirmed even if a glass-epoxy resin substrate having Au plating/Ni plating/Cu wiring (G display) formed on the surface thereof was used.

Typical mechanical characteristics of a bonding wire, such as a wire strength ("tensile strength" in tables) and an elasticity ("elongation" in tables) were measured through an tensile test. A sample length was 10 mm, and five samples were subjected to measurement, and the average of breaking strengths per unit area was used.

10 ball portions were observed through an optical microscope or an SEM to check the shapes of the ball portions. Regarding misalignment that a ball was so formed as to be inclined from the center of a wire, when obvious misalignment was observed for greater than or equal to one ball, it was determined as no-good, and a cross mark was put on a corresponding field "ball misalignment" in a table, when a minor curving of a ball portion was observed for less than or equal to one ball, it was determined as no problem, and a single-circle mark was put on a corresponding field, and when no misalignment was observed, it was determined as good, and a double-circle mark was put on a corresponding field.

A ball portion was joined to an electrode film on a silicon substrate to evaluate the shape of a ball joining portion. The evaluation was carried out at stage temperatures of 220° C., which was a normal temperature, and 175° C., which was a low temperature at which wedge joining became difficult. Regarding anisotropic evaluation for ball deformation, the ball deformation was categorized to petal deformation, elliptic deformation, and misaligned deformation, and bonding conditions which accelerated the individual failures were applied.

500 ball joining portions were observed through an optical microscope to check occurrence of elliptic deformation and petal deformation of a ball joining portion. When there were greater than or equal to three ball joining portions in elliptic forms, it was determined as no-good, and an evaluation of ellipsoid occurrence was indicated by a cross mark in a field "elliptic deformation" in a table, when there were one or two ball joining portions subjected to minor elliptic deformation, a single-circle mark was put on a corresponding field, and when no deformation occurred, a double-circle mark was put on a corresponding field. Moreover, regarding petal concavity and convexity, when noticeable petal deformation was observed for more than or equal to 4 ball joining portions, it was determined as no-good, and a cross mark was put on a field "petal deformation" in a table, when minor petal deformation occurred for one to three ball joining portions, a single-circle mark was put on a corresponding field, and when no petal deformation occurred, a double-circle mark was put on a corresponding field.

Regarding misalignment failure, 500 ball joining portions were observed through an optical microscope, when the center of a ball joining portion was misaligned from the center of a wire right above that ball joining portion at greater than or equal to 5 μm, it was determined as misalignment, and based on a relatively exact determination condition, when misalignment occurred for more than or equal to three ball joining portions, a cross mark was put on a field "misalignment deformation" in a table, and when misalignment occurred for one to two ball joining portions, a single-circle mark was put on a corresponding field, and when no misalignment occurred, a double-circle mark was put on a corresponding field.

Regarding successive bonding evaluation for ball joining portions, 1000 wires were connected, and evaluation was carried out based on the number of peelings of ball joining portions. To do acceleration evaluation, a load and ultrasonic wave vibration were so set as to be slightly lower than those of a mass-production condition. If the number of peelings was greater than or equal to six, joining was not sufficient so that a cross mark was put on a field "successive ball joining" in a table, when the number of peelings was three to five, a triangle mark was put on a corresponding field, when the number of peeling was one to two, it was determined as no-problem for mass-production, and a single-circle mark was put on a corresponding field, and when no peeling was observed, it was determined that sufficient joining strength was achieved, and a double-circle mark was put on a corresponding field.

Regarding evaluation for a damage to a chip, a ball portion was joined to an electrode film, the electrode film was etched and removed, and a damage to an insulation film or a silicon chip was observed through an SEM. 400 electrode portions were observed. When no damage was observed, a double-circle mark was put on a field "chip damage" in a table, when less than or equal to two cracks of less than or equal to 5 μm were observed, it was determined as no-problem and a single-circle mark was put on a corresponding field, when more than or equal to two cracks of greater than or equal to 5 μm and less than 20 μm were observed, it was determined as a considerable level, an a triangle mark was put on a corresponding field, and when more than or equal to one crack of more than or equal to 20 μm or crater damage was observed, it was determined as no-good, and a cross mark was put on a corresponding field.

Regarding evaluation for the strength of a neck portion, a pull test (neck pull strength) was carried out near a ball joining portion, and twenty breaking loads (pull strength) were measured. When a neck pull strength was greater than or equal to 60% of a tensile strength, it was determined as good, and a double-circle mark was put on a field "neck pull strength" in a table, when less than 30%, it was determined as improvement necessary, and a triangle mark was put on a corresponding field, and when a neck pull strength was in a middle of those percentages, a single-circle mark was put on a corresponding field.

Joining targets and stage temperatures were set differently to effectively evaluate a wedge joining characteristic. Specifically, conditions were set to two cases where a wire was joined on an Ag plating on the surface of a lead frame at a normal temperature of 220° C., and where a wire was joined on Au plating/Ni plating/Cu wiring on the surface of a resin substrate at a low temperature of 175° C. Further, regarding bonding wires used for the evaluation, two samples were used: one of the samples had undergone bonding within three days after the wire was manufactured, and the other had undergone bonding after it was stocked for thirty days in a condition where it was packed and sealed with an $N_2$ gas after the wire was manufactured. Regarding the former three days condition, there would be little differences in wire characteristics, and low temperature joining at 175° C. was carried out, and regarding the latter condition, a wire left for a long time was joined at a normal temperature of 220° C.

A total of 1000 bonding wires were connected for evaluating a wedge joining characteristic. For a sample, the foregoing sample which was a bonding wire manufactured within three days and was subjected to low temperature joining of 175° C. was used. As an evaluation criteria, when a successive bonding operation was interrupted once or more times because of a failure of a wedge joined portion or more than or equal to seven failure phenomenon like peeling were observed through an optical microscope, it was determined as a poor wedge joining characteristic, and a cross mark was put on a field "wedge joining characteristic" in a table, when 5 to 6 failures were observed, it was determined as an insufficient wedge joining characteristic, and a triangle mark was put on a corresponding field, when successive bonding was possible but one peeling phenomenon was observed, it was determined as normally no-problem, and a single-circle mark was put on a corresponding field, and when no failure phenomenon was observed through successive bonding, it was determined as a good wedge joining characteristic, and a double-circle mark was put on a corresponding field.

Regarding evaluation for a peel joining strength, a pull test for a wedge joined portion was carried out. Specifically, a hook hooked to loops at a portion close to a wedge joined portion beyond ¾ of a wire strength was moved upward, and a breaking strength of a bonding wire was measured. Because a pull strength depends on a diameter of a bonding wire, a loop shape, a joining condition and the like, a relative ratio (Rp) of pull strength/wire tensile strength was used instead of the absolute value of a pull strength. When an Rp was greater than or equal to 20%, it was determined that a wedge joining characteristic was good, and a double-circle mark was put on a field "low temperature joining peel strength" in a table, when it was greater than or equal to 15% but less than 20%, it was determined as no-problem, and a single-circle mark was put on a corresponding field, when it was greater than or equal to 10% but less than 15%, it was determined that a failure may occur, and a triangle mark was put on a corresponding field, and when it was less than 10%, it was determined that there was a failure in a mass-production step, and a cross mark was put on a corresponding field.

To evaluate the linearity of a bonded loop, using thirty bonding wires undergone bonding in such a manner as to have a 4 mm wire clearance (span), the bonding wires were observed from the above through a projection device. With respect to a straight line which connected a portion of a joined portion at a ball side and a portion thereof at a wedge side, a misalignment of that portion where bonding wires were most distant from each other was measured as a bending degree. When the average of bending degrees were less than the wire diameter of one wire, it was determined as good, and a double-circle mark was put on a field "linearity" in a table, when it was more than or equal to the diameters of two wires, it was determined as failure, and a triangle mark was put on a corresponding field, and when it was a middle value therebetween, it was determined as normally no-problem, and a single-circle mark was put on a corresponding field.

Regarding the stability of a loop shape in a bonding step, plural sets of thirty trapezoidal loops were so connected as to have loop heights of 200 μm and 350 μm, respectively, at a wire length of 3 mm, and evaluation was carried out based on the standard deviation of heights. An optical micrometer was used for measurement, and the measurement was carried out at three portions: a rising portion right above a ball portion; a top portion; and the center of a wire. When the standard deviation of the loop heights was greater than or equal to ½ of a wire diameter, it was determined as a large variability, and when it was less than ½, it was determined as a small variability. Based on such criteria, when the variability was small for all three portions, it was determined that the loop shape was stable, and a double-circle mark was put on a field "height stability" in a table, when there was one portion having a large variability, it was determined as relatively good, a single-circle mark was put on a corresponding field, when there were two portions, a triangle mark was put on a corresponding field, and when there were three portions having large variability, a cross mark was put on a field.

Regarding evaluation for a low loop characteristic, thirty trapezoidal loops were connected at a wire length of 2 mm, and the evaluation was carried out based on the standard deviation of heights. Because a loop height depends on a wire diameter, adjustment was carried out in such a manner as to have a target loop height of 150 μm for a wire diameter of 20 to 30 μm, and a target loop height of 200 μm for a wire diameter of 50 to 75 μm. Measurement of a loop height, determination criteria based on a standard deviation, and the like were the same as the foregoing ones, and the evaluation results were indicated in fields "low loop characteristic" in a table.

Regarding evaluation for the surface nature of a loop, using the foregoing low-height loop sample, the parallel portion of the trapezoidal loop was observed through an optical micrometer, and evaluation was carried out for scratches, and scrapings. 50 loops were observed. When there was less than or equal to one scratch of greater than or equal to 10 μm, it was determined as good, and a double-circle mark was put on a field "loop surface scratch and scraping" in a table, when there were two to four scratches, a single-circle mark was put on a corresponding field, when there were five to 9 scratches, it was determined that adjustment of a loop condition would be required, and a triangle mark was put on a corresponding field, and when there were more than or equal to ten scratches or more than or equal to one scraping, it was determined that such phenomenon would cause a failure, and a cross mark was put on a corresponding field.

How much the leading end of a capillary was dirty when 10000 bonding wires were connected was determined as a standard of the use life of the capillary. When the capillary was obviously dirty, a cross mark was put on a field "capillary leading end dirt" in a table, when there was one dirty portion, a single-circle mark was put on a corresponding field, and when no dirt was observed, a double-circle mark was put on a corresponding field.

Auger spectrometry was utilized for analysis of the concentrations of Mg, P, and C elements in a wire surface. Regarding the C element, only when a top skin layer where the maximum concentration of C at a surface was 20 mass %, the thickness of the top skin layer was measured and put on a table.

TABLE 9

| | | | First Element Group | | | Second Element Group | | | | | Third Element Group | | | | | | | | Fourth Element Group | | | |
|---|---|---|---|---|---|---|---|---|---|---|---|---|---|---|---|---|---|---|---|---|---|---|
| | | | Mg | P | Total | Ag | Pd | Pt | Au | Total | Be | Al | Bi | Si | In | Ge | Ir | Mn | Total | Ca | Y | La | Ce |
| Examples | 1 | | 46 | | 46 | | | | | 0 | | | | | | | | | 0 | | | | |
| | 2 | | | 50 | 50 | | | | | 0 | | | | | | | | | 0 | | | | |
| | 3 | | 100 | | 100 | | | | | 0 | | | | | | | | | 0 | | | | |
| | 4 | | | 100 | 100 | | | | | 0 | | | | | | | | | 0 | | | | |
| | 5 | | | 200 | 200 | | | | | 0 | | | | | | | | | 0 | | | | |
| | 6 | | | 650 | 650 | | | | | 0 | | | | | | | | | 0 | | | | |
| | 7 | | 20 | 150 | 170 | | | | | 0 | | | | | | | | | 0 | | | | |
| | 8 | | 50 | 450 | 500 | | | | | 0 | | | | | | | | | 0 | | | | |
| | 9 | | 45 | | 45 | 20 | | | | 20 | | | | | | | | | 0 | | | | |
| | 10 | | | 200 | 200 | 200 | | | | 200 | | | | | | | | | 0 | | | | |
| | 11 | | 40 | 100 | 140 | 4500 | | | | 4500 | | | | | | | | | 0 | | | | |
| | 12 | | 20 | 200 | 220 | | 50 | | | 50 | | | | | | | | | 0 | | | | |
| | 13 | | 23 | 140 | 163 | | 1000 | | | 1000 | | | | | | | | | 0 | | | | |
| | 14 | | | 100 | 100 | | 3500 | | | 3500 | | | | | | | | | 0 | | | | |
| | 15 | | 10 | 300 | 310 | | | 40 | | 40 | | | | | | | | | 0 | | | | |
| | 16 | | | 50 | 50 | | | 3000 | | 3000 | | | | | | | | | 0 | | | | |
| | 17 | | 250 | 300 | 550 | | | | 20 | 20 | | | | | | | | | 0 | | | | |
| | 18 | | | 200 | 200 | | | | 2700 | 2700 | | | | | | | | | 0 | | | | |
| | 19 | | 30 | 80 | 110 | 40 | 1000 | | | 1040 | | | | | | | | | 0 | | | | |
| | 20 | | 68 | | 68 | | | 200 | 100 | 300 | | | | | | | | | 0 | | | | |
| | 21 | | | 125 | 125 | 3 | | 3 | | 6 | | | | | | | | | 0 | | | | |
| | 22 | | 25 | 55 | 80 | | 5 | | 3 | 8 | | | | | | | | | 0 | | | | |
| | 23 | | 180 | 55 | 235 | 2000 | 1000 | 2000 | 1000 | 6000 | | | | | | | | | 0 | | | | |
| | 24 | | | 100 | 100 | | | | | 0 | 6 | | | | | | | | 6 | | | | |
| | 25 | | | 200 | 200 | | | | | 0 | 30 | | | | | | | | 30 | | | | |
| | 26 | | 22 | 60 | 82 | | | | | 0 | 153 | | | | | | | | 153 | | | | |
| | 27 | | | 200 | 200 | | | | | 0 | | 20 | | | | | | | 20 | | | | |
| | 28 | | 70 | | 70 | | | | | 0 | | 182 | | | | | | | 182 | | | | |
| | 29 | | | 250 | 250 | | | | | 0 | | | 15 | | | | | | 15 | | | | |
| | 30 | | | 50 | 50 | | | | | 0 | | | 160 | | | | | | 160 | | | | |
| | 31 | | | 150 | 150 | | | | | 0 | | | | 8 | | | | | 8 | | | | |
| | 32 | | | 150 | 150 | | | | | 0 | | | | 60 | | | | | 60 | | | | |
| | 33 | | 60 | 5 | 65 | | | | | 0 | | | | 135 | | | | | 135 | | | | |
| | 34 | | 20 | 25 | 45 | | | | | 0 | | | | | 8 | | | | 8 | | | | |
| | 35 | | | 100 | 100 | | | | | 0 | | | | | 40 | | | | 40 | | | | |
| | 36 | | 80 | | 80 | | | | | 0 | | | | | 44 | | | | 44 | | | | |
| | 37 | | 250 | | 250 | | | | | 0 | | | | | | 20 | | | 20 | | | | |
| | 38 | | 50 | 55 | 105 | | | | | 0 | | | | | | 144 | | | 144 | | | | |
| | 39 | | 30 | 60 | 90 | | | | | 0 | 5 | | 3 | | 5 | | | | 13 | | | | |
| | 40 | | | 200 | 200 | | | | | 0 | | 50 | | | 20 | | | 50 | 120 | | | | |
| | 41 | | 10 | 230 | 240 | | | | | 0 | | 20 | 20 | 15 | 50 | 23 | | | 128 | | | | |

| | | | Component Concentration in Wire (Mass ppm) | | | | Surface Concentrated Layer | | | | | Top Skin Layer Film | | Average O Concentration of Concentrated Layer and Top Skin Layer(%) |
|---|---|---|---|---|---|---|---|---|---|---|---|---|---|---|
| | | | Fourth Element Group | | | | Mg, P Total Concentration (Mass ppm) | | | | | | | |
| | | | Pr | Nd | Total | Cu | Average Concentration | Concentration Ratio (Times) | Max. Concentration Mg | Max. Concentration P | Oxide | Other Contained Element | Thickness (nm) | Film(C Concentration/nm) | |
| Examples | 1 | | | | 0 | Remained | 0.2 | 43 | 1.2 | | | | 1 | <0.01 | 1 |
| | 2 | | | | 0 | Remained | 0.5 | 100 | | 1.6 | | | 2 | <0.01 | 2 |

TABLE 9-continued

| | | | | | | | | | | | | | | |
|---|---|---|---|---|---|---|---|---|---|---|---|---|---|---|
| 3 | 0 | Remained | 3.5 | 350 | 6 | | ○ | Cu | 6 | 2 | | 0.3 | 3 |
| 4 | 0 | Remained | 0.2 | 20 | | 2.3 | ○ | | 2 | | | 0.5 | 4 |
| 5 | 0 | Remained | 0.3 | 15 | | 4.7 | ○ | Cu | 4 | 4 | | 5 | 5 |
| 6 | 0 | Remained | 2.5 | 38 | | 9.2 | ○ | Cu | 12 | | | 17 | 6 |
| 7 | 0 | Remained | 1 | 59 | 0.1 | 3.4 | ○ | | 4 | | | 2 | 7 |
| 8 | 0 | Remained | 1.2 | 24 | 0.5 | 6.2 | ○ | Cu | 6 | | | 0.5 | 8 |
| 9 | 0 | Remained | 0.1 | 22 | 0.7 | | | | 0.5 | | | <0.01 | 9 |
| 10 | 0 | Remained | 2 | 100 | | 5.2 | ○ | Cu | 3 | | | 3 | 10 |
| 11 | 0 | Remained | 0.6 | 43 | 0.8 | 1.7 | ○ | Cu, Ag | 2 | | | 2 | 11 |
| 12 | 0 | Remained | 1 | 45 | 0.2 | 3.3 | ○ | Cu | 2 | | | 2 | 12 |
| 13 | 0 | Remained | 1 | 61 | 0.2 | 2 | ○ | | 3 | | | 0.4 | 13 |
| 14 | 0 | Remained | 0.6 | 60 | | 1.6 | | | 2 | | | 0.03 | 14 |
| 15 | 0 | Remained | 2.3 | 74 | 0.2 | 5.3 | ○ | Cu | 6 | 1 | | 0.3 | 15 |
| 16 | 0 | Remained | 0.7 | 140 | | 1.3 | | | 2 | | | 1 | 16 |
| 17 | 0 | Remained | 8.3 | 151 | 8.2 | 14.6 | ○ | Cu | 17 | 6 | | 12 | 17 |
| 18 | 0 | Remained | 1.2 | 60 | | 4.2 | ○ | Cu | 5 | | | 0.9 | 18 |
| 19 | 0 | Remained | 0.4 | 36 | 0.5 | 1.5 | ○ | | 4 | | | 2 | 19 |
| 20 | 0 | Remained | 0.4 | 59 | 1.2 | | | | 2 | | | 0.03 | 20 |
| 21 | 0 | Remained | 0.9 | 72 | | 2 | ○ | Cu | 3 | | | 1 | 21 |
| 22 | 0 | Remained | 0.4 | 50 | 0.1 | 1 | | | 2 | | | 0.04 | 22 |
| 23 | 0 | Remained | 1 | 43 | 2.2 | 1 | ○ | | 5 | 2 | | 0.8 | 23 |
| 24 | 0 | Remained | 1.1 | 110 | | 2.5 | ○ | Cu | 3 | | | 3 | 24 |
| 25 | 0 | Remained | 2.2 | 110 | | 4.8 | ○ | Cu, Be | 8 | | | 4 | 25 |
| 26 | 0 | Remained | 0.3 | 37 | 0.2 | 1 | | | 2 | | | 0.05 | 26 |
| 27 | 0 | Remained | 2.1 | 105 | | 6.4 | ○ | | 7 | 2 | | 1 | 27 |
| 28 | 0 | Remained | 0.2 | 29 | 1.1 | | | | 1 | | | 0.04 | 28 |
| 29 | 0 | Remained | 3 | 120 | | 7.2 | ○ | Cu | 8 | 2 | | 9 | 29 |
| 30 | 0 | Remained | 0.4 | 80 | | 1.4 | ○ | Cu | 2 | | | 1 | 30 |
| 31 | 0 | Remained | 1.2 | 80 | | 2.9 | ○ | | 3 | | | 3 | 31 |
| 32 | 0 | Remained | 1 | 67 | | 3.2 | ○ | Cu | 4 | | | 4 | 32 |
| 33 | 0 | Remained | 0.3 | 46 | 1.1 | | ○ | | 1 | | | 0.8 | 33 |
| 34 | 0 | Remained | 0.1 | 22 | 0.3 | | ○ | Cu | 1 | | | 0.06 | 34 |
| 35 | 0 | Remained | 0.8 | 80 | | 1.8 | ○ | In | 2 | | | 3 | 35 |
| 36 | 0 | Remained | 0.4 | 50 | 1.2 | | | | 1 | | | 0.04 | 36 |
| 37 | 0 | Remained | 2.7 | 108 | 5.7 | | ○ | Cu | 9 | | | 4 | 37 |
| 38 | 0 | Remained | 1.1 | 105 | 1.2 | 1.3 | ○ | | 3 | | | 0.07 | 38 |
| 39 | 0 | Remained | 0.8 | 89 | 0.8 | 1.5 | ○ | | 3 | | | 2 | 39 |
| 40 | 0 | Remained | 2.1 | 105 | | 5.3 | ○ | Cu | 8 | 3 | | 3 | 40 |
| 41 | 0 | Remained | 1.7 | 71 | | 4.1 | ○ | | 7 | 2 | | 5 | 41 |

TABLE 10

Component Concentration in Wire (Mass ppm)

| | | First Element Group | | | Second Element Group | | | | | Third Element Group | | | | | | | | Fourth Element Group | | | |
|---|---|---|---|---|---|---|---|---|---|---|---|---|---|---|---|---|---|---|---|---|---|
| | | Mg | P | Total | Ag | Pd | Pt | Au | Total | Be | Al | Bi | Si | In | Ge | Ir | Mn | Total | Ca | Y | La | Ce |
| Examples | 42 | 45 | 20 | 65 | | | | | 0 | 2 | | 2 | | | | | | 4 | | | | |
| | 43 | 20 | 55 | 75 | | | | | 0 | | 2 | | | 1 | | | | 3 | | | | |
| | 44 | 32 | 120 | 152 | | | | | 0 | 40 | 100 | 45 | 55 | 40 | 60 | | | 340 | | | | |
| | 45 | 55 | 50 | 105 | | | | | 0 | | | | | | | | | 0 | 10 | | | |
| | 46 | | 150 | 150 | | | | | 0 | | | | | | | | | 0 | 45 | | | |
| | 47 | | 120 | 120 | | | | | 0 | | | | | | | | | 0 | 280 | | | |
| | 48 | 30 | 50 | 80 | | | | | 0 | | | | | | | | | 0 | | 6 | | |
| | 49 | | 100 | 100 | | | | | 0 | | | | | | | | | 0 | | 55 | | |
| | 50 | 5 | 50 | 55 | | | | | 0 | | | | | | | | | 0 | | | 5 | |
| | 51 | | 123 | 123 | | | | | 0 | | | | | | | | | 0 | | | 120 | |
| | 52 | 10 | 223 | 233 | | | | | 0 | | | | | | | | | 0 | | | | 6 |
| | 53 | 20 | 85 | 105 | | | | | 0 | | | | | | | | | 0 | | | | 110 |
| | 54 | | 138 | 138 | | | | | 0 | | | | | | | | | 0 | | | | |
| | 55 | 20 | 80 | 100 | | | | | 0 | | | | | | | | | 0 | | | | |
| | 56 | | 175 | 175 | | | | | 0 | | | | | | | | | 0 | | | | |
| | 57 | 72 | 12 | 84 | | | | | 0 | | | | | | | | | 0 | | | | |
| | 58 | | 152 | 152 | | | | | 0 | | | | | | | | | 0 | 2 | 2 | | |
| | 59 | 15 | 148 | 163 | | | | | 0 | | | | | | | | | 0 | | 30 | 30 | 20 |
| | 60 | 113 | 47 | 160 | | | | | 0 | | | | | | | | | 0 | 42 | | 10 | |
| | 61 | 210 | | 210 | | | | | 0 | | | | | | | | | 0 | 1 | | | 2 |
| | 62 | | 136 | 136 | | | | | 0 | | | | | | | | | 0 | | 2 | 1 | |
| | 63 | 25 | 120 | 145 | | | | | 0 | | | | | | | | | 0 | 65 | 35 | 44 | 45 |
| | 64 | 35 | 150 | 185 | 5 | | | 5 | 10 | 2 | | | | 5 | 3 | | | 10 | | | | |
| | 65 | | 250 | 250 | | 100 | | 200 | 300 | 23 | | 15 | 20 | | 20 | | | 78 | | | | |
| | 66 | | 110 | 110 | 500 | 300 | | 1200 | 2000 | 5 | 25 | | 30 | 52 | | | | 112 | | | | |
| | 67 | | 110 | 110 | 50 | | | 70 | 120 | | | | | | | | | 0 | 2 | | | |
| | 68 | 22 | 133 | 155 | | 300 | | 1200 | 1500 | | | | | | | | | 0 | | 20 | 20 | |
| | 69 | | 100 | 100 | 1000 | 250 | | | 1250 | | | | | | | | | 0 | 30 | 28 | | 30 |

TABLE 10-continued

| | | | | | | | | | | | | | | | | | |
|---|---|---|---|---|---|---|---|---|---|---|---|---|---|---|---|---|---|
| 70 | | 130 | 130 | 500 | | | 500 | 20 | | | 50 | 80 | | 150 | 25 | | |
| 71 | 118 | | 118 | | 80 | 40 | 55 | 175 | | 48 | 12 | 15 | | 75 | 22 | 17 | 15 |
| 72 | | 150 | 150 | 250 | 150 | 150 | 50 | 600 | 5 | | 45 | | 53 | 68 | 171 | 22 | 45 | 25 |
| 73 | | 50 | 50 | | | | | 0 | | | | | 8 | | 8 | | | |
| 74 | 70 | | 70 | | | | | 0 | | | | | | 250 | 250 | | | |
| 75 | | 60 | 60 | | | | | 0 | | | | | | 6 | 6 | | | |
| 76 | 15 | 35 | 50 | | | | | 0 | | | | | | 150 | 150 | | | |
| 77 | | 50 | 50 | | | | | 0 | 20 | | 20 | | | 50 | 90 | | | |
| 78 | | 100 | 100 | | | | | 0 | | | 10 | | 10 | | 20 | 40 | | |
| 79 | 50 | | 50 | | 50 | | | 50 | 10 | 20 | | | | 30 | 60 | | | |
| 80 | | 100 | 100 | 50 | | 30 | | 80 | | | | 20 | | 30 | 50 | | | |
| 81 | 20 | 50 | 70 | 50 | 50 | | 30 | 130 | | 20 | 20 | 10 | | 30 | 10 | 90 | 10 | 10 |
| 82 | | 150 | 150 | | | | | 0 | 30 | | 10 | 10 | | 10 | 10 | 20 | 90 | 20 |

| | | | | | Surface Concentrated Layer | | | | | Top Skin Layer | | Average O Concentration |
|---|---|---|---|---|---|---|---|---|---|---|---|---|---|
| | Component Concentration in Wire (Mass ppm) | | | | Mg, P Total Concentration (Mass ppm) | | | | | | | | |
| | Fourth Element Group | | | | Average Con- centration | Con- centration Ratio (Times) | Max. Con- centration | | Oxide | Other Contained Element | Film Thick- ness (nm) | Film(C Con- centration/ nm) | of Concentrated Layer and Top Skin Layer(%) |
| | Pr | Nd | Total | Cu | | | Mg | P | | | | | |
| Examples 42 | | | 0 | Remained | 0.5 | 77 | 0.6 | 0.5 | | | 2 | | 0.05 | 42 |
| 43 | | | 0 | Remained | 0.4 | 53 | 1.1 | 0.4 | ○ | | 1 | | 9.4 | 43 |
| 44 | | | 0 | Remained | 1.6 | 105 | 1.2 | 2.3 | ○ | Bi, Al | 5 | | 5 | 44 |
| 45 | | | 10 | Remained | 1 | 95 | 1 | 1.4 | ○ | | 3 | | 0.07 | 45 |
| 46 | | | 45 | Remained | 1.6 | 107 | | 3.8 | ○ | Ca | 4 | | 0.7 | 46 |
| 47 | | | 280 | Remained | 1 | 83 | | 3.5 | ○ | Cu | 5 | | 3 | 47 |
| 48 | | | 6 | Remained | 0.9 | 113 | 0.8 | 1.6 | ○ | | 2 | | 2 | 48 |
| 49 | | | 55 | Remained | 1.1 | 110 | | 2.4 | ○ | Y | 3 | | 0.3 | 49 |
| 50 | | | 5 | Remained | 0.8 | 145 | | 1.5 | | | 2 | | 0.04 | 50 |
| 51 | | | 120 | Remained | 1.2 | 98 | | 3 | ○ | | 5 | 1 | 5 | 51 |
| 52 | | | 6 | Remained | 3.2 | 137 | | 7.1 | ○ | Cu | 10 | 3 | 7 | 52 |
| 53 | | | 110 | Remained | 0.5 | 48 | 0.3 | 1.1 | | | 1 | | 0.03 | 53 |
| 54 | 7 | | 7 | Remained | 1.4 | 101 | | 3 | ○ | | 3 | | 3 | 54 |
| 55 | 225 | | 225 | Remained | 1 | 100 | 0.3 | 2.2 | ○ | | 2 | | 1 | 55 |
| 56 | | 6 | 6 | Remained | 2 | 114 | | 4.1 | ○ | Cu | 3 | | 5 | 56 |
| 57 | | 150 | 150 | Remained | 0.4 | 48 | 1.2 | 0.3 | | | 1 | | 0.04 | 57 |
| 58 | | 3 | 7 | Remained | 2 | 132 | | 3.6 | ○ | Cu | 5 | | 4 | 58 |
| 59 | 20 | 30 | 130 | Remained | 2 | 123 | 0.2 | 3.4 | ○ | Nd, Ca | 4 | | 1 | 59 |
| 60 | 15 | | 67 | Remained | 2 | 125 | 2.9 | 1 | ○ | | 6 | | 3 | 60 |
| 61 | | | 3 | Remained | 3.1 | 148 | 5.2 | | ○ | | 8 | 3 | 7 | 61 |
| 62 | 1 | | 4 | Remained | 2 | 147 | | 3.8 | ○ | | 4 | | 2 | 62 |
| 63 | 65 | 63 | 317 | Remained | 1.7 | 117 | 0.3 | 3 | ○ | Y, Ca | 4 | | 3 | 63 |
| 64 | | | 0 | Remained | 2.1 | 114 | 0.3 | 4.2 | ○ | Cu | 4 | | 6 | 64 |
| 65 | | | 0 | Remained | 5.6 | 224 | | 8.8 | ○ | Cu, Si | 12 | 4 | 12 | 65 |
| 66 | | | 0 | Remained | 2 | 182 | | 3.8 | ○ | Cu | 5 | | 4 | 66 |
| 67 | 3 | 2 | 7 | Remained | 1.2 | 109 | | 3 | ○ | Cu | 4 | | 3 | 67 |
| 68 | 20 | | 60 | Remained | 1.4 | 90 | 0.2 | 8.5 | ○ | La | 5 | | 3 | 68 |
| 69 | | 30 | 118 | Remained | 1.1 | 110 | | 2.1 | ○ | | 3 | | 0.08 | 69 |
| 70 | 35 | | 60 | Remained | 1 | 77 | | 2.8 | ○ | Cu | 4 | | 0.6 | 70 |
| 71 | | 22 | 76 | Remained | 2.1 | 178 | 2 | | | | 3 | | 4 | 71 |
| 72 | 25 | | 117 | Remained | 1 | 67 | | 3.1 | | Ge | 5 | 2 | 1 | 72 |
| 73 | | | 0 | Remained | 1.2 | 240 | | 2.5 | ○ | | 4 | | 1.2 | 73 |
| 74 | | | 0 | Remained | 1.3 | 186 | 2 | | ○ | Ir | 4 | | 2 | 74 |
| 75 | | | 0 | Remained | 0.8 | 133 | | 1.5 | | | 2 | | 0.5 | 75 |
| 76 | | | 0 | Remained | 1.1 | 220 | 0.5 | 1.3 | ○ | | 3 | | 1 | 76 |
| 77 | | | 0 | Remained | 1.3 | 260 | | 1.6 | ○ | | 2 | | 0.5 | 77 |
| 78 | | | 0 | Remained | 1.3 | 130 | | 2.3 | ○ | | 5 | 2 | 1.5 | 78 |
| 79 | | | 0 | Remained | 0.5 | 100 | 1.2 | | | | 2 | | 0.8 | 79 |
| 80 | | | 0 | Remained | 1.3 | 130 | | 1.8 | 0 | | 2 | | 1 | 80 |
| 81 | | | 20 | Remained | 1.3 | 186 | 0.8 | 1.8 | 0 | | 2 | 2 | 0.5 | 81 |
| 82 | 20 | 20 | 60 | Remained | 1.1 | 73 | | 1.8 | ○ | Be | 2 | | 0.7 | 82 |

TABLE 11

| | | Component Concentration in Wire (Mass ppm) | | | | | | | | | | | | | | | |
|---|---|---|---|---|---|---|---|---|---|---|---|---|---|---|---|---|---|
| | | First Element Group | | | Second Element Group | | | | | Third Element Group | | | | | | | |
| | | Mg | P | Total | Ag | Pd | Pt | Au | Total | Be | Al | Bi | Si | In | Ge | Ir | Mn | Total |
| Examples | 83 | 15 | | 15 | | | | | 0 | | | | | | | | | 0 |
| | 84 | | 15 | 15 | | | | | 0 | | | | | | | | | 0 |
| | 85 | 5 | 35 | 40 | | | | | 0 | | | | | | | | | 0 |
| | 86 | 20 | 10 | 30 | | 200 | | | 200 | | | | | | | | | 0 |
| | 87 | 40 | | 40 | 20 | | 20 | 50 | 90 | | | | | | | | | 0 |
| | 88 | 20 | | 20 | | | | | 0 | 20 | | | | | | | | 20 |
| | 89 | | 10 | 10 | | | | | 0 | | 20 | | | | | | | 20 |
| | 90 | | 20 | 20 | | | | | 0 | | 60 | | | | | | | 60 |
| | 91 | 10 | 10 | 20 | | | | | 0 | | | | | | 40 | | | 40 |
| | 92 | | 20 | 20 | | | | | 0 | | | | | | | | 30 | 30 |
| | 93 | 15 | 10 | 25 | | | | | 0 | | 20 | | 10 | 10 | 10 | | | 50 |
| | 94 | 5 | 10 | 15 | | | | | 0 | 10 | 20 | | | | 10 | | | 40 |
| | 95 | | 20 | 20 | | | | | 0 | | 20 | | | | | 20 | | 40 |
| | 96 | | 15 | 15 | | | | | 0 | | | | | | | | | 0 |
| | 97 | 30 | | 30 | | | | | 0 | | | | | | | | | 0 |
| | 98 | | 20 | 20 | | 100 | | | 100 | 10 | 30 | | | | | | | 40 |
| | 99 | 5 | 25 | 30 | 10 | | 50 | 50 | 110 | | 20 | | 20 | | 10 | | | 50 |
| | 100 | | 20 | 20 | 30 | 100 | | | 130 | 20 | | | | 10 | | 10 | | 40 |
| | 101 | | 30 | 30 | | | 20 | 30 | 50 | | | | | | | | | 0 |
| | 102 | 10 | 20 | 30 | 50 | 50 | | | 100 | | | | | | | | | 0 |
| | 103 | 20 | | 20 | 50 | | | 50 | 100 | 10 | | | | 10 | | | | 20 |
| | 104 | 10 | 20 | 30 | | 50 | 30 | | 80 | | 20 | | | | 10 | | | 30 |

| | | Component Concentration in Wire (Mass ppm) | | | | | | | | Surface Concentrated Layer Mg, P Total Concentration (Mass ppm) | | | |
|---|---|---|---|---|---|---|---|---|---|---|---|---|---|
| | | Fourth Element Group | | | | | | | | Average Con- | Con- centration Ratio | Max. Concentration | |
| | | Ca | Y | La | Ce | Pr | Nd | Total | Cu | centration | (Times) | Mg | P |
| Examples | 83 | | | | | | | 0 | Remained | 0.03 | 20 | 0.1 | |
| | 84 | | | | | | | 0 | Remained | 0.3 | 200 | | 0.8 |
| | 85 | | | | | | | 0 | Remained | 0.5 | 125 | 0.2 | 1 |
| | 86 | | | | | | | 0 | Remained | 0.3 | 100 | 0.3 | 0.4 |
| | 87 | | | | | | | 0 | Remained | 0.3 | 75 | 0.6 | |
| | 88 | | | | | | | 0 | Remained | 0.1 | 50 | 0.4 | |
| | 89 | | | | | | | 0 | Remained | 0.2 | 200 | | 0.4 |
| | 90 | | | | | | | 0 | Remained | 0.1 | 50 | | 0.5 |
| | 91 | | | | | | | 0 | Remained | 0.2 | 100 | 0.2 | 0.3 |
| | 92 | | | | | | | 0 | Remained | 0.2 | 100 | | 0.5 |
| | 93 | | | | | | | 0 | Remained | 0.4 | 160 | 0.4 | 0.4 |
| | 94 | | | | | | | 0 | Remained | 0.2 | 133 | 0.1 | 0.3 |
| | 95 | | | | | | | 0 | Remained | 0.07 | 35 | | 0.1 |
| | 96 | 10 | | 10 | | | | 20 | Remained | 0.4 | 267 | | 0.7 |
| | 97 | | 10 | | 20 | 20 | 10 | 60 | Remained | 0.03 | 10 | 0.2 | |
| | 98 | | | | | | | 0 | Remained | 0.2 | 100 | | 0.4 |
| | 99 | | | | | | | 0 | Remained | 0.2 | 67 | 0.1 | 0.5 |
| | 100 | | | | | | | 0 | Remained | 0.3 | 150 | | 0.5 |
| | 101 | 10 | 10 | | | 10 | | 30 | Remained | 0.5 | 167 | | 1 |
| | 102 | | 10 | | | 10 | | 20 | Remained | 0.2 | 67 | 0.3 | 0.3 |
| | 103 | | | 10 | 10 | | | 20 | Remained | 0.4 | 200 | 0.6 | |
| | 104 | 10 | | | | 10 | | 20 | Remained | 0.4 | 133 | 0.2 | 0.6 |

| | | Surface Concentrated Layer | | Top Skin Layer | Average O Concentration of |
|---|---|---|---|---|---|
| | | Oxide | Other Contained Element | Film Thickness (nm) | Film (C Concentration/ nm) | Concentrated Layer and Top Skin Layer (%) |
| Examples | 83 | | | 2 | | 0.05 | 83 |
| | 84 | | | 2 | | 0.2 | 84 |
| | 85 | ○ | | 2 | | 1 | 85 |
| | 86 | ○ | | 3 | 1 | 0.3 | 86 |
| | 87 | ○ | | 1 | | 0.7 | 87 |
| | 88 | | | 2 | | 0.2 | 88 |
| | 89 | | | 1 | | 0.07 | 89 |
| | 90 | | | 1 | | 0.1 | 90 |
| | 91 | | | 2 | | 0.08 | 91 |

TABLE 11-continued

| | | | | | |
|---|---|---|---|---|---|
| 92 | | 2 | | 0.3 | 92 |
| 93 | | 2 | | 0.2 | 93 |
| 94 | | 1 | | 0.08 | 94 |
| 95 | | 2 | | 0.15 | 95 |
| 96 | ○ | 3 | 2 | 0.3 | 96 |
| 97 | | 2 | | 0.1 | 97 |
| 98 | | 2 | | 0.6 | 98 |
| 99 | ○ | 2 | | 0.3 | 99 |
| 100 | | 2 | 2 | 0.2 | 100 |
| 101 | | 2 | | 0.2 | 101 |
| 102 | | 1 | | 0.3 | 102 |
| 103 | | 2 | | 0.2 | 103 |
| 104 | | 2 | | 1 | 104 |

TABLE 12

| | | Component Concentration in Wire (Mass ppm) | | | | | | | | | | | | | | | | |
|---|---|---|---|---|---|---|---|---|---|---|---|---|---|---|---|---|---|---|
| | | First Element Group | | | Second Element Group | | | | | Third Element Group | | | | | | | | |
| | | Mg | P | Total | Ag | Pd | Pt | Au | Total | Be | Al | Bi | Si | In | Ge | Ir | Mn | Total |
| Comparative Examples | 1 | 70 | | 70 | | | | | 0 | | | | | | | | | 0 |
| | 2 | | 70 | 70 | | | | | 0 | | | | | | | | | 0 |
| | 3 | 80 | | 80 | | | | | 0 | | | | | | | | | 0 |
| | 4 | | 150 | 150 | | | | | 0 | | | | | | | | | 0 |
| | 5 | | | 0 | | | | | 0 | | | | | | | | | 0 |
| | 6 | | 5 | 5 | | | | | 0 | | | | | | | | | 0 |
| | 7 | 3 | 2 | 5 | | | | | 0 | | | | | | | | | 0 |
| | 8 | 750 | | 750 | | | | | 0 | | | | | | | | | 0 |
| | 9 | | 900 | 900 | | | | | 0 | | | | | | | | | 0 |
| | 10 | 3 | | 3 | 50 | 200 | | 20 | 270 | | | | | | | | | 0 |
| | 11 | 35 | 43 | 78 | 1100 | | 150 | | 1250 | | | | | | | | | 0 |
| | 12 | | 7 | 7 | | | | | 0 | 20 | | 15 | 10 | | 10 | | | 55 |
| | 13 | 110 | | 110 | | | | | 0 | | 25 | | 25 | | 10 | | | 60 |
| | 14 | 3 | 2 | 5 | | | | | 0 | | | | | | | | | 0 |
| | 15 | | 55 | 55 | | | | | 0 | | | | | | | | | 0 |
| | 16 | 2 | 5 | 7 | 1250 | | 330 | | 1580 | 15 | 30 | | 20 | | | | | 65 |
| | 17 | | 55 | 55 | | 220 | | 150 | 370 | | | | | | | | | 0 |
| | 18 | 2 | 3 | 5 | 200 | 100 | | | 300 | | 20 | | | | 20 | | 20 | 60 |

| | | Component Concentration in Wire (Mass ppm) | | | | | | | Surface Concentrated Layer Mg, P Total Concentration (Mass ppm) | | |
|---|---|---|---|---|---|---|---|---|---|---|---|---|
| | | Fourth Element Group | | | | | | | Average | Concentration | Max. Concentration | |
| | | Ca | Y | La | Ce | Pr | Nd | Total | Cu | Concentration | Ratio (Times) | Mg | P |
| Comparative Examples | 1 | | | | | | | 0 | Remained | | 0 | | |
| | 2 | | | | | | | 0 | Remained | | 0 | | |
| | 3 | | | | | | | 0 | Remained | | 0 | | |
| | 4 | | | | | | | 0 | Remained | | 0 | | |
| | 5 | | | | | | | 0 | Remained | — | | | |
| | 6 | | | | | | | 0 | Remained | | 0 | | |
| | 7 | | | | | | | 0 | Remained | | 0 | | |
| | 8 | | | | | | | 0 | Remained | 12 | 160 | 25 | |
| | 9 | | | | | | | 0 | Remained | 1.3 | 14 | | 23 |
| | 10 | | | | | | | 0 | Remained | | 0 | | |
| | 11 | | | | | | | 0 | Remained | 0.02 | 3 | | |
| | 12 | | | | | | | 0 | Remained | | 0 | | 0.3 |
| | 13 | | | | | | | 0 | Remained | 0.08 | 7 | 0.5 | |
| | 14 | 20 | | 20 | | | 15 | 55 | Remained | 0.01 | 20 | | |
| | 15 | | 12 | | 22 | 20 | | 54 | Remained | 0.02 | 4 | | 0.4 |
| | 16 | | | | | | | 0 | Remained | 0.02 | 29 | | |

TABLE 12-continued

| | | | | | | | | | | |
|---|---|---|---|---|---|---|---|---|---|---|
| 17 | | 25 | 12 | | 25 | | 62 | Remained | 0.02 | 4 | 0.1 | 0.2 |
| 18 | 30 | | | 30 | | 20 | 80 | Remained | 0.02 | 40 | | |

| | | Surface Concentrated Layer | | | Top Skin Layer | Average O Concentration of |
|---|---|---|---|---|---|---|
| | | Oxide | Other Contained Element | Film Thickness (nm) | Film (C Concentration/nm) | Concentrated Layer and Top Skin Layer (%) |
| Comparative Examples | 1 | | | | | <0.01 | 1 |
| | 2 | | | | | <0.01 | 2 |
| | 3 | | | | | <0.01 | 3 |
| | 4 | | | | | <0.01 | 4 |
| | 5 | | | | | <0.01 | 5 |
| | 6 | | | | | <0.01 | 6 |
| | 7 | | | | | <0.01 | 7 |
| | 8 | ○ | | | | 25 | 8 |
| | 9 | ○ | | | | 27 | 9 |
| | 10 | | | | | <0.01 | 10 |
| | 11 | | | | | <0.01 | 11 |
| | 12 | | | | | <0.01 | 12 |
| | 13 | | | | | <0.01 | 13 |
| | 14 | | | | | <0.01 | 14 |
| | 15 | | | | | <0.01 | 15 |
| | 16 | | | | | <0.01 | 16 |
| | 17 | | | | | <0.01 | 17 |
| | 18 | | | | | <0.01 | 18 |

Evaluation results for the mechanical characteristics, bonding performance, and the like of copper-alloy bonding wires having the compositions shown in the tables 1 to 3 are indicated in tables 13 to 16.

TABLE 13

| | | Wire Diameter/μm | Tensile Strength/MPa | Elongation/% | Ball Formation | | Ball Joining Shape | | | Successive Ball Joining | Low-Temp. Share Joining Strength |
|---|---|---|---|---|---|---|---|---|---|---|---|
| | | | | | Ball Misalignment | Ball Surface | Petal Deformation | Elliptic Deformation | Misaligned Deformation | | |
| Examples | 1 | 50 | 210 | 18 | ○ | ◎ | ○ | ○ | ○ | ◎ | ○ |
| | 2 | 50 | 208 | 19 | ○ | ◎ | ○ | ○ | ○ | ◎ | ○ |
| | 3 | 25 | 210 | 13 | ○ | ◎ | ○ | ○ | ○ | ◎ | ○ |
| | 4 | 50 | 207 | 18 | ○ | ◎ | ○ | ○ | ○ | ◎ | ○ |
| | 5 | 50 | 212 | 18 | ○ | ◎ | ○ | ○ | ○ | ◎ | ○ |
| | 6 | 25 | 225 | 12 | ○ | ◎ | ○ | ○ | ○ | ○ | ○ |
| | 7 | 25 | 210 | 10 | ○ | ◎ | ○ | ○ | ○ | ◎ | ○ |
| | 8 | 50 | 226 | 20 | ○ | ◎ | ○ | ○ | ◎ | ○ | ○ |
| | 9 | 50 | 210 | 18 | ◎ | ◎ | ○ | ○ | ◎ | ◎ | ◎ |
| | 10 | 20 | 220 | 8 | ◎ | ◎ | ○ | ○ | ◎ | ◎ | ◎ |
| | 11 | 50 | 217 | 19 | ◎ | ◎ | ○ | ○ | ◎ | ◎ | ◎ |
| | 12 | 25 | 208 | 12 | ◎ | ◎ | ○ | ○ | ◎ | ◎ | ◎ |
| | 13 | 75 | 212 | 23 | ◎ | ◎ | ○ | ○ | ◎ | ◎ | ◎ |
| | 14 | 25 | 225 | 11 | ◎ | ◎ | ○ | ○ | ◎ | ◎ | ◎ |
| | 15 | 25 | 214 | 12 | ◎ | ◎ | ○ | ○ | ◎ | ◎ | ◎ |
| | 16 | 50 | 215 | 19 | ◎ | ◎ | ○ | ○ | ◎ | ◎ | ◎ |
| | 17 | 50 | 211 | 20 | ◎ | ◎ | ○ | ○ | ◎ | ○ | ◎ |
| | 18 | 50 | 226 | 19 | ◎ | ◎ | ○ | ○ | ◎ | ◎ | ◎ |
| | 19 | 25 | 210 | 12 | ◎ | ◎ | ○ | ○ | ◎ | ◎ | ◎ |
| | 20 | 25 | 213 | 14 | ◎ | ◎ | ○ | ○ | ◎ | ◎ | ◎ |
| | 21 | 25 | 206 | 12 | ○ | ◎ | ○ | ○ | ○ | ◎ | ○ |
| | 22 | 20 | 208 | 8 | ○ | ◎ | ○ | ○ | ○ | ◎ | ○ |
| | 23 | 50 | 225 | 19 | ○ | ◎ | ○ | ○ | ○ | Δ | ○ |
| | 24 | 25 | 261 | 11 | ○ | ◎ | ◎ | ○ | ○ | ◎ | ○ |
| | 25 | 25 | 257 | 12 | ○ | ◎ | ◎ | ○ | ○ | ◎ | ○ |
| | 26 | 25 | 253 | 13 | ○ | ◎ | ◎ | ○ | ○ | ◎ | ○ |
| | 27 | 20 | 268 | 7 | ○ | ◎ | ◎ | ○ | ○ | ◎ | ○ |
| | 28 | 25 | 266 | 12 | ○ | ◎ | ◎ | ○ | ○ | ◎ | ○ |
| | 29 | 25 | 257 | 12 | ○ | ◎ | ◎ | ○ | ○ | ◎ | ○ |
| | 30 | 25 | 262 | 11 | ○ | ◎ | ◎ | ○ | ○ | ◎ | ○ |
| | 31 | 25 | 254 | 13 | ○ | ◎ | ◎ | ○ | ○ | ◎ | ○ |
| | 32 | 50 | 255 | 18 | ○ | ◎ | ◎ | ○ | ○ | ◎ | ○ |
| | 33 | 50 | 255 | 18 | ○ | ○ | ◎ | ○ | ○ | ○ | ○ |

TABLE 13-continued

| | | | | | | | | | | |
|---|---|---|---|---|---|---|---|---|---|---|
| 34 | 50 | 259 | 19 | ○ | ◎ | ◎ | ○ | ○ | ◎ | ○ |
| 35 | 15 | 266 | 6  | ○ | ◎ | ◎ | ○ | ○ | ◎ | ○ |
| 36 | 25 | 257 | 12 | ○ | ○ | ◎ | ○ | ○ | ○ | ○ |
| 37 | 25 | 260 | 10 | ○ | ◎ | ◎ | ○ | ○ | ◎ | ○ |
| 38 | 25 | 255 | 11 | ○ | ◎ | ◎ | ○ | ○ | ◎ | ○ |
| 39 | 25 | 260 | 12 | ○ | ◎ | ◎ | ○ | ○ | ◎ | ○ |
| 40 | 25 | 257 | 12 | ○ | ◎ | ◎ | ○ | ○ | ◎ | ○ |
| 41 | 25 | 255 | 12 | ○ | ◎ | ◎ | ○ | ○ | ◎ | ○ |

| | | | Loop Control | | Scratch, Scraping | Low-Height | Neck Portion | Capillary Leading | | Within 3 days After Manufactured | | 30 days After Manufactured Wedge | |
|---|---|---|---|---|---|---|---|---|---|---|---|---|---|
| | | | | | | | | | | Wedge | Low-Temp. Joining | | |
| | | Chip Damage | Linearity | Height Stability | of Loop Surface | Loop Characteristic | Pull Strength | End Dirt | | Joining Characteristic | Peel Strength | Joining Characteristic | |
| Examples | 1  | ◎ | ○ | ○ | ○ | ○ | ◎ | ○ | | ◎ | ○ | ◎ | 1 |
|          | 2  | ◎ | ○ | ○ | ○ | ◎ | ◎ | ○ | | ◎ | ○ | ◎ | 2 |
|          | 3  | ◎ | ○ | ○ | ◎ | ○ | ◎ | ◎ | | ◎ | ◎ | ◎ | 3 |
|          | 4  | ◎ | ○ | ○ | ○ | ○ | ◎ | ◎ | | ◎ | ○ | ◎ | 4 |
|          | 5  | ◎ | ○ | ○ | ◎ | ○ | ◎ | ◎ | | ◎ | ○ | ◎ | 5 |
|          | 6  | ◎ | ○ | ○ | ○ | ○ | ◎ | ◎ | | ◎ | ○ | ◎ | 6 |
|          | 7  | ◎ | ○ | ○ | ○ | ○ | ◎ | ◎ | | ◎ | ○ | ◎ | 7 |
|          | 8  | ◎ | ○ | ○ | ○ | ○ | ◎ | ○ | | ◎ | ○ | ◎ | 8 |
|          | 9  | ◎ | ○ | ○ | ○ | ○ | ◎ | ○ | | ◎ | ○ | ○ | 9 |
|          | 10 | ◎ | ○ | ○ | ○ | ◎ | ◎ | ◎ | | ◎ | ○ | ◎ | 10 |
|          | 11 | ◎ | ○ | ○ | ○ | ○ | ◎ | ◎ | | ◎ | ○ | ◎ | 11 |
|          | 12 | ◎ | ○ | ○ | ○ | ○ | ◎ | ◎ | | ◎ | ○ | ◎ | 12 |
|          | 13 | ◎ | ○ | ○ | ○ | ○ | ◎ | ◎ | | ◎ | ○ | ◎ | 13 |
|          | 14 | ◎ | ○ | ○ | ○ | ○ | ◎ | ○ | | ◎ | ○ | ◎ | 14 |
|          | 15 | ◎ | ○ | ○ | ◎ | ○ | ◎ | ◎ | | ◎ | ○ | ◎ | 15 |
|          | 16 | ◎ | ○ | ○ | ○ | ◎ | ◎ | ○ | | ◎ | ○ | ◎ | 16 |
|          | 17 | ◎ | ○ | ○ | ◎ | ◎ | ○ | ◎ | | ○ | ○ | ○ | 17 |
|          | 18 | ◎ | ○ | ○ | ○ | ○ | ◎ | ◎ | | ◎ | ○ | ◎ | 18 |
|          | 19 | ◎ | ○ | ○ | ○ | ○ | ◎ | ◎ | | ◎ | ○ | ◎ | 19 |
|          | 20 | ◎ | ○ | ○ | ○ | ○ | ◎ | ○ | | ◎ | ○ | ◎ | 20 |
|          | 21 | ◎ | ○ | ○ | ○ | ○ | ◎ | ○ | | ◎ | ○ | ◎ | 21 |
|          | 22 | ◎ | ○ | ○ | ○ | ○ | ◎ | ○ | | ◎ | ○ | ◎ | 22 |
|          | 23 | Δ | ○ | ○ | ◎ | ◎ | ◎ | ◎ | | ◎ | ○ | ◎ | 23 |
|          | 24 | ◎ | ○ | ○ | ○ | ◎ | ◎ | ◎ | | ◎ | ◎ | ◎ | 24 |
|          | 25 | ◎ | ○ | ○ | ○ | ◎ | ◎ | ◎ | | ◎ | ◎ | ◎ | 25 |
|          | 26 | ◎ | ○ | ○ | ○ | ○ | ◎ | ○ | | ◎ | ○ | ◎ | 26 |
|          | 27 | ◎ | ○ | ○ | ◎ | ○ | ◎ | ◎ | | ◎ | ◎ | ◎ | 27 |
|          | 28 | ◎ | ○ | ○ | ○ | ○ | ◎ | ○ | | ◎ | ○ | ◎ | 28 |
|          | 29 | ◎ | ○ | ○ | ◎ | ◎ | ◎ | ◎ | | ◎ | ◎ | ◎ | 29 |
|          | 30 | ◎ | ○ | ○ | ○ | ○ | ◎ | ◎ | | ◎ | ○ | ○ | 30 |
|          | 31 | ◎ | ○ | ○ | ○ | ○ | ◎ | ◎ | | ◎ | ◎ | ◎ | 31 |
|          | 32 | ◎ | ○ | ○ | ○ | ○ | ◎ | ◎ | | ◎ | ◎ | ◎ | 32 |
|          | 33 | ◎ | ○ | ○ | ○ | ○ | ◎ | ◎ | | ○ | ○ | ◎ | 33 |
|          | 34 | ◎ | ○ | ○ | ○ | ○ | ○ | ○ | | ◎ | ◎ | ○ | 34 |
|          | 35 | ◎ | ○ | ○ | ○ | ○ | ◎ | ○ | | ◎ | ◎ | ◎ | 35 |
|          | 36 | ◎ | ○ | ○ | ○ | ○ | ◎ | ◎ | | ○ | ○ | ◎ | 36 |
|          | 37 | ◎ | ○ | ○ | ○ | ◎ | ◎ | ◎ | | ◎ | ○ | ◎ | 37 |
|          | 38 | ◎ | ○ | ○ | ○ | ◎ | ◎ | ○ | | ◎ | ○ | ◎ | 38 |
|          | 39 | ◎ | ○ | ○ | ○ | ○ | ◎ | ◎ | | ◎ | ○ | ◎ | 39 |
|          | 40 | ◎ | ○ | ○ | ◎ | ◎ | ◎ | ◎ | | ◎ | ◎ | ◎ | 40 |
|          | 41 | ◎ | ○ | ○ | ◎ | ○ | ◎ | ◎ | | ◎ | ○ | ◎ | 41 |

TABLE 14

| | | Wire Diameter/μm | Tensile Strength/MPa | Elongation/% | Ball Formation | | Ball Joining Shape | | | Successive Ball Joining | Low-Temp. Share Joining Strength |
|---|---|---|---|---|---|---|---|---|---|---|---|
| | | | | | Ball Misalignment | Ball Surface | Petal Deformation | Elliptic Deformation | Misaligned Deformation | | |
| Examples | 42 | 25 | 218 | 9  | ○ | ◎ | ○ | ○ | ○ | ◎ | ○ |
|          | 43 | 25 | 225 | 9  | ○ | ◎ | ○ | ○ | ○ | ◎ | ○ |
|          | 44 | 25 | 265 | 12 | ○ | ○ | ○ | ◎ | ○ | Δ | ○ |
|          | 45 | 25 | 210 | 12 | ○ | ◎ | ○ | ◎ | ○ | ◎ | ○ |
|          | 46 | 30 | 213 | 15 | ○ | ◎ | ○ | ◎ | ○ | ◎ | ○ |
|          | 47 | 50 | 209 | 18 | ○ | ◎ | ○ | ◎ | ○ | ◎ | ○ |
|          | 48 | 25 | 210 | 13 | ○ | ◎ | ○ | ◎ | ○ | ◎ | ○ |

TABLE 14-continued

| | | | | | | | | | | |
|---|---|---|---|---|---|---|---|---|---|---|
| 49 | 25 | 210 | 11 | ○ | ◎ | ○ | ◎ | ○ | ◎ | ○ |
| 50 | 50 | 204 | 19 | ○ | ◎ | ○ | ◎ | ○ | ◎ | ○ |
| 51 | 25 | 217 | 12 | ○ | ◎ | ○ | ◎ | ○ | ◎ | ○ |
| 52 | 25 | 208 | 13 | ○ | ◎ | ○ | ◎ | ○ | ◎ | ○ |
| 53 | 50 | 216 | 19 | ○ | ◎ | ○ | ◎ | ○ | ◎ | ○ |
| 54 | 25 | 214 | 12 | ○ | ◎ | ○ | ◎ | ○ | ◎ | ○ |
| 55 | 50 | 213 | 18 | ○ | ◎ | ○ | ◎ | ○ | ○ | ○ |
| 56 | 25 | 214 | 11 | ○ | ◎ | ○ | ◎ | ○ | ◎ | ○ |
| 57 | 25 | 218 | 11 | ○ | ◎ | ○ | ◎ | ○ | ◎ | ○ |
| 58 | 50 | 211 | 18 | ○ | ◎ | ○ | ◎ | ○ | ◎ | ○ |
| 59 | 20 | 222 | 8 | ○ | ◎ | ○ | ◎ | ○ | ◎ | ○ |
| 60 | 25 | 216 | 12 | ○ | ◎ | ○ | ◎ | ○ | ◎ | ○ |
| 61 | 50 | 211 | 19 | ○ | ◎ | ○ | ○ | ○ | ◎ | ○ |
| 62 | 25 | 219 | 10 | ○ | ◎ | ○ | ○ | ○ | ◎ | ○ |
| 63 | 25 | 230 | 12 | ○ | Δ | ○ | ○ | ○ | Δ | ○ |
| 64 | 25 | 260 | 12 | ◎ | ◎ | ◎ | ○ | ◎ | ◎ | ◎ |
| 65 | 20 | 264 | 7 | ◎ | ◎ | ◎ | ○ | ◎ | ◎ | ◎ |
| 66 | 25 | 272 | 12 | ◎ | ◎ | ◎ | ○ | ◎ | ◎ | ◎ |
| 67 | 50 | 220 | 19 | ◎ | ◎ | ○ | ◎ | ◎ | ◎ | ◎ |
| 68 | 20 | 223 | 8 | ◎ | ◎ | ○ | ◎ | ◎ | ◎ | ◎ |
| 69 | 25 | 225 | 11 | ◎ | ◎ | ○ | ◎ | ◎ | ◎ | ◎ |
| 70 | 25 | 260 | 12 | ◎ | ◎ | ◎ | ◎ | ◎ | ◎ | ◎ |
| 71 | 50 | 264 | 20 | ◎ | ◎ | ◎ | ◎ | ◎ | ◎ | ◎ |
| 72 | 25 | 268 | 12 | ◎ | ◎ | ◎ | ◎ | ◎ | ◎ | ◎ |
| 73 | 25 | 253 | 12 | ○ | ◎ | ◎ | ○ | ○ | ◎ | ○ |
| 74 | 30 | 268 | 14 | ○ | ○ | ◎ | ○ | ○ | ○ | ○ |
| 75 | 20 | 251 | 9 | ○ | ◎ | ○ | ○ | ○ | ◎ | ○ |
| 76 | 50 | 267 | 18 | ○ | ◎ | ○ | ○ | ○ | ◎ | ○ |
| 77 | 25 | 258 | 13 | ○ | ◎ | ○ | ○ | ○ | ◎ | ○ |
| 78 | 25 | 260 | 12 | ○ | ◎ | ○ | ○ | ○ | ◎ | ○ |
| 79 | 25 | 262 | 10 | ◎ | ◎ | ◎ | ○ | ◎ | ◎ | ◎ |
| 80 | 25 | 259 | 13 | ◎ | ◎ | ◎ | ○ | ◎ | ◎ | ◎ |
| 81 | 25 | 264 | 11 | ◎ | ◎ | ◎ | ○ | ◎ | ◎ | ◎ |
| 82 | 25 | 263 | 10 | ◎ | ◎ | ◎ | ◎ | ◎ | ◎ | ◎ |

| | | Chip Damage | Loop Control | | Scratch, Scraping of Loop Surface | Low-Height Loop Characteristic | Neck Portion Pull Strength | Capillary Leading End Dirt | Within 3 days After Manufactured | | 30 days After Manufactured Wedge Joining Characteristic |
|---|---|---|---|---|---|---|---|---|---|---|---|
| | | | Linearity | Height Stability | | | | | Wedge Joining Characteristic | Low-Temp. Joining Peel Strength | |
| Examples | 42 | ◎ | ○ | ○ | ○ | ○ | ◎ | ○ | ◎ | ○ | ◎ |
| | 43 | ◎ | ○ | ○ | ○ | ○ | ◎ | ○ | ◎ | ○ | ◎ |
| | 44 | Δ | ○ | ○ | ○ | ◎ | ◎ | ○ | ○ | Δ | ◎ |
| | 45 | ◎ | ○ | ○ | ○ | ◎ | ◎ | ○ | ◎ | ◎ | ◎ |
| | 46 | ◎ | ○ | ○ | ○ | ◎ | ◎ | ○ | ◎ | ◎ | ◎ |
| | 47 | ◎ | ○ | ○ | ○ | ◎ | ◎ | ○ | ◎ | ◎ | ◎ |
| | 48 | ◎ | ○ | ○ | ○ | ◎ | ◎ | ○ | ◎ | ◎ | ◎ |
| | 49 | ◎ | ○ | ○ | ○ | ◎ | ◎ | ○ | ◎ | ○ | ◎ |
| | 50 | ◎ | ○ | ○ | ○ | ◎ | ◎ | ○ | ◎ | ○ | ◎ |
| | 51 | ◎ | ○ | ○ | ◎ | ◎ | ◎ | ○ | ◎ | ○ | ◎ |
| | 52 | ◎ | ○ | ○ | ◎ | ◎ | ◎ | ○ | ◎ | ○ | ◎ |
| | 53 | ◎ | ○ | ○ | ○ | ◎ | ◎ | ○ | ◎ | ○ | ◎ |
| | 54 | ◎ | ○ | ○ | ○ | ◎ | ◎ | ○ | ◎ | ○ | ◎ |
| | 55 | ◎ | ○ | ○ | ○ | ◎ | ◎ | ○ | ○ | ○ | ◎ |
| | 56 | ◎ | ○ | ○ | ○ | ◎ | ◎ | ○ | ◎ | ◎ | ◎ |
| | 57 | ◎ | ○ | ○ | ○ | ◎ | ◎ | ○ | ◎ | ○ | ◎ |
| | 58 | ◎ | ○ | ○ | ○ | ◎ | ◎ | ○ | ◎ | ◎ | ◎ |
| | 59 | ◎ | ○ | ○ | ○ | ◎ | ◎ | ○ | ◎ | ○ | ◎ |
| | 60 | ◎ | ○ | ○ | ○ | ◎ | ◎ | ○ | ◎ | ◎ | ◎ |
| | 61 | ◎ | ○ | ○ | ◎ | ◎ | ◎ | ○ | ◎ | ○ | ◎ |
| | 62 | ◎ | ○ | ○ | ○ | ◎ | ◎ | ○ | ◎ | ○ | ◎ |
| | 63 | Δ | ○ | ○ | ○ | ◎ | ◎ | ○ | ○ | Δ | ◎ |
| | 64 | ◎ | ◎ | ○ | ○ | ◎ | ◎ | ○ | ◎ | ◎ | ◎ |
| | 65 | ◎ | ◎ | ○ | ◎ | ◎ | ◎ | ○ | ◎ | ◎ | ○ |
| | 66 | ◎ | ◎ | ○ | ◎ | ◎ | ◎ | ○ | ◎ | ◎ | ◎ |
| | 67 | ◎ | ○ | ◎ | ○ | ◎ | ◎ | ◎ | ◎ | ○ | ◎ |
| | 68 | ◎ | ○ | ◎ | ○ | ◎ | ◎ | ○ | ◎ | ○ | ◎ |
| | 69 | ◎ | ○ | ◎ | ○ | ◎ | ◎ | ○ | ○ | ○ | ◎ |
| | 70 | ◎ | ◎ | ◎ | ○ | ◎ | ◎ | ◎ | ◎ | ◎ | ◎ |
| | 71 | ◎ | ◎ | ◎ | ◎ | ◎ | ◎ | ◎ | ◎ | ○ | ◎ |
| | 72 | ◎ | ◎ | ◎ | ◎ | ◎ | ◎ | ◎ | ◎ | ○ | ◎ |
| | 73 | ◎ | ○ | ○ | ○ | ○ | ◎ | ◎ | ◎ | ○ | ◎ |
| | 74 | ◎ | ○ | ○ | ○ | ○ | ◎ | ◎ | ◎ | ○ | ◎ |
| | 75 | ◎ | ○ | ○ | ○ | ◎ | ◎ | ◎ | ◎ | ○ | ◎ |
| | 76 | ◎ | ○ | ○ | ○ | ○ | ◎ | ◎ | ◎ | ○ | ◎ |

TABLE 14-continued

| | | | | | | | | | | | | |
|---|---|---|---|---|---|---|---|---|---|---|---|---|
| 77 | ◎ | ○ | ○ | ○ | ○ | ◎ | ◎ | ◎ | ◎ | ◎ | 77 |
| 78 | ◎ | ○ | ○ | ◎ | ○ | ◎ | ◎ | ◎ | ◎ | ◎ | 78 |
| 79 | ◎ | ◎ | ○ | ○ | ◎ | ◎ | ○ | ◎ | ◎ | ◎ | 79 |
| 80 | ◎ | ◎ | ○ | ○ | ◎ | ◎ | ◎ | ◎ | ◎ | ◎ | 80 |
| 81 | ◎ | ◎ | ◎ | ◎ | ◎ | ◎ | ◎ | ◎ | ◎ | ◎ | 81 |
| 82 | ◎ | ◎ | ◎ | ○ | ◎ | ◎ | ◎ | ◎ | ◎ | ◎ | 82 |

TABLE 15

| | | Wire Diameter/ μm | Tensile Strength/ MPa | Elongation/% | Ball Formation | | Ball Joining Shape | | | | Low-Temp. Share Joining Strength |
|---|---|---|---|---|---|---|---|---|---|---|---|
| | | | | | Ball Misalignment | Ball Surface | Petal De-formation | Elliptic De-formation | Misaligned De-formation | Successive Ball Joining | |
| Examples | 83 | 25 | 216 | 12 | ○ | ◎ | ○ | ○ | ○ | ◎ | ○ |
| | 84 | 25 | 220 | 11 | ○ | ◎ | ○ | ○ | ○ | ◎ | ○ |
| | 85 | 30 | 218 | 15 | ○ | ◎ | ○ | ○ | ○ | ○ | ○ |
| | 86 | 20 | 222 | 9 | ◎ | ◎ | ○ | ○ | ◎ | ◎ | ◎ |
| | 87 | 25 | 226 | 12 | ○ | ◎ | ○ | ○ | ◎ | ◎ | ◎ |
| | 88 | 25 | 262 | 12 | ○ | ◎ | ◎ | ○ | ○ | ◎ | ○ |
| | 89 | 30 | 263 | 15 | ○ | ◎ | ◎ | ○ | ○ | ◎ | ○ |
| | 90 | 25 | 265 | 12 | ○ | ◎ | ◎ | ○ | ○ | ◎ | ○ |
| | 91 | 25 | 264 | 13 | ○ | ◎ | ◎ | ○ | ○ | ◎ | ○ |
| | 92 | 50 | 255 | 20 | ○ | ◎ | ◎ | ○ | ○ | ◎ | ○ |
| | 93 | 23 | 260 | 11 | ○ | ◎ | ◎ | ○ | ○ | ◎ | ○ |
| | 94 | 25 | 265 | 13 | ○ | ◎ | ◎ | ○ | ○ | ◎ | ○ |
| | 95 | 25 | 258 | 12 | ○ | ◎ | ◎ | ○ | ○ | ◎ | ○ |
| | 96 | 30 | 225 | 15 | ○ | ◎ | ○ | ◎ | ○ | ◎ | ○ |
| | 97 | 25 | 227 | 11 | ○ | ◎ | ○ | ◎ | ○ | ◎ | ○ |
| | 98 | 25 | 263 | 12 | ◎ | ◎ | ◎ | ○ | ◎ | ◎ | ◎ |
| | 99 | 50 | 257 | 18 | ◎ | ◎ | ◎ | ○ | ○ | ◎ | ◎ |
| | 100 | 25 | 262 | 11 | ◎ | ◎ | ◎ | ○ | ◎ | ◎ | ◎ |
| | 101 | 25 | 218 | 12 | ◎ | ◎ | ○ | ◎ | ◎ | ◎ | ◎ |
| | 102 | 25 | 226 | 11 | ◎ | ◎ | ○ | ◎ | ◎ | ◎ | ◎ |
| | 103 | 25 | 254 | 11 | ◎ | ◎ | ◎ | ◎ | ◎ | ◎ | ◎ |
| | 104 | 20 | 256 | 9 | ◎ | ◎ | ◎ | ◎ | ◎ | ◎ | ◎ |

| | | Chip Damage | Loop Control | | Scratch, Scraping of Loop Surface | Low-Height Loop Characteristic | Neck Portion Pull Strength | Capillary Leading End Dirt | Within 3 days After Manufactured Wedge Joining Characteristic | Low-Temp. Joining Peel Strength | 30 days After Manufactured Wedge Joining Characteristic | |
|---|---|---|---|---|---|---|---|---|---|---|---|---|
| | | | Linearity | Height Stability | | | | | | | | |
| Examples | 83 | ◎ | ○ | △ | ○ | ○ | ○ | ○ | ○ | ○ | ○ | 83 |
| | 84 | ◎ | ○ | △ | ○ | ○ | ◎ | ○ | ◎ | ○ | ◎ | 84 |
| | 85 | ◎ | ○ | △ | ○ | ○ | ◎ | ◎ | ◎ | ◎ | ◎ | 85 |
| | 86 | ◎ | ○ | △ | ◎ | ○ | ◎ | ◎ | ◎ | ◎ | ◎ | 86 |
| | 87 | ◎ | ○ | △ | ○ | ○ | ◎ | ◎ | ◎ | ◎ | ◎ | 87 |
| | 88 | ◎ | ○ | △ | ○ | ○ | ◎ | ○ | ◎ | ◎ | ○ | 88 |
| | 89 | ◎ | ○ | △ | ○ | ○ | ◎ | ○ | ◎ | ◎ | ○ | 89 |
| | 90 | ◎ | ○ | △ | ○ | ○ | ◎ | ○ | ◎ | ◎ | ○ | 90 |
| | 91 | ◎ | ○ | △ | ○ | ○ | ◎ | ○ | ◎ | ◎ | ○ | 91 |
| | 92 | ◎ | ○ | △ | ○ | ○ | ◎ | ○ | ◎ | ◎ | ◎ | 92 |
| | 93 | ◎ | ○ | △ | ○ | ○ | ◎ | ○ | ◎ | ◎ | ◎ | 93 |
| | 94 | ◎ | ○ | △ | ○ | ○ | ◎ | ○ | ◎ | ◎ | ◎ | 94 |
| | 95 | ◎ | ○ | △ | ○ | ○ | ◎ | ○ | ◎ | ◎ | ○ | 95 |
| | 96 | ◎ | ○ | △ | ◎ | ◎ | ◎ | ◎ | ◎ | ◎ | ◎ | 96 |
| | 97 | ◎ | ○ | △ | ○ | ◎ | ◎ | ○ | ○ | ◎ | ○ | 97 |
| | 98 | ◎ | ◎ | △ | ◎ | ◎ | ◎ | ○ | ◎ | ◎ | ○ | 98 |
| | 99 | ◎ | ◎ | △ | ○ | ◎ | ◎ | ◎ | ◎ | ◎ | ◎ | 99 |
| | 100 | ◎ | ◎ | △ | ◎ | ◎ | ◎ | ○ | ◎ | ◎ | ○ | 100 |
| | 101 | ◎ | ◎ | ◎ | ○ | ◎ | ◎ | ○ | ◎ | ◎ | ◎ | 101 |
| | 102 | ◎ | ◎ | ◎ | ○ | ◎ | ◎ | ○ | ◎ | ◎ | ◎ | 102 |
| | 103 | ◎ | ◎ | ◎ | ○ | ◎ | ◎ | ○ | ◎ | ◎ | ◎ | 103 |
| | 104 | ◎ | ◎ | ◎ | ○ | ◎ | ◎ | ○ | ◎ | ◎ | ◎ | 104 |

TABLE 16

| | | Wire Diameter/μm | Tensile Strength/MPa | Elongation/% | Ball Formation | | Ball Joining Shape | | | Low-Temp. Share Joining Strength |
|---|---|---|---|---|---|---|---|---|---|---|
| | | | | | Ball Misalignment | Ball Surface | Petal De-formation | Elliptic De-formation | Misaligned De-formation | Successive Ball Joining | |
| Comparative Examples | 1 | 25 | 203 | 10 | △ | ⊚ | X | X | X | ⊚ | ○ |
| | 2 | 25 | 206 | 11 | △ | ⊚ | X | X | X | ⊚ | ○ |
| | 3 | 25 | 210 | 12 | △ | ○ | △ | △ | △ | ○ | X |
| | 4 | 25 | 209 | 11 | △ | ○ | △ | △ | △ | ○ | X |
| | 5 | 50 | 194 | 16 | △ | ⊚ | X | X | X | ⊚ | ○ |
| | 6 | 25 | 210 | 10 | △ | ⊚ | X | X | X | ⊚ | ○ |
| | 7 | 25 | 206 | 12 | △ | ⊚ | X | X | X | ⊚ | ○ |
| | 8 | 25 | 220 | 12 | △ | △ | X | X | X | ○ | △ |
| | 9 | 50 | 217 | 18 | △ | △ | X | X | X | ○ | △ |
| | 10 | 25 | 217 | 13 | ○ | ⊚ | X | X | △ | ⊚ | ○ |
| | 11 | 25 | 214 | 12 | ○ | ⊚ | △ | △ | △ | ⊚ | ○ |
| | 12 | 25 | 226 | 11 | △ | ⊚ | X | X | X | ⊚ | ○ |
| | 13 | 50 | 225 | 19 | △ | ⊚ | △ | △ | △ | ⊚ | ○ |
| | 14 | 25 | 211 | 13 | △ | ⊚ | X | X | X | ⊚ | ○ |
| | 15 | 25 | 217 | 12 | △ | ⊚ | △ | △ | △ | ⊚ | ○ |
| | 16 | 25 | 224 | 11 | ○ | ⊚ | X | X | X | ⊚ | ○ |
| | 17 | 25 | 213 | 12 | ○ | ⊚ | △ | △ | △ | ⊚ | ○ |
| | 18 | 25 | 224 | 10 | ○ | ⊚ | X | X | X | ⊚ | ○ |

| | | | Loop Control | | Scratch, Scraping | Low-Height | Neck Portion | Capillary Leading | Within 3 days After Manufactured | | 30 days After Manufactured Wedge | |
|---|---|---|---|---|---|---|---|---|---|---|---|---|
| | | | | | | | | | Wedge | Low-Temp. Joining | | |
| | | Chip Damage | Linearity | Height Stability | of Loop Surface | Loop Characteristic | Pull Strength | End Dirt | Joining Characteristic | Peel Strength | Joining Characteristic | |
| Comparative Examples | 1 | ○ | △ | X | △ | △ | △ | △ | ⊚ | ○ | X | 1 |
| | 2 | ○ | △ | X | △ | △ | △ | △ | ⊚ | ○ | X | 2 |
| | 3 | X | △ | X | △ | X | △ | △ | ⊚ | ○ | X | 3 |
| | 4 | X | △ | X | △ | X | △ | △ | ⊚ | ○ | X | 4 |
| | 5 | ⊚ | X | X | X | X | △ | △ | ⊚ | ○ | △ | 5 |
| | 6 | ⊚ | X | X | △ | X | △ | △ | ⊚ | ○ | △ | 6 |
| | 7 | ⊚ | △ | X | △ | X | ○ | △ | ⊚ | ○ | △ | 7 |
| | 8 | X | △ | △ | △ | ○ | ○ | △ | △ | ○ | △ | 8 |
| | 9 | X | △ | △ | △ | ○ | ○ | △ | ○ | ○ | △ | 9 |
| | 10 | ⊚ | X | X | △ | △ | △ | △ | ⊚ | ○ | △ | 10 |
| | 11 | ⊚ | △ | X | △ | △ | △ | △ | ⊚ | ○ | X | 11 |
| | 12 | ⊚ | △ | X | △ | △ | △ | △ | ⊚ | ○ | △ | 12 |
| | 13 | ⊚ | △ | X | △ | △ | △ | △ | ⊚ | ○ | X | 13 |
| | 14 | ⊚ | X | △ | △ | ○ | △ | △ | ⊚ | ○ | △ | 14 |
| | 15 | ⊚ | △ | △ | △ | ○ | △ | △ | ⊚ | ○ | X | 15 |
| | 16 | ⊚ | △ | X | △ | X | △ | △ | ⊚ | ○ | △ | 16 |
| | 17 | ⊚ | X | △ | △ | ○ | △ | △ | ⊚ | ○ | X | 17 |
| | 18 | ⊚ | △ | △ | △ | △ | △ | △ | ⊚ | ○ | △ | 18 |

Regarding representative examples of the individual claims, evaluation results will be partially explained.

Copper-alloy bonding wires of the examples 1 to 104 contained Mg and P in total concentration of 10 to 700 mass ppm, and had a concentrated layer where the total concentration of Mg and P was more than or equal to 10 times than the foregoing concentration (concentration ratio: more than or equal to ten times) on a wire surface, and it was confirmed that a ball joining shape was basically good, and the wedge joining characteristic after the wires were stocked for a long period (for 30 days after manufactured) was good. In contrast, the comparative examples 1 to 18 did not satisfy either the containing concentration of Mg and P or the total concentration of Mg and P which was more than or equal to ten times than the foregoing concentration in a wire surface, and sufficient characteristics for all petal deformation, elliptic deformation, and misaligned concentration in ball joining were not acquired, and the wedge joining characteristic after a wire was stocked was reduced.

Copper-alloy bonding wires of the examples 1 to 82, 84 to 96, 98 to 104 contained Mg and P in total concentration of 10 to 700 mass ppm, and a total concentration of Mg and P which was 0.05 to 10 mass % in a wire surface, resulting in a good wedge joining characteristic after a wire was stocked for a long period in comparison with the examples 83 and 97 which did not satisfy some conditions.

Copper-alloy bonding wires of the examples 1 to 82, 84 to 94, 96 to 104 contained Mg and P in total concentration of 10 to 700 mass ppm, and had a concentrated layer where the maximum of the total concentration of Mg and P was 0.2 to 30 mass %, resulting in good loop shape stability and neck pull strength in comparison with the examples 83, 95 which did not satisfy some conditions.

Copper-alloy bonding wires of the examples 9 to 20, 64 to 72, 79 to 81, 86, 87, 98 to 104 contained Mg and P (first element group) in total concentration of 10 to 700 mass ppm, Ag, Pd, Pt and Au (second element group) in total of 10 to 5000 mass ppm, and had a concentrated layer where the total concentration of Mg and P was more than or equal to ten times than the foregoing concentration on a wire surface, and it was confirmed that the low-temperature shear joining strength became higher than normal, and an effect of suppressing misaligned deformation was improved in addition to improvement of a ball joining shape. In contrast, according to the examples 21 and 22, the concentration of the second element group was lower than the foregoing range even though a low-temperature shear joining strength was sufficient, improvement of the low-temperature shear joining strength was insufficient. According to the example 23, the concentration of the second element group was higher than the foregoing range, there was a tendency such that chip damaging increased even though it was within a practical level. Further, according to comparative examples 10 and 11, the concentration of Mg and P in a wire surface was not within an appropriate range even though the second element group was contained, no improvement on a ball joining shape or a joining strength was confirmed.

Copper-alloy bonding wires of the examples 24 to 41, 64 to 66, 70 to 82, 88 to 95, 98 to 100, 103 to 104 contained Mg and P (first element group) in total concentration of 10 to 700 mass ppm, Be, Al, Bi, Si, In, Ge, Ir and Mn (third element group) in total of 5 to 300 mass ppm, and had a concentrated layer where the total concentration of Mg and P was more than or equal to ten times than the foregoing concentration on a wire surface, and it was confirmed that the tensile strength was improved, and an effect of suppressing petal deformation was enhanced, in addition to improvement of a ball joining shape. On the other hand, according to the examples 42 and 43, the concentration of the third element group was lower than the foregoing range, and improvement of the tensile strength was insufficient although the tensile strength was sufficient. According to the example 44, the concentration of the third element group was higher than the foregoing concentration, there was a tendency such that chip damaging increased even through it was in a practical level. Further, according to the comparative examples 12 and 13, the concentration of Mg and P was not within an appropriate range even though the third element group was contained, and no improvement on a ball joining shape or a tensile strength was observed.

Copper-alloy bonding wires of the examples 45 to 60, 67 to 72, 81, 82, 96, 97, 101 to 104 contained Mg and P (first element group) in total concentration of 10 to 700 mass ppm, Ca, Y, La, Ce, Pr and Nd (fourth element group) in total of 5 to 300 mass ppm, and had a concentrated layer where the total concentration of Mg and P was more than or equal to ten times than the foregoing concentration on a wire surface, it was confirmed that such bonding wires were useful for low-height looping, and an effect of suppressing elliptic deformation was high, in addition to improvement of a ball joining shape. On the other hand, according to the examples 61 and 62, the concentration of the fourth element group was lower than the foregoing range, and the low-height looping characteristic was not sufficient even though it was in a practical level. According to the example 63, the concentration of the fourth element group was higher than the foregoing range, there was a tendency such that chip damaging increased even though it was in a practical level. Further, according to the comparative examples 14 and 15, the concentration of Mg and P in a wire surface was not within an appropriate range although the fourth element group was contained, no improvement on a ball joining shape or the low-height looping characteristic was confirmed.

Copper-alloy bonding wires of the examples 64 to 66, 70 to 72, 79 to 81, 98 to 100, 103 to 104 contained Mg and P (first element group) in total concentration of 10 to 700 mass ppm, Ag, Pd, Pt and Au (second element group) in total of 10 to 5000 mass ppm, Be, Al, Bi, Si, In, Ge, Ir and Mn (third element group) in total of 5 to 300 mass ppm, and had a concentrated layer where the total concentration of Mg and P was more than or equal to ten times than the foregoing concentration on a wire surface, it was confirmed such that the linearity for a long span was improved, in addition to improvement of a ball joining shape. In contrast, according to the comparative example 16, the concentration of Mg and P in a wire surface was not within an appropriate range even though the second and third element groups were contained, and no improvement on a ball joining shape or the linearity was confirmed.

Copper-alloy bonding wires of the examples 67 to 72, 81, 101 to 104 contained Mg and P (first element group) in total of 10 to 700 mass ppm, Ag, Pd, Pt and Au (second element group) in total of 10 to 5000 mass ppm, Ca, Y, La, Ce, Pr and Nd (fourth element group) in total of 5 to 300 mass ppm, and had a concentrated layer where the total concentration of Mg and P was more than or equal to ten times than the foregoing concentration on a wire surface, it was confirmed such that the stability of loop shapes having different heights was further improved, in addition to improvement of a ball joining shape. In contrast, according to the comparative example 17, even though the second and fourth element groups were contained, the concentration of Mg and P in a wire surface was not within an appropriate range, and no improvement on a ball joining shape or the loop-shape stability was confirmed.

Copper-alloy bonding wires of the examples 70 to 72, 81, 103, and 104 contained Mg and P (first element group) in total concentration of 10 to 700 mass ppm, Ag, Pd, Pt and Au (second element group) in total of 10 to 5000 mass ppm, Be, Al, Bi, Si, In, Ge, Ir and Mn (third element group) in total of 5 to 300 mass ppm, Ca, Y, La, Ce, Pr and Nd (fourth element group) in total of 5 to 300 mass ppm, and had a concentrated layer where the total concentration of Mg and P was more than or equal to ten times than the foregoing concentration on a wire surface, and it was confirmed that the wire strength increased, the applicability for low-height looping was improved, the linearity for a long span and the loop shape stability were improved, in addition to improvement of a ball joining shape. In contrast, according to the comparative example 18, even though the second, third and fourth element groups were contained, the concentration of Mg and P in a wire surface was not within an appropriate range, sufficient improvement on such characteristics was not observed.

Copper-alloy bonding wires of the examples 3, 5, 15, 17, 23, 27, 29, 40, 41, 51, 52, 61, 65, 72, 78, 81, 86, 96 and 100 contained Mg and P in total concentration of 10 to 700 mass ppm, had a concentrated layer where the total concentration of Mg and P was more than or equal to ten times than the foregoing concentration on a wire surface, and a top skin layer where the maximum concentration of C was more than or equal to 20 mass % and which had a thickness of 0.2 to 10 nm outside the concentrated layer, it was confirmed such that few scratches and scrapings on a loop surface were observed, and it was good, in addition to improvement of a ball joining shape.

Copper-alloy bonding wires of the examples 3 to 5, 7, 8, 10 to 13, 15 to 19, 21, 23 to 25, 27, 29 to 33, 35, 37, 39 to 41, 43, 44, 46 to 49, 51, 52, 54 to 56, 58 to 68, 70 to 82, 84 to 88, 90, 92, 93, and 95 to 104 contained Mg and P in total concentration of 10 to 700 mass ppm, and had a concentrated layer and top skin layer both of where the average of oxygen concentration was 0.1 to 15 mass %, it was confirmed that capillary dirt in bonding was little, in addition to improvement of a ball joining shape, and it was good.

What is claimed is:

1. A semiconductor-device copper-alloy bonding wire comprising:
    P in total of 10 to 700 mass ppm; and
    oxygen within a range from 6 to 30 mass ppm.
2. The semiconductor-device copper-alloy bonding wire of claim 1 further comprising:
    at least any one of Ag, Pd, Pt, and Au in total of 10 to 5000 mass ppm.
3. The semiconductor-device copper-alloy bonding wire of claim 1 further comprising:
    at least any one of Be, Al, Bi, Si, In, Ge, Ti, and V in total of 6 to 300 mass ppm.
4. The semiconductor-device copper-alloy bonding wire of claim 1 further comprising:
    at least any one of Ca, Y, La, Ce, Pr, and Nd in total of 5 to 300 mass ppm.
5. The semiconductor-device copper-alloy bonding wire of claim 1 further comprising:
    at least any one of Ag, Pd, Pt, and Au in total of 10 to 5000 mass ppm; and
    at least any one of Be, Al, Bi, Si, In, Ge, Ti and V in total of 6 to 300 mass ppm.
6. The semiconductor-device copper-alloy bonding wire of claim 1 further comprising:
    at least any one of Ag, Pd, Pt, and Au in total of 10 to 5000 mass ppm; and
    at least any one of Ca, Y, La, Ce, Pr and Nd in total of 5 to 300 mass ppm.
7. The semiconductor-device copper-alloy bonding wire of claim 1, further comprising:
    at least any one of Ag, Pd, Pt and Au in total of 10 to 5000 mass ppm;
    at least any one of Be, Al, Bi, Si, In, Ge, Ti and V in total of 6 to 300 mass ppm; and
    at least any one of Ca, Y, La, Ce, Pr, and Nd in total of 5 to 300 mass ppm.
8. The semiconductor-device copper-alloy bonding wire according to claim 1, wherein a concentration of P is 45 to 700 mass ppm.
9. The semiconductor-device copper-alloy bonding wire according to claim 1, wherein regarding said oxygen concentration, a total concentration of oxygen contained inside and oxygen contained in an oxide on a surface is within a range from 6 to 30 mass ppm.
10. The semiconductor-device copper-alloy bonding wire according to claim 1, wherein regarding said oxygen concentration, a total oxygen concentration detected by a combustion method is within a range from 6 to 30 mass ppm, and
    a wire diameter is within a range from 10 to 300 μm.
11. The semiconductor-device copper-alloy bonding wire according to claim 2, wherein a concentration of P is 45 to 700 mass ppm.
12. The semiconductor-device copper-alloy bonding wire according to claim 2, wherein regarding said oxygen concentration, a total concentration of oxygen contained inside and oxygen contained in an oxide on a surface is within a range from 6 to 30 mass ppm.
13. The semiconductor-device copper-alloy bonding wire according to claim 2, wherein regarding said oxygen concentration, a total oxygen concentration detected by a combustion method is within a range from 6 to 30 mass ppm, and
    a wire diameter is within a range from 10 to 300 μm.

* * * * *